US010734251B2

(12) United States Patent
Takayanagi et al.

(10) Patent No.: US 10,734,251 B2
(45) Date of Patent: Aug. 4, 2020

(54) LIQUID PROCESSING APPARATUS, LIQUID PROCESSING METHOD, AND STORAGE MEDIUM FOR LIQUID PROCESS

(71) Applicant: TOKYO ELECTRON LIMITED, Tokyo (JP)

(72) Inventors: Koji Takayanagi, Koshi (JP); Yukie Minekawa, Koshi (JP); Yuichi Yoshida, Koshi (JP); Kousuke Yoshihara, Koshi (JP); Yuichi Terashita, Koshi (JP); Toshinobu Furusho, Koshi (JP); Takashi Sasa, Koshi (JP)

(73) Assignee: Tokyo Electron Limited, Minato-Ku (JP)

(*) Notice: Subject to any disclaimer, the term of this patent is extended or adjusted under 35 U.S.C. 154(b) by 925 days.

(21) Appl. No.: 14/101,669

(22) Filed: Dec. 10, 2013

(65) Prior Publication Data

US 2014/0174475 A1 Jun. 26, 2014

(30) Foreign Application Priority Data

Dec. 20, 2012 (JP) ................................ 2012-277600
Apr. 16, 2013 (JP) ................................ 2013-085361
(Continued)

(51) Int. Cl.
*H01L 21/00* (2006.01)
*F04B 49/06* (2006.01)
(Continued)

(52) U.S. Cl.
CPC .... *H01L 21/67017* (2013.01); *F04B 43/0081* (2013.01); *F04B 49/065* (2013.01); *H01L 21/6715* (2013.01); *F04B 2205/503* (2013.01)

(58) Field of Classification Search
None
See application file for complete search history.

(56) References Cited

U.S. PATENT DOCUMENTS

2001/0025890 A1 10/2001 Fujimoto et al.
2004/0144736 A1* 7/2004 Yajima ............... B01D 19/0068 210/805
(Continued)

FOREIGN PATENT DOCUMENTS

JP 2001-269608 A1 10/2001
JP 2007-035733 A1 2/2007
(Continued)

OTHER PUBLICATIONS

English Machine Translation of WO201138881.*
(Continued)

*Primary Examiner* — Nicole Blan
*Assistant Examiner* — Pradhuman Parihar
(74) *Attorney, Agent, or Firm* — Burr & Brown, PLLC

(57) ABSTRACT

A filtration efficiency, which is similar to the filtration efficiency obtained when a plurality of filters are provided, can be obtained by one filter, and decrease in throughput can be prevented. Based on a control signal from a control unit 101, a resist liquid L is sucked into a pump 70 through a filter. A part of the resist liquid sucked in the pump is discharged from a discharge nozzle 7. The remaining resist liquid is returned to a supply conduit 51*b* on a primary side of the filter. A process is synthesized by adding a replenishment amount equal to the discharge amount to the return amount. The discharge of the synthesized process liquid and the filtration thereof by the filter are performed the number of times corresponding to a rate between the discharge amount and the return amount.

8 Claims, 44 Drawing Sheets

(30) Foreign Application Priority Data

| | | |
|---|---|---|
| Oct. 1, 2013 | (JP) | 2013-206089 |
| Oct. 1, 2013 | (JP) | 2013-206090 |

(51) Int. Cl.

| | |
|---|---|
| ***F04B 43/00*** | (2006.01) |
| ***H01L 21/67*** | (2006.01) |

(56) References Cited

U.S. PATENT DOCUMENTS

| | | | | |
|---|---|---|---|---|
| 2007/0119307 | A1* | 5/2007 | Park | B01D 19/0036<br>96/243 |
| 2008/0087615 | A1* | 4/2008 | Taniguchi | G03F 7/162<br>210/805 |
| 2013/0068324 | A1 | 3/2013 | Furusho et al. | |

FOREIGN PATENT DOCUMENTS

| | | | | | |
|---|---|---|---|---|---|
| JP | 2010135535 | A | * | 6/2010 | |
| JP | 2011-238666 | A1 | | 11/2011 | |
| JP | WO2011138881 | | * | 11/2011 | B02D 29/56 |
| WO | 2006/057345 | A1 | | 6/2006 | |

OTHER PUBLICATIONS

English Machine Translation of JP-2010135535-A.*
Japanese Office Action (Application No. 2013-085361) dated Nov. 5, 2013.
Japanese Office Action (Application No. 2013-206089) dated Nov. 5, 2013.

* cited by examiner

LIQUID PROCESSING APPARATUS, LIQUID PROCESSING METHOD, AND STORAGE MEDIUM FOR LIQUID PROCESS

CROSS REFERENCE TO RELATED APPLICATIONS

This application is based upon and claims the benefit of priority from the prior Japanese Patent Application No. 2012-277600 filed on Dec. 20, 2012, Japanese Patent Application No. 2013-085361 filed on Apr. 16, 2013, Japanese Patent Application No. 2013-206089 filed on Oct. 1, 2013, and Japanese Patent Application No. 2013-206090 filed on Oct. 1, 2013, the entire contents of which are incorporated herein by reference.

FIELD OF THE INVENTION

The present invention relates to a liquid processing apparatus, a liquid processing method and a storage medium for liquid process, which are configured to process a surface of a substrate to be processed, such as a semiconductor wafer or a glass substrate for LCD, by supplying thereto a process liquid.

BACKGROUND ART

In general, in a photolithographic technique for manufacturing semiconductor devices, a photoresist is applied to a semiconductor wafer or a FPD substrate and the like (hereinafter referred to as "wafer and the like"), a thus formed resist film is exposed in accordance with a predetermined circuit pattern, and the exposed pattern is developed so that a circuit pattern is formed in the resist film.

In such a photolithographic step, there is a possibility that bubbles of nitrogen gas or particles (foreign matters) might come to be mixed in a process liquid such as a resist liquid or a developing liquid to be supplied to a wafer, for some reason or other. When a process liquid containing bubbles or particles mixed therein is supplied to a wafer, application non-uniformity and/or defect may occur. Thus, a liquid processing apparatus for supplying a process liquid to a wafer is provided with a filter for filtrating bubbles and particles mixed in a process liquid.

As an apparatus for improving an efficiency in filtrating bubbles and particles mixed in a process liquid, there is known a process-liquid treating apparatus including a plurality of filters, which supplies a wafer with a process liquid having been filtrated through these filters. However, when a plurality of filters are provided, a liquid processing apparatus is enlarged and is needed to be largely modified.

There has been conventionally known a chemical-liquid supply system of a circulation filtration type, which includes: a first container configured to store a chemical liquid (process liquid); a second container configured to store a chemical liquid (process liquid); a first pump disposed in a first pipe connecting the first container and the second container and configured to send the chemical liquid stored in the first container to the second container; a first filter disposed in the first pipe; a second pipe connecting the first container and the second container; and a second pump disposed in the second pipe and configured to send the chemical liquid stored in the second container to the first container (see Patent Document 1).

In addition, as another liquid processing apparatus of a circulation filtration type including one filter, there is known a photoresist-application-liquid supply apparatus which includes: a buffer container of a photoresist application liquid (process liquid); a circulation and filtration apparatus that sucks a part of the photoresist application liquid from the buffer container to filtrate it by a filter, and then returns the filtrated photoresist application liquid to the buffer container; and a pipe through which the photoresist application liquid is sent from the buffer container or the circulation apparatus to a photoresist application apparatus (see Patent Document 2).

PRIOR ART DOCUMENTS

Patent Documents

[Patent Document 1] JP2011-238666A (claims and FIG. 7)
[Patent Document 2] WO2006/057345 (claims and FIG. 4)

SUMMARY OF THE INVENTION

In the liquid processing apparatuses described in Patent Document 1 and Patent Document 2, the chemical liquid (process liquid) having been filtrated by the filter is returned to the first container (buffer container), and the chemical liquid returned to the first container is discharged to a wafer W. Thus, in order to improve a chemical-liquid filtration efficiency, it is necessary to circulate the chemical liquid returned to the first container a plurality of times so as to filtrate the chemical liquid a plurality of times. However, when the chemical liquid is circulated and filtrated a plurality of times, a throughput decreases. Thus, there is a demand for developing a liquid processing apparatus which can circulate and filtrate a chemical liquid a plurality of times, without decrease in throughput.

The present invention has been made in view of the above circumstances. The object of the present invention is to provide a liquid processing apparatus which is capable of providing, by one filter, a filtration efficiency that is the same as a filtration efficiency provided by a plurality of filters and is capable of preventing decrease in throughput, by controlling discharge of a process liquid that is circulated through a filter and the number of circulation, without largely modifying the apparatus.

In order to solve the above problem, a liquid processing apparatus of the present invention is a liquid processing apparatus comprising: a process liquid container configured to contain a process liquid; a discharge nozzle configured to discharge the process liquid to a substrate to be processed; a supply conduit connecting the process liquid container and the discharge nozzle; a filter disposed in the supply conduit and configured to filtrate the process liquid; a pump disposed in the supply conduit on a secondary side of the filter; a return conduit connecting a discharge side of the pump and a primary side of the filter; a first, a second and a third on-off valves which are disposed on a connection portion between the pump and the filter, a connection portion between the pump and the discharge nozzle, and a connection portion between the pump and the return conduit, respectively; and a control unit configured to control the pump and the first, the second and the third on-off valves; wherein: based on a control signal from the control unit, a part of the process liquid having passed through the filter by the suction of the pump is discharged from the discharge nozzle; the remaining process liquid is returned to the supply conduit on the primary side of the filter; a process liquid is synthesized by adding a replenishment amount, which is equal to the discharge amount, to the return amount; and the discharge of the synthesized process liquid and the filtration thereof by the filter are performed the number of times corresponding to a rate between the discharge amount and the return amount.

Herein, the number of times corresponding to a synthesis of a rate between the discharge amount and the return amount (number of synthesis filtration) is the number of filtration that is replaced by a cleanliness of the process liquid having passed through the filter the predetermined number of times, in other words, a cleanliness of the process liquid formed by synthesizing the process liquid that is returned in the filtrated condition to the supply conduit on the primary side and the process liquid that is replenished in the not-filtrated condition. For example, a process liquid whose number of synthesis filtration is five has a cleanliness equal to a cleanliness of an unprocessed process liquid of the same amount which has been filtrated five times.

In addition, in the present invention, it is preferable that the pump is a variable displacement pump. In addition, in the present invention, the return conduit is a conduit connecting the pump and the supply conduit on the primary side of the filter. In this case, it is preferable that an on-off valve is disposed in the return conduit, and that the on-off valve is configured to be controllable by the control unit. In addition, in the aforementioned invention, the return conduit may be a conduit connecting the pump and the supply conduit on the secondary side of the filter.

In addition, in the present invention, the return conduit may be composed of a main return conduit connecting the pump and the secondary side of the filter, and a sub return conduit connecting the secondary side of the filter and the primary side of the filter. In this case, it is preferable that on-off valves are respectively disposed in the main return conduit and the sub return conduit, and that the on-off valves are configured to be controllable by the control unit.

In addition, in the present invention, the second and the third on-off valves may be on-off valves capable of controlling a flow rate. Thus, the discharge amount and the return amount can be set at a predetermined rate.

A liquid processing apparatus of the present invention is a liquid processing method using a liquid processing apparatus comprising: a process liquid container configured to contain a process liquid; a discharge nozzle configured to discharge the process liquid to a substrate to be processed; a supply conduit connecting the process liquid container and the discharge nozzle; a filter disposed in the supply conduit and configured to filtrate the process liquid; a pump disposed in the supply conduit on a secondary side of the filter; a return conduit connecting a discharge side of the pump and a primary side of the filter; a first, a second and a third on-off valves which are disposed on a connection portion between the pump and the filter, a connection portion between the pump and the discharge nozzle, and a connection portion between the pump and the return conduit, respectively; and a control unit configured to control the pump and the first, the second and the third on-off valves; the liquid processing method comprises: sucking into the pump a predetermined amount of the process liquid having passed through the filter by the suction of the pump; discharging a part of the process liquid sucked in the pump from the discharge nozzle; returning the remaining process liquid in the pump to the primary side of the filter; and synthesizing a process liquid by adding a replenishment amount, which is equal to the discharge amount, to the return amount; and discharging the synthesized process liquid and filtrating the synthesized process liquid by the filter the number of times corresponding to a rate between the discharge amount and the return amount.

In addition, a storage medium liquid processing of the present invention is a computer-readable storage medium for liquid process storing a software that causes a computer to execute a control program, the computer-readable storage medium being used in a liquid processing apparatus comprising: a process liquid container configured to contain a process liquid; a discharge nozzle configured to discharge the process liquid to a substrate to be processed; a supply conduit connecting the process liquid container and the discharge nozzle; a filter disposed in the supply conduit and configured to filtrate the process liquid; a pump disposed in the supply conduit on a secondary side of the filter; a return conduit connecting a discharge side of the pump and a primary side of the filter; a first, a second and a third on-off valves which are disposed on a connection portion between the pump and the filter, a connection portion between the pump and the discharge nozzle, and a connection portion between the pump and the return conduit, respectively; and a control unit configured to control the pump and the first, the second and the third on-off valves; wherein the control program is programmed to perform: sucking into the pump a predetermined amount of the process liquid having passed through the filter by the suction of the pump; discharging a part of the process liquid sucked in the pump from the discharge nozzle; returning the remaining process liquid in the pump to the primary side of the filter; and synthesizing a process liquid by adding a replenishment amount, which is equal to the discharge amount, to the return amount; and discharging the synthesized process liquid and filtrating the synthesized process liquid by the filter the number of times corresponding to a rate between the discharge amount and the return amount.

In order to solve the above problem, a liquid processing apparatus of the present invention is a liquid processing apparatus comprising: a process liquid container configured to contain a process liquid; a discharge nozzle configured to discharge the process liquid to a substrate to be processed; a supply conduit connecting the process liquid container and the discharge nozzle; a filter disposed in the supply conduit and configured to filtrate the process liquid; a pump disposed in the supply conduit on a secondary side of the filter; a return conduit connecting a discharge side of the pump and a primary side of the filter; a feed pump disposed in the supply conduit connecting the process liquid container and the primary side of the filter; a suction on-off valve and a discharge on-off valve disposed on a suction side of the feed pump and a discharge side thereof, respectively; a first, a second and a third on-off valves which are disposed on a connection portion between the pump and the filter, a connection portion between the pump and the discharge nozzle, and a connection portion between the pump and the return conduit, respectively; and a control unit configured to control the pump, the first, the second and the third on-off valves, the feed pump, the suction on-off valve and the discharge on-off valve; wherein: based on a control signal from the control unit, a part of the process liquid having passed through the filter by the suction of the pump is discharged from the discharge nozzle; the remaining process liquid is returned to the supply conduit on the primary side of the filter; a process liquid is synthesized by adding a replenishment amount, which is equal to the discharge amount, to the return amount by the drive of the feed pump; and the discharge of the synthesized process liquid and the filtration thereof by the filter are performed the number of times corresponding to a rate between the discharge amount and the return amount.

In the present invention, it is preferable that a drain valve is disposed in a drain conduit connected to the filter, and that the drain valve is configured to be controllable by the control unit.

Herein, the number of times corresponding to a synthesis of a rate between the discharge amount and the return amount (number of synthesis filtration) is the number of filtration that is replaced by a cleanliness of the process liquid having passed through the filter the predetermined number of times, in other words, a cleanliness of the process liquid formed by synthesizing the process liquid that is returned in the filtrated condition to the supply conduit on the primary side and the process liquid that is replenished in the not-filtrated condition. For example, a process liquid whose number of synthesis filtration is five has a cleanliness equal to a cleanliness of an unprocessed process liquid of the same amount which has been filtrated five times.

In addition, in the present invention, it is preferable that the pump and the feed pump are variable displacement pumps. In addition, in the present invention, the return conduit is a conduit connecting the pump and the supply conduit on the primary side of the filter, or the return conduit is a conduit connecting the pump and the supply conduit on the secondary side of the filter.

In addition, in the present invention, the second and the third on-off valves may be on-off valves capable of controlling a flow rate. Thus, the discharge amount and the return amount can be set at a predetermined rate.

A liquid processing method of the present invention is a liquid processing method using a liquid processing apparatus comprising: a process liquid container configured to contain a process liquid; a discharge nozzle configured to discharge the process liquid to a substrate to be processed; a supply conduit connecting the process liquid container and the discharge nozzle; a filter disposed in the supply conduit and configured to filtrate the process liquid; a pump disposed in the supply conduit on a secondary side of the filter; a return conduit connecting a discharge side of the pump and a primary side of the filter; a feed pump disposed in the supply conduit connecting the process liquid container and the primary side of the filter; a suction on-off valve and a discharge on-off valve disposed on a suction side of the feed pump and a discharge side thereof, respectively; a first, a second and a third on-off valves which are disposed on a connection portion between the pump and the filter, a connection portion between the pump and the discharge nozzle, and a connection portion between the pump and the return conduit, respectively; and a control unit configured to control the pump, the first, the second and the third on-off valves, the feed pump, the suction on-off valve and the discharge on-off valve; the liquid processing method comprising: sucking into the pump a predetermined amount of the process liquid having passed through the filter by the suction of the pump; discharging a part of the process liquid sucked in the pump from the discharge nozzle; returning the remaining process liquid in the pump to the primary side of the filter; and synthesizing a process liquid by adding a replenishment amount, which is equal to the discharge amount, to the return amount, by driving the feed pump; and discharging the synthesized process liquid and filtrating the synthesized process liquid by the filter the number of times corresponding to a rate between the discharge amount and the return amount.

In this case, discharging of the process liquid from the discharge nozzle and sucking of a replenishment amount greater than the discharge amount into the feed pump may be simultaneously performed.

In the aforementioned liquid processing method, a drain valve is disposed in a drain conduit connected to the filter, the drain valve is configured to be controllable by the control unit, and the liquid processing method further comprises degassing performed by opening the drain valve upon synthesizing a process liquid, for discharging bubbles present in the process liquid from the filter.

In addition, a storage medium liquid processing of the present invention is a computer-readable storage medium for liquid process storing a software that causes a computer to execute a control program, the computer-readable storage medium being used in a liquid processing apparatus comprising: a process liquid container configured to contain a process liquid; a discharge nozzle configured to discharge the process liquid to a substrate to be processed; a supply conduit connecting the process liquid container and the discharge nozzle; a filter disposed in the supply conduit and configured to filtrate the process liquid; a pump disposed in the supply conduit on a secondary side of the filter; a return conduit connecting a discharge side of the pump and a primary side of the filter; a feed pump disposed in the supply conduit connecting the process liquid container and the primary side of the filter; a suction on-off valve and a discharge on-off valve disposed on a suction side of the feed pump and a discharge side thereof, respectively; a first, a second and a third on-off valves which are disposed on a connection portion between the pump and the filter, a connection portion between the pump and the discharge nozzle, and a connection portion between the pump and the return conduit, respectively; and a control unit configured to control the pump, the first, the second and the third on-off valves, the feed pump, the suction on-off valve and the discharge on-off valve; wherein the control program is programmed to perform: sucking into the pump a predetermined amount of the process liquid having passed through the filter by the suction of the pump; discharging a part of the process liquid sucked in the pump from the discharge nozzle; returning the remaining process liquid in the pump to the primary side of the filter; and synthesizing a process liquid by adding a replenishment amount, which is equal to the discharge amount, to the return amount, by driving the feed pump; and discharging the synthesized process liquid and filtrating the synthesized process liquid by the filter the number of times corresponding to a rate between the discharge amount and the return amount.

In order to solve the above problem, a liquid processing apparatus of the present invention a liquid processing apparatus comprising: a process liquid container configured to contain a process liquid; a discharge nozzle configured to discharge the process liquid to a substrate to be processed; a supply conduit connecting the process liquid container and the discharge nozzle; a filter disposed in the supply conduit and configured to filtrate the process liquid; a pump disposed in the supply conduit on a secondary side of the filter; a trap tank disposed in the supply conduit between the secondary side of the filter and the pump, and connected to a drain conduit having a drain valve; a return conduit composed of a first return conduit connecting a discharge side of the pump and the trap tank, and a second return conduit connecting the trap tank and the primary side of the filter; a first, a second and a third on-off valves which are disposed on a connection portion between the pump and the filter, a connection portion between the pump and the discharge nozzle, and a connection portion between the pump and the return conduit, respectively; and a control unit configured to control the pump, the first, the second and the third on-off valves, and the drain valve; wherein: based on a control signal from the control unit, when a part of the process liquid having passed through the filter by the suction of the pump is discharged from the discharge nozzle and the remaining process liquid is returned to the supply conduit on the primary side of the filter, by driving the pump to depressurize a zone between the pump and the trap tank and then pressurize the zone so that actualizing micro bubbles present in the process liquid in the zone and degassing the actualized bubbles from the trap tank are performed a plurality of times.

In the aforementioned liquid processing apparatus, an on-off valve may be disposed in the supply conduit connecting the secondary side of the filter and the trap tank, the on-off valve is configured to be controllable by the control unit; and by driving the pump while the on-off valve being closed, the actualizing of bubbles and the degassing are performed a plurality of times.

In the aforementioned liquid processing apparatus, based on a control signal from the control unit, after the actualizing of bubbles and the degassing have been performed a plurality of times, a process liquid is synthesized by adding a replenishment amount, which is equal to the discharge amount, to the return amount by the drive of the feed pump, and the discharge of the synthesized process liquid and the filtration thereof by the filter are performed the number of times corresponding to a rate between the discharge amount and the return amount.

Herein, the number of times corresponding to a synthesis of a rate between the discharge amount and the return amount (number of synthesis filtration) is the number of filtration that is replaced by a cleanliness of the process liquid having passed through the filter the predetermined number of times, in other words, a cleanliness of the process liquid formed by synthesizing the process liquid that is returned in the filtrated condition to the supply conduit on the primary side and the process liquid that is replenished in the not-filtrated condition. For example, a process liquid whose number of synthesis filtration is five has a cleanliness equal to a cleanliness of an unprocessed process liquid of the same amount which has been filtrated five times.

In addition, in the present invention, it is preferable that the pump is a variable displacement valve.

In addition, in the present invention, the second and the third on-off valves may be on-off valves capable of controlling a flow rate. Thus, the discharge amount and the return amount can be set at a predetermined rate.

A liquid processing method of the present invention is a liquid processing method using a liquid processing apparatus comprising: a process liquid container configured to contain a process liquid; a discharge nozzle configured to discharge the process liquid to a substrate to be processed; a supply conduit connecting the process liquid container and the discharge nozzle; a filter disposed in the supply conduit and configured to filtrate the process liquid; a pump disposed in the supply conduit on a secondary side of the filter; a trap tank disposed in the supply conduit between the secondary side of the filter and the pump, and connected to a drain conduit having a drain valve; a return conduit composed of a first return conduit connecting a discharge side of the pump and the trap tank, and a second return conduit connecting the trap tank and the primary side of the filter; a first, a second and a third on-off valves which are disposed on a connection portion between the pump and the filter, a connection portion between the pump and the discharge nozzle, and a connection portion between the pump and the return conduit, respectively; and a control unit configured to control the pump, the first, the second and the third on-off valves, and the drain valve; the liquid processing method comprising: sucking into the pump a predetermined amount of the process liquid having passed through the filter by the suction of the pump; discharging a part of the process liquid sucked in the pump from the discharge nozzle; returning the remaining process liquid in the pump to the primary side of the filter; and by driving the pump to depressurizing a zone between the pump and the trap tank and then pressurizing the zone, actualizing micro bubbles present in the process liquid in the zone; and degassing for discharging the actualized bubbles from the trap tank; wherein the actualizing of micro bubbles and the degassing are performed a plurality of times.

In the aforementioned liquid processing method, an on-off valve may be disposed in the supply conduit connecting the secondary side of the filter and the trap tank; the on-off valve is configured to be controllable by the control unit; by driving the pump while the on-off valve being closed, the actualizing of bubbles and the degassing are performed a plurality of times.

In the aforementioned liquid processing method, the present invention further includes synthesizing a process liquid by adding a replenishment amount, which is equal to the discharge amount, to the return amount, after the actualizing of bubbles and the degassing have been performed a plurality of times; and discharging the synthesized process liquid and filtrating the synthesized process liquid by the filter the number of times corresponding to a rate between the discharge amount and the return amount.

In addition, a storage medium liquid processing of the present invention is a computer-readable storage medium for liquid process storing a software that causes a computer to execute a control program, the computer-readable storage medium being used in a liquid processing apparatus comprising: a process liquid container configured to contain a process liquid; a discharge nozzle configured to discharge the process liquid to a substrate to be processed; a supply conduit connecting the process liquid container and the discharge nozzle; a filter disposed in the supply conduit and configured to filtrate the process liquid; a pump disposed in the supply conduit on a secondary side of the filter; a trap tank disposed in the supply conduit between the secondary side of the filter and the pump, and connected to a drain conduit having a drain valve; a return conduit composed of a first return conduit connecting a discharge side of the pump and the trap tank, and a second return conduit connecting the trap tank and the primary side of the filter; a first, a second and a third on-off valves which are disposed on a connection portion between the pump and the filter, a connection portion between the pump and the discharge nozzle, and a connection portion between the pump and the return conduit, respectively; and a control unit configured to control the pump, the first, the second and the third on-off valves, and the drain valve; wherein the control program is programmed to perform: sucking into the pump a predetermined amount of the process liquid having passed through the filter by the suction of the pump; discharging a part of the process liquid sucked in the pump from the discharge nozzle; returning the remaining process liquid in the pump to the primary side of the filter; and by driving the pump to depressurizing a zone between the pump and the trap tank and then pressurizing the zone, actualizing micro bubbles present in the process liquid in the zone; and degassing for discharging the actualized bubbles from the trap tank; wherein the actualizing of micro bubbles and the degassing are performed a plurality of times.

In the storage medium liquid processing, the control program is programmed to further perform: synthesizing a process liquid by adding a replenishment amount, which is equal to the discharge amount, to the return amount, after the actualizing of bubbles and the degassing have been performed a plurality of times; and discharging the synthesized process liquid and filtrating the synthesized process liquid by the filter the number of times corresponding to a rate between the discharge amount and the return amount.

According to the liquid processing apparatus, the liquid processing method and the storage medium of the present invention, based on a control signal from the control unit, a part of the process liquid having passed through the filter by the suction of the pump is discharged from the discharge nozzle; the remaining process liquid is returned to the primary side of the filter; a process liquid is synthesized by adding a replenishment amount, which is equal to the discharge amount, to the return amount; and the discharge of the synthesized process liquid and the filtration thereof by the filter are performed the number of times corresponding to a rate between the discharge amount and the return amount. Thus, a filtration efficiency, which is similar to the filtration efficiency obtained when a plurality of filters are provided, can be obtained by one filter, and decrease in throughput can be prevented, without largely modifying the apparatus.

According to the liquid processing apparatus, the liquid processing method and the storage medium of the present invention, based on a control signal from the control unit, a part of the process liquid having passed through the filter by the suction of the pump is discharged from the discharge nozzle; the remaining process liquid is returned to the primary side of the filter; a process liquid is synthesized by adding a replenishment amount, which is equal to the discharge amount, to the return amount, by the drive of the feed pump; and the discharge of the synthesized process liquid and the filtration thereof by the filter are performed the number of times corresponding to a rate between the discharge amount and the return amount. Thus, a filtration efficiency, which is similar to the filtration efficiency obtained when a plurality of filters are provided, can be obtained by one filter, and decrease in throughput can be prevented, without largely modifying the apparatus.

According to the liquid processing apparatus, the liquid processing method and the storage medium of the present invention, based on a control signal from the control unit, when a part of the process liquid having passed through the filter by the suction of the pump is discharged from the discharge nozzle and the remaining process liquid is returned to the primary side of the filter, bubbles present in the process liquid can be efficiently removed by actualizing micro bubbles present in the process liquid and by degassing the same. In addition, a process liquid is synthesized by adding a replenishment amount, which is equal to the discharge amount, to the return amount, and the discharge of the synthesized process liquid and the filtration thereof by the filter are performed the number of times corresponding to a rate between the discharge amount and the return amount. Thus, a filtration efficiency, which is similar to the filtration efficiency obtained when a plurality of filters are provided, can be obtained by one filter, and decrease in throughput can be prevented, without largely modifying the apparatus.

BRIEF DESCRIPTION OF THE DRAWINGS

FIG. 45(*b*) is a schematic sectional view showing a degassing step of the liquid processing apparatus according to the present invention.

FIG. 47(*b*) is a schematic sectional view showing another degassing step of the liquid processing apparatus according to the present invention.

EMBODIMENTS FOR CARRYING OUT THE INVENTION

First Embodiment

Embodiments of the present invention will be described herebelow with reference to the accompanying drawings. Herein, there is described an example in which a liquid processing apparatus (resist liquid processing apparatus) according to the present invention is applied to a coating and developing apparatus.

Figure 1:
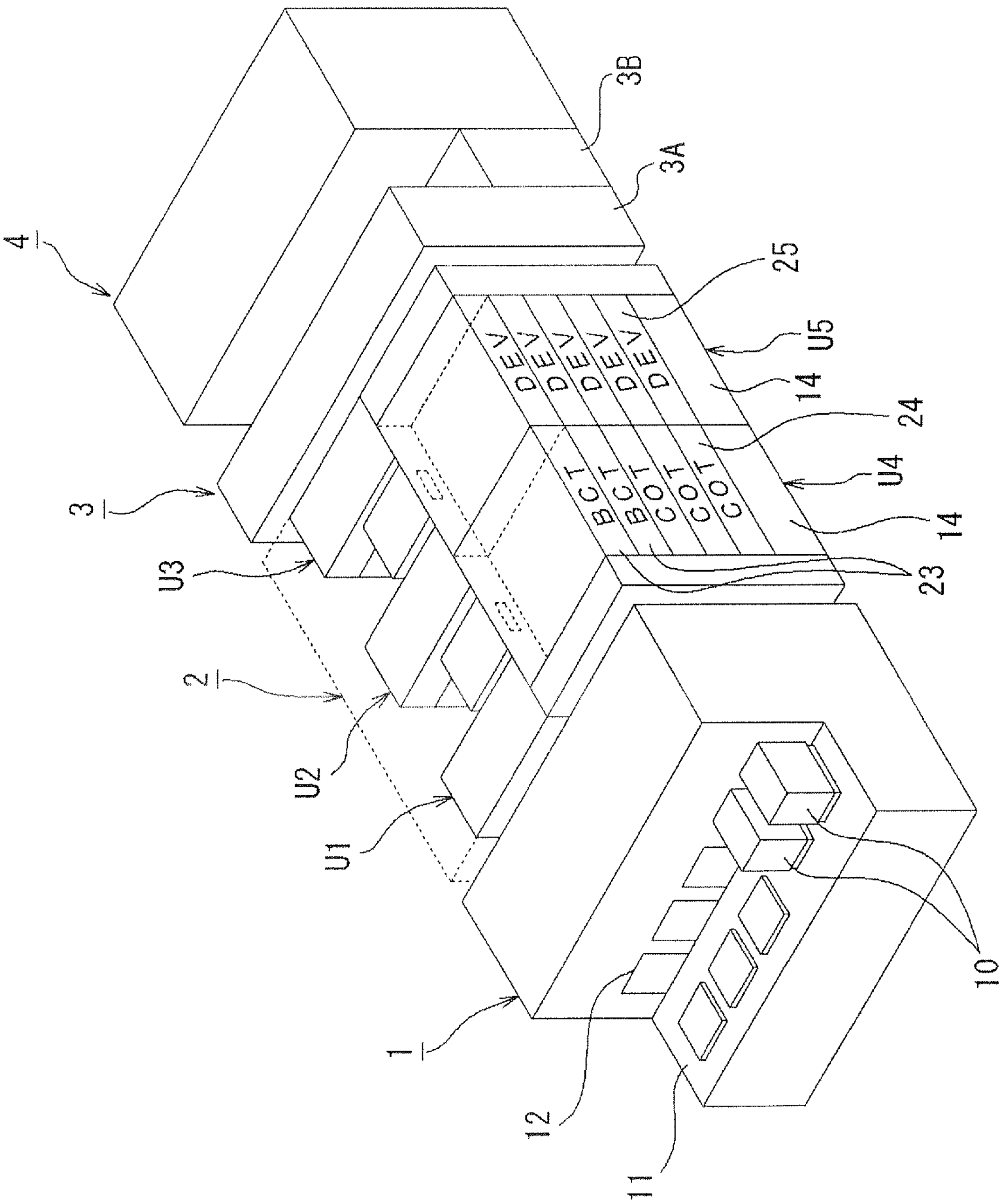
FIG. 1 is a schematic perspective view showing an overall processing system in which an exposure apparatus is connected to a coating and developing apparatus to which a liquid processing apparatus according to the present invention is applied.
Figure 2:
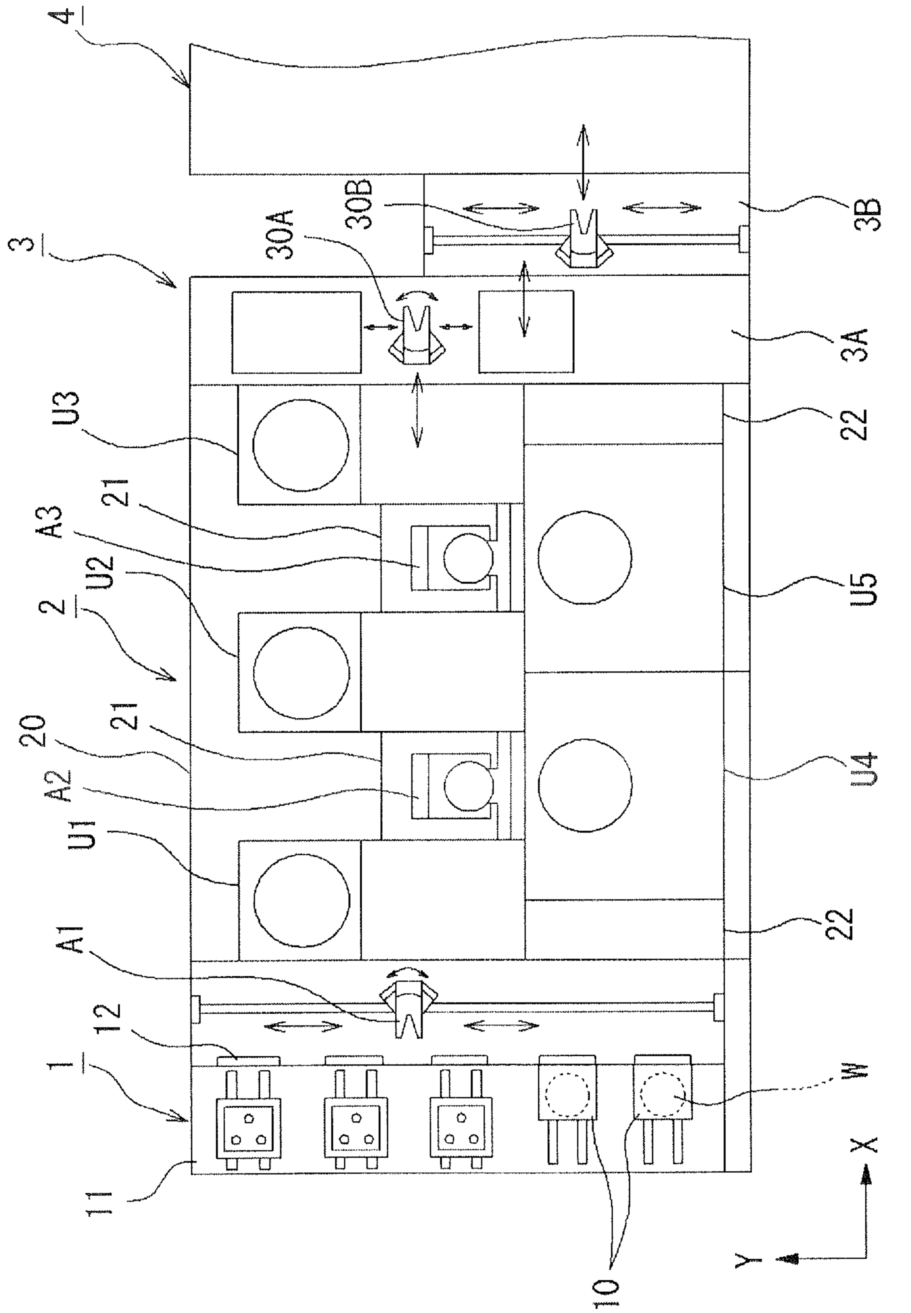
FIG. 2 is a schematic plan view of the processing system.

As shown in FIGS. 1 and 2, the coating and developing apparatus includes: a carrier station 1 through which a carrier 10, which hermetically contains a plurality of, e.g., twenty five wafers W as substrates to be processed, is loaded and unloaded; a processing part 2 configured to perform a resist coating process, a developing process and so on to a wafer W taken out from the carrier station 1; an exposure part 4 configured to immersion-expose a surface of the wafer W with a light-transmitting liquid layer being formed on the surface of the wafer W; and an interface part 3 connected between the processing part 2 and the exposure part 4 and configured to deliver and receive a wafer W.

The carrier station 1 is provided with stages 11 on which a plurality of carriers 10 are placed in a line, opening and closing parts 12 formed in a front wall surface seen from the stages 11, and a delivery means A1 configured to take out a wafer W from the carrier 10 through the opening and closing part 12.

The interface part 3 is composed of a first transfer chamber 3A and a second transfer chamber 3B that are located between the processing part 2 and the exposure part 4 in a back and forth direction. The first transfer chamber 3A is provided with a first wafer transfer part 30A, and the second transfer chamber 3B is provided with a second wafer transfer part 30B.

The processing part 2 surrounded by a housing 20 is connected to a rear side of the carrier station 1. In the processing part 2, there are arranged main transfer means A2 and A3 in this order from the front. The main transfer means A2 and A3 are configured to deliver and receive a wafer W between shelf units U1, U2 and U3 in which heating and cooling units are stacked at multiple levels, and liquid processing units U4 and U5. The main transfer means A2 and A3 are located in a space surrounded by a partition wall 21 composed of a surface part on the side of the shelf units U1, U2 and U3 that are located in the back and forth direction seen from the carrier station 1, a surface part on the side of the right liquid processing units U4 and U5 described below, and a rear surface part forming a left side surface. Between the carrier station 1 and the processing part 2, and between the processing part 2 and the interface part 3, there are located temperature and humidity regulating units 22 each including an apparatus for regulating a temperature of a process liquid used by the respective units, and a duct for regulating a temperature and a humidity.

The shelf units U1, U2 and U3 each include various units that are stacked at multiple levels, e.g., at ten levels. The various units are configured to perform processes prior to and posterior to a process performed by the liquid processing units U4 and U5. A synthesis of a heating unit (not shown) for heating (baking) a wafer W, a cooling unit (not shown) for cooling a wafer W, and so on is included. As shown in FIG. 1, for example, the liquid processing units U4 and U5 configured to process a wafer W by supplying thereto a predetermined process liquid are formed by stacking an antireflection film coating unit (BCT) 23 for coating a chemical-liquid container 14 containing a resist and a developing liquid with an antireflection film, a coating unit (COT) 24 for coating a wafer W with a resist liquid, a developing unit (DEV) 25 for developing a wafer W by supplying thereto a developing liquid, and so on, at multiple levels, e.g., at five levels. The coating unit (COT) 24 includes the liquid processing apparatus 5 according to the present invention.

An example of a flow of a wafer in the coating and developing apparatus as structured above is briefly described with reference to FIGS. 1 and 2. Firstly, when the carrier 10 containing, e.g., twenty five wafers W is placed on the stage 11, the opening and closing part 12 and a lid of the carrier 10 are opened and a wafer W is taken out by the delivery means A1. Then, the wafer W is delivered to the main transfer means A2 through a delivery unit (not shown) that is one of shelves of the shelf unit U1. The wafer W is subjected to an antireflection film forming process and a cooling process that are pre-processes of a coating process. Then, the wafer W is coated with a resist liquid in the coating unit (COT) 24. Thereafter, the wafer W is transferred by the main transfer means A2 to the heating unit that is one of shelves of the shelf units U1 to U3. The wafer W is heated (baked) in the heating unit. Further, after having been cooled, the wafer W is loaded into the interface part 3 through the delivery unit of the shelf unit U3. In the interface part 3, the wafer W is transferred to the exposure part 4 by the wafer transfer part 30A of the first transfer chamber 3A and the wafer transfer part 30B of the second transfer chamber 3B. An exposure means (not shown) is disposed so as to be opposed to the surface of the wafer W, and the wafer W is exposed. After having been exposed, the wafer W is transferred to the main transfer means A2 along a reverse route. The wafer W is developed by the developing unit (DEV) 25 so that a pattern is formed thereon. Thereafter, the wafer W is returned to the original carrier 10 placed on the stage 11.

Next, a 1-1st embodiment of the liquid processing apparatus 5 according to the present invention is described.

1-1st Embodiment

Figure 3:
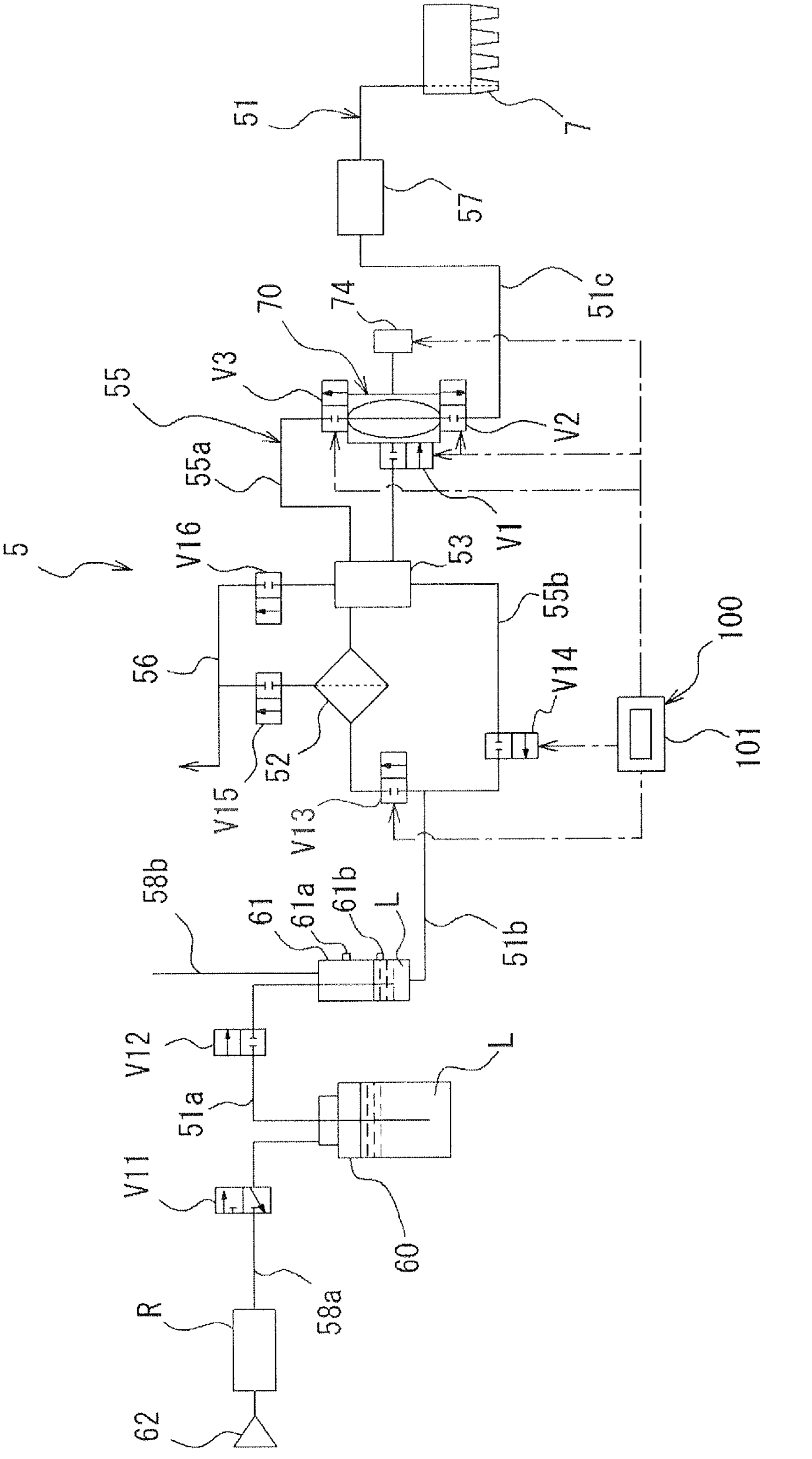
FIG. 3 is a schematic sectional view showing a first embodiment of the liquid processing apparatus according to the present invention.
Figure 4:
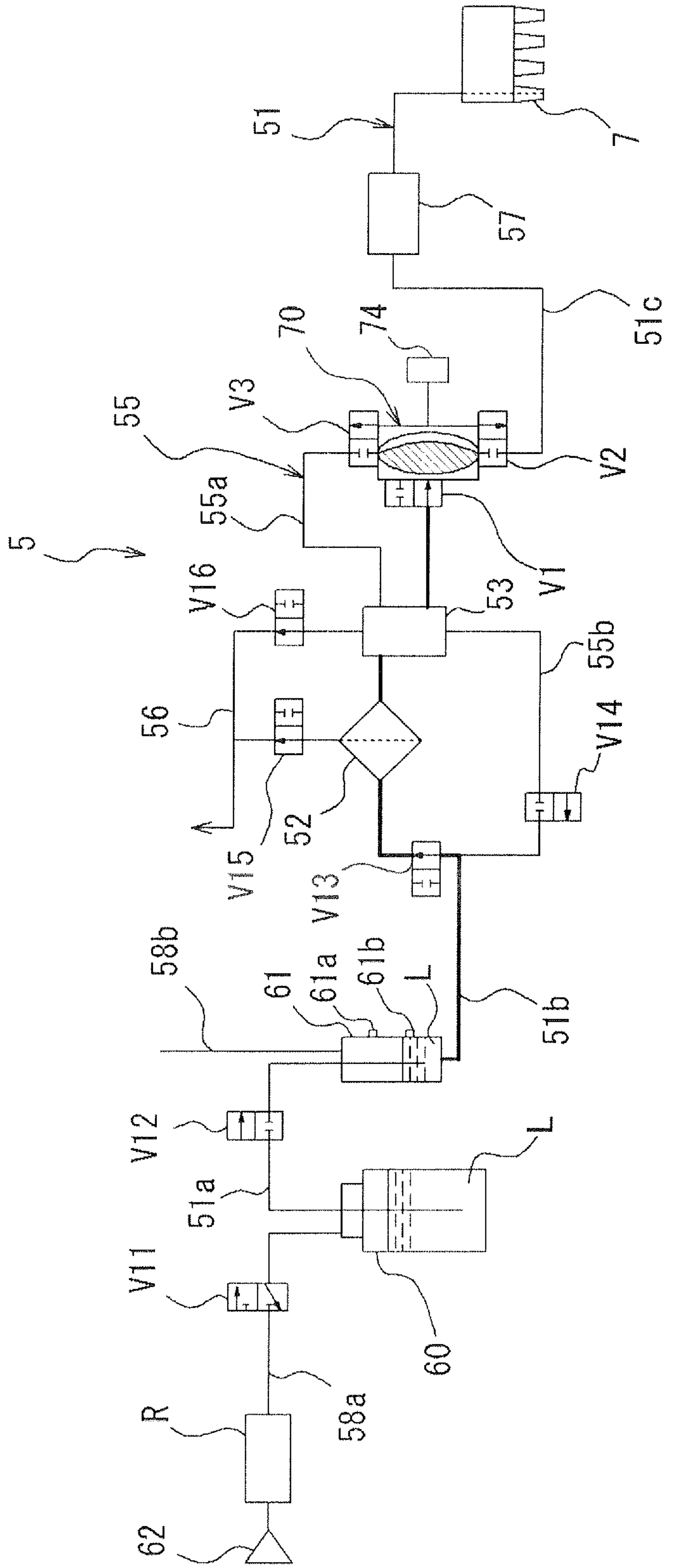
FIG. 4 is a schematic sectional view showing a pump sucking operation in the liquid processing apparatus of a 1-1st embodiment.
Figure 5:
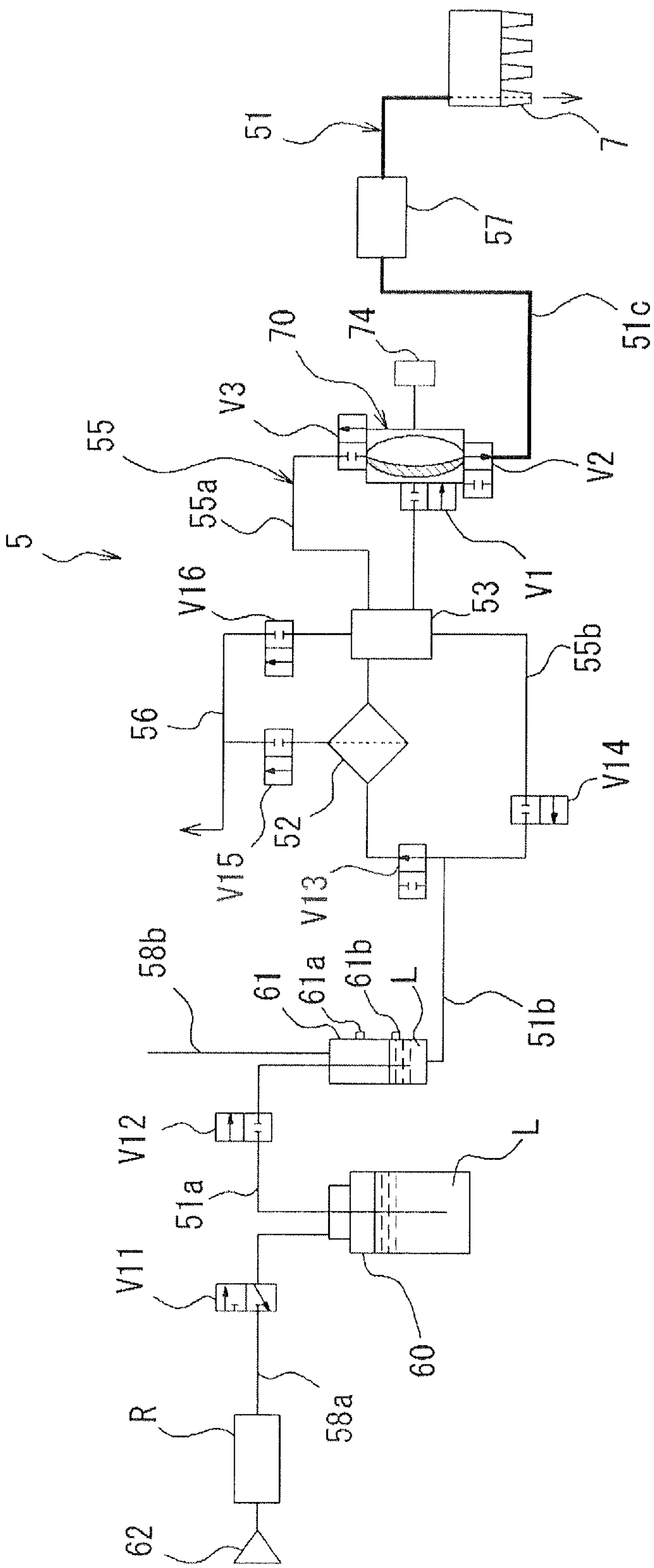
FIG. 5 is a schematic sectional view showing a process-liquid discharging operation in the liquid processing apparatus of the 1-1st embodiment.
Figure 6:
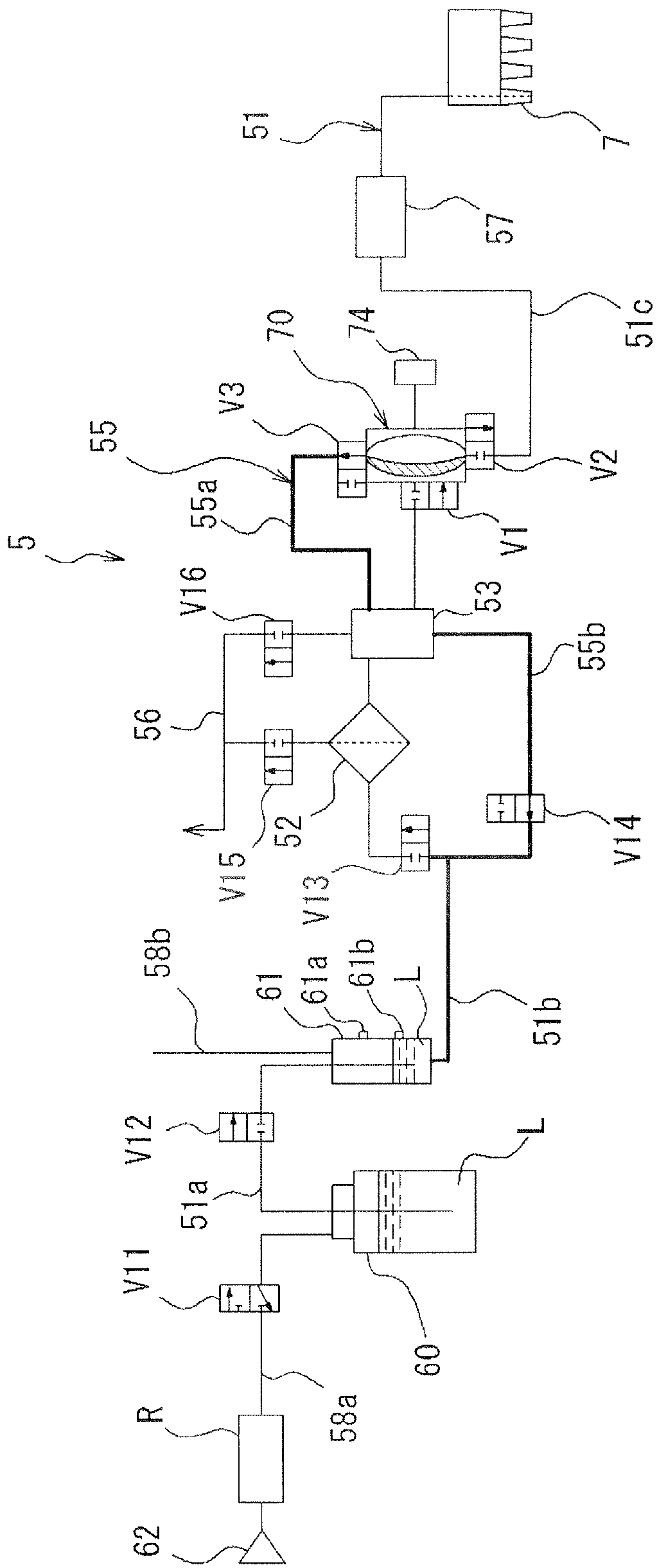
FIG. 6 is a schematic sectional view showing a process-liquid circulating operation in the liquid processing apparatus of the 1-1st embodiment.

As shown in FIG. 3, the liquid processing apparatus 5 according to the present invention includes: a process liquid container 60 configured to contain a resist liquid L as a process liquid; a discharge nozzle 7 configured to discharge (supply) the resist liquid L to a wafer as a substrate to be processed; a supply conduit 51 connecting the process liquid container 60 and the discharge nozzle 7; a filter 52 disposed in the supply conduit 51 and configured to filtrate the resist liquid L; a pump 70 disposed in the supply conduit 51 on a secondary side of the filter 52; a trap tank 53 disposed on the supply conduit 51 on a connection portion between the secondary side of the filter 52 and a primary side of the pump 70; a return conduit 55 connecting a discharge side of the pump 70 and the primary side of the filter 52; first to third on-off valves V1 to V3 which are disposed on a connection portion between the pump 70 and the filter 52, a connection portion between the pump 70 and the discharge nozzle 7, and a connection portion between the pump 70 and the return conduit 55, respectively; and a control unit 101 configured to control the pump 70, and the first, second and third on-off valves V1 to V3.

In the first embodiment, the return conduit 55 connecting the discharge side of the pump 70 and the primary side of the filter 52 corresponds to a first return conduit 55*a* connecting the pump 70 and the trap tank 53 and a second return conduit 55*b* connecting the trap tank 53 and a second process-liquid supply conduit 51*b* on the primary side of the filter 52.

The supply conduit 51 is composed of a first process-liquid supply conduit 51*a* connecting the process liquid container 60 and a buffer tank 61 for temporarily storing the resist liquid L guided from the process liquid container 60, the second process-liquid supply conduit 51*b* connecting the buffer tank 61 and the pump 70, and a third process-liquid supply conduit 51*c* connecting the pump 70 and the discharge nozzle 7. The second process-liquid supply conduit 51*b* is equipped with the filter 52. The trap tank 53 is disposed on the second process-liquid supply conduit 51*b* on the secondary side of the filter 52. Further, a supply control valve 57 configured to control supply of the resist liquid L discharged from the discharge nozzle 7 is disposed in the third process-liquid supply conduit 51*c*. A drain conduit 56 through which bubbles generated in the resist liquid L are discharged is connected to the filter 52 and the trap tank 53.

A first gas supply conduit 58*a*, which is connected to a supply source 62 of an inert gas such as nitrogen ($N_2$) gas, is connected to an upper portion of the process liquid container 60. The first gas supply conduit 58*a* is equipped with an electro-pneumatic regulator R that is a pressure regulating means capable of varying and regulating a pressure. The electro-pneumatic regulator R includes an operation unit such as a proportional solenoid operated by a control signal from the control unit 101 described below, and a valve mechanism that is opened and closed by the operation of the solenoid. The electro-pneumatic regulator R is configured to regulate a pressure by opening and closing the valve mechanism. A second gas supply conduit 58*b*, through which an inert gas such as nitrogen ($N_2$) gas stagnating in an upper portion of the buffer tank 61 is opened to an atmosphere, is connected to the upper portion of the buffer tank 61.

An electromagnetic on-off valve V11 is disposed between the electro-pneumatic regulator R of the first gas supply conduit 58*a* and the process liquid container 60. The first process-liquid supply conduit 51*a* is equipped with an electromagnetic on-off valve V12. In addition, an electromagnetic on-off valve V13 is disposed between the buffer tank 61 of the second process liquid supply conduit 51*b* and the filter 52 on the secondary side of a connection portion between the second process-liquid supply conduit 51*b* and the second return conduit 55*b*. The second return conduit 55*b* is equipped with an electromagnetic on-off valve V14. The drain conduit 56 is equipped with electromagnetic on-off valves V15 and V16. The on-off valves V11 to V16 and the electro-pneumatic regulator R are controlled by a control signal from the control unit 101.

The buffer tank 61 is provided with an upper-limit liquid level sensor 61*a* and a lower-limit liquid level sensor 61*b* configured to monitor predetermined liquid level positions (completely filled position, replenishment requiring position) of the contained resist liquid L, and to detect the remaining amount of the contained resist liquid L. When a liquid level position of the resist liquid L is detected by the upper-limit liquid level sensor 61*a* while the resist liquid L is supplied from the process liquid container 60 to the buffer tank 61, the on-off valves V11 and V12 are closed so that the supply of the resist liquid L from the process liquid container 60 to the buffer tank 61 is stopped. On the other hand, when a liquid level position of the resist liquid L is detected by the lower-limit liquid level sensor 61*b*, the on-off valves V11 and V12 are opened so that supply of the resist liquid L from the process liquid container 60 to the buffer tank 61 is started.

Figure 7:
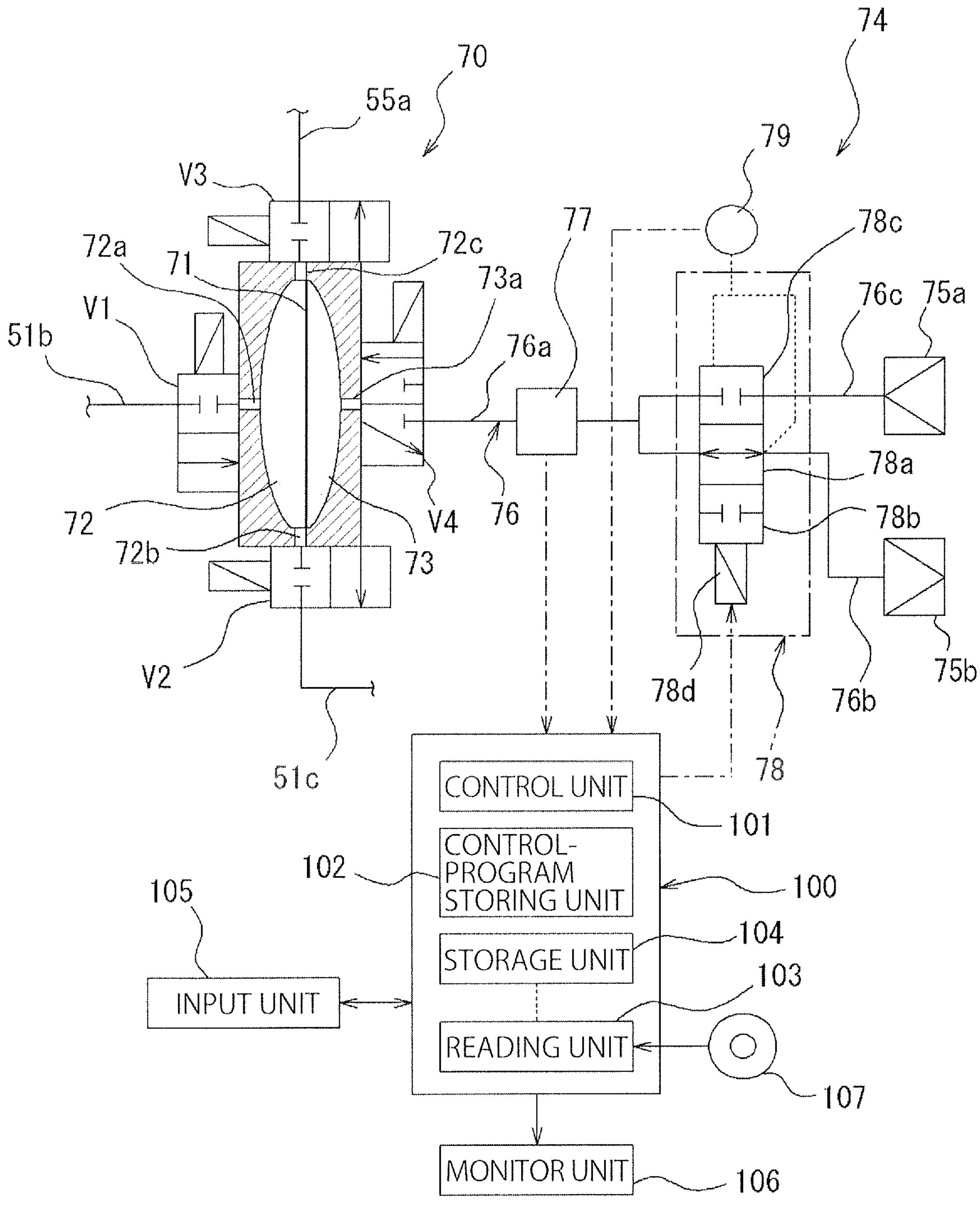
FIG. 7 is a schematic sectional view showing a pump in the liquid processing apparatus of the 1-1st embodiment.
Figure 8:
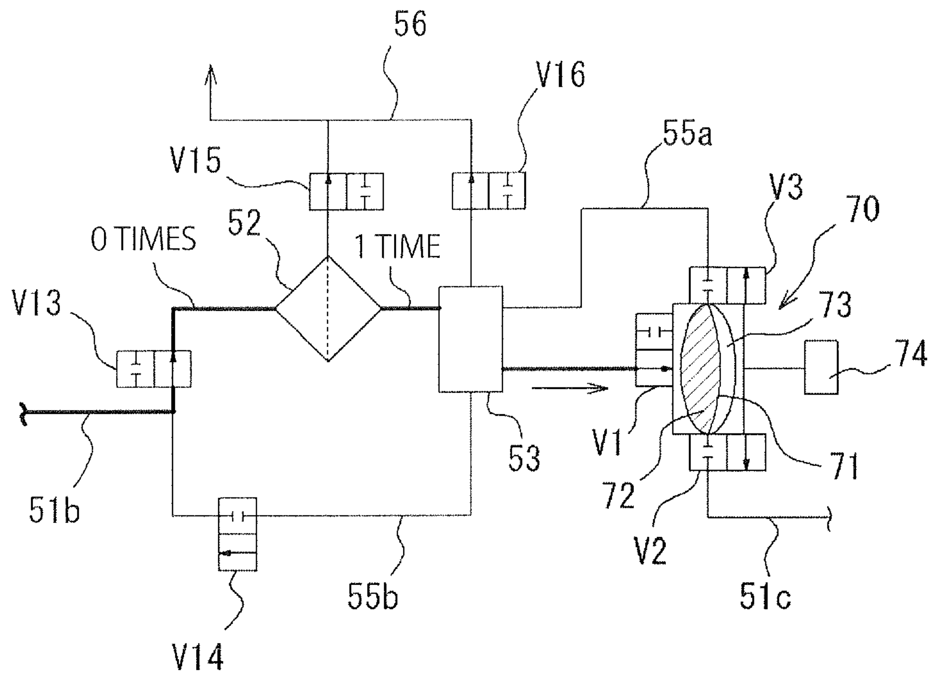
FIG. 8 is a schematic cross sectional view showing the number of synthesis filtration upon a first pump sucking operation in the liquid processing apparatus of the 1-1st embodiment.
Figure 9:
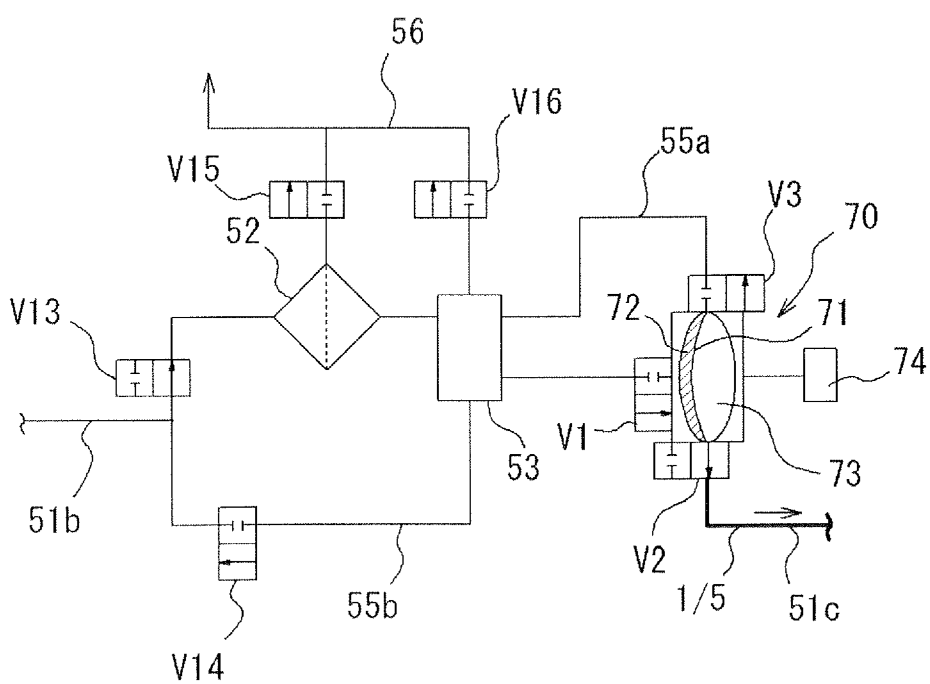
FIG. 9 is a schematic sectional view showing a discharge amount upon the process-liquid discharging operation in the liquid processing apparatus of the 1-1st embodiment.

Next, a detailed structure of the pump 70 is described with reference to FIG. 7. The pump 70 shown in FIG. 7 is a diaphragm pump that is a variable displacement pump. The diaphragm pump 70 is partitioned into a pump chamber 72 and an operation chamber 73 by a diaphragm 71 that is a flexible member.

The pump chamber 72 is provided with: a primary-side communication path 72*a* connected to the second process-liquid supply conduit 51*b* via the on-off valve V1, through which the resist liquid L in the second process-liquid supply conduit 51*b* is sucked; a secondary-side communication path 72*b* connected to the third process-liquid supply conduit 51*c* via the on-off valve V2, through which the resist liquid L is discharged to the third process-liquid supply conduit 51*c*; and a circulation-side communication path 72*c* connected to the first return conduit 55*a* via the on-off valve V3, through which the resist liquid L is discharged to the first return conduit 55*a*.

Connected to the operation chamber 73 is a drive means 74 configured to control decompression and pressurization of a gas in the operation chamber 73 based on a signal from the control unit 101. The drive means 74 includes an air pressurization source 75*a* (hereinafter referred to as "pressurization source 75*a*") and an air decompression source 75*b* (hereinafter referred to as "decompression source 75*b*"), a flowmeter 77 as flow rate sensor, an electro-pneumatic regulator 78 and a pressure sensor 79.

The operation chamber 73 is provided with a supply and exhaust channel 73*a* connected to the drive means 74 through a supply and exhaust switching valve V4. A conduit 76, which is selectively communicated with the pressurization source 75*a* and the decompression source 75*b*, is connected to the supply and exhaust channel 73*a* through the supply and exhaust switching valve V4. In this case, the conduit 76 is composed of a main conduit 76*a* connected to the operation chamber 73, an exhaust conduit 76*b* diverged from the main conduit 76*a* to be connected to the decompression source 75*b*, and a pressurization conduit 76*c* connected to the pressurization source 75*a*. The flowmeter 77 as a flow rate sensor is disposed in the main conduit 76*a*. A pressure regulating mechanism for regulating an exhaust pressure, which is disposed on the exhaust conduit 76*b*, and a pressure regulating mechanism for regulating a pressurization, i.e., an air pressure, which is disposed on the pressurization conduit 76*c*, are formed by the electro-pneumatic regulator 78. In this case, the electro-pneumatic regulator 78 includes a common communication block 78*a* configured to selectively connect the exhaust conduit 76*b* and the pressurization conduit 76*c*, two stop blocks 78*b* and 78*c* configured to block communication of the exhaust conduit 76*b* or the pressurization conduit 76*c*, and an electromagnetic switching unit 78*d* configured to switch the communication block 78*a* and the stop blocks 78*b* and 78*c*. The electro-pneumatic regulator 78 is equipped with the pressure sensor 79. A pressure in the operation chamber 73 to which the conduit 76 is connected is detected by the pressure sensor 79.

In the working-air supply and exhaust unit connected to the operation chamber 73 of the diaphragm pump 70 as structured above, the flowmeter 77, the pressure sensor 79 and the electro-pneumatic regulator 78, which constitute the drive means 74, are electrically connected to the control unit 101, respectively. An exhaust flow rate in the conduit 76 detected by the flowmeter 77 and a pressure in the conduit 76 detected by the pressure sensor 79 are transmitted (inputted) to the control unit 101, and a control signal is transmitted (outputted) from the control unit 101 to the electro-pneumatic regulator 78.

The control unit 101 is incorporated in a control computer 100 that is a storage medium. The control computer 100 includes, in addition to the control unit 101, a control-program storage unit 102 storing a control program, a reading unit 103 configured to read data from outside, and a storage unit 104 storing data. In addition, the control computer 100 includes an input unit 105 connected to the control unit 101, a monitor unit 106 configured to display various conditions of the liquid processing apparatus 5, and a computer-readable storage medium 107 mounted on the reading unit 103 and storing a software that causes the control computer 100 to execute the control program. Based on the control program, the control computer 100 is configured to output control signals to the respective units. The control-program storage unit 102 stores a control program by means of which the resist liquid L is sucked into the pump 70, the resist liquid L is discharged from the pump 70 to the discharge nozzle 7, the resist liquid L is supplied from the pump 70 to the second process-liquid supply conduit 51*b* on the primary side of the filter 52 through the return conduit 55, the resist liquid L replenished from the buffer tank 61 and the resist liquid L returning through the return conduit 55 are synthesized, and the synthesized resist liquid L is filtrated by the filter 52 the number of times corresponding to a rate between a discharge amount of the resist liquid L to the discharge nozzle 7 and a return amount of the resist liquid L returning from the pump 70 to the second process-liquid supply conduit 51*b* through the conduit 55.

The control program is stored in the storage medium 107 such as a hard disc, a compact disc, a flush memory, a flexible disc or a memory card. The control program is used by installing the control program in the control computer 100 from the storage medium 107.

Next, an operation of the liquid processing apparatus 5 in this embodiment is described with reference to FIGS. 4 to 6 and 8 to 13. At first, based on a control signal from the control unit 101, the on-off valve V11 disposed in the first gas supply conduit 58*a* and the on-off valve V12 disposed in the first process-liquid supply conduit 51*a* are opened. The resist liquid L is supplied into the buffer tank 61 due to the pressurization by the $N_2$ gas supplied from the $N_2$ gas supply source 62 into the process-liquid container 60.

When a predetermined amount of the resist liquid L has been supplied (replenished) into the buffer tank 61, the on-off valves V11 and V12 are closed based on a control signal from the control unit 101 which has received a detection signal from the upper-limit liquid level sensor 61*a*. At this time, the on-off valve V1 is open and the on-off valves V2 and V3 are close. The supply and exhaust switching valve V4 is switched to the exhaust side, and a pressure in the operation chamber 73 of the diaphragm pump 70 is detected by the pressure sensor 79 in this condition. A detection signal of the detected pressure is transmitted (inputted) to the control unit 101. After the supply and exhaust switching valve V4 has been switched to the exhaust side, the on-off valve V13 is opened.

Then, the electro-pneumatic regulator 78 is communicated with the decompression source 75*b*, so that air in the operation chamber 73 is exhausted. At this time, an exhausted-air flow rate is detected by the flowmeter 77, and a detection signal of the detected exhausted-air flow rate is transmitted (inputted) to the control unit 101. Since the air in the operation chamber 73 is exhausted, a predetermined amount of the resist liquid L is sucked into the pump chamber 72 from the second process-liquid supply conduit 51*b* (step S1). At this time, since the resist liquid L passes through the filter, the number of filtration of the resist liquid L is one.

Then, the on-off valves V1 and V3 are closed, while the on-off valve V2 and the supply control valve 57 are opened. At this time, the supply and exhaust switching valve V4 is switched to a suction side and the electro-pneumatic regulator 78 is communicated with the pressurization side, so that air is supplied into the operation chamber 73. Thus, a part of the resist liquid L (e.g., one-fifth), which has been sucked into the pump chamber 72, is discharged to the wafer through the discharge nozzle 7 (step S2).

In this case, an amount of the resist liquid L sucked in the pump chamber 72 is regulated by a supply amount of air supplied to the operation chamber 73. Namely, when air of a smaller amount is supplied to the operation chamber 73, a volume of the operation chamber 73 does not increase so much, whereby a discharge amount of the resist liquid L discharged to the wafer is smaller. On the other hand, when air of a larger amount is supplied to the operation chamber 73, the volume of the operation chamber 73 increases, whereby a discharge amount of the resist liquid L discharged to the wafer W is larger. In this embodiment, one-fifth of the resist liquid L sucked in the pump chamber 72 is discharged to the wafer. A supply amount of air to be supplied to the operation chamber 73 is determined based on the data stored in the storage unit 104.

As a method of regulating an amount of the resist liquid L sucked into the pump chamber 72, an air supply period of time may be regulated, instead of regulating a supply amount of air supplied into the operation chamber 73. Alternatively, the supply of air into the operation chamber 73 may be regulated by a pulse signal transmitted from the control unit 101.

Then, the on-off valves V1 and V2 are closed while the on-off valves V3 and V14 are opened, so that a supply amount of air to the operation chamber 73 is increased. Thus, the remaining resist liquid L (e.g., four-fifths) sucked in the pump chamber 72 is returned to the second process-liquid supply conduit 51*b* through the return conduits 55*a* and 55*b* (step S3). In this embodiment, four-fifths of the resist liquid L, which has been sucked into the pump chamber 72 in the step S1, is returned to the second process-liquid supply conduit 51*b*.

Then, the on-off valve V3 is closed while the on-off valves V1 and V13 are opened, so that the resist liquid L returned to the second process-liquid supply conduit 51*b* and the resist liquid L replenished in the buffer tank 61 are synthesized, whereby the process returns to the step 1. Under this condition, the synthesized resist liquid L is sucked to the pump chamber 72. At this time, the amount of the resist liquid L supplied from the buffer tank 61 to the pump chamber 72 is equal to the discharge amount to the wafer. Thus, in this embodiment, the resist liquid L an amount of which is equal to one-fifth of the resist liquid L sucked in the pump chamber 72 is replenished from the buffer tank 61 to the second process-liquid supply conduit 51*b*.

The resist liquid L returned to the second process-liquid supply conduit 51*b* through the return conduit 55 has been filtrated by the filter 52, while the resist liquid L supplied from the buffer tank 61 is not filtrated by the filter 52. Thus, when the number of filtration of the resist liquid L which is formed by synthesizing the resist liquid L returned to the second process-liquid supply conduit 51*b* through the return conduit 55 and the resist liquid L replenished from the buffer tank 61 is calculated as the number of synthesis filtration of the resist liquid L, a relationship between the number of synthesis filtration of the resist liquid L, a discharge amount of the resist liquid L sucked in the pump 70 to a wafer W, and a return amount of the resist liquid L sucked in the pump 70 to the second process-liquid supply conduit 51*b* is shown by the following expression (1).

$$An=(a+b)/a-b/a\times\{b/(a+b)\}^{n-1} \quad (1)$$

Figure 13:
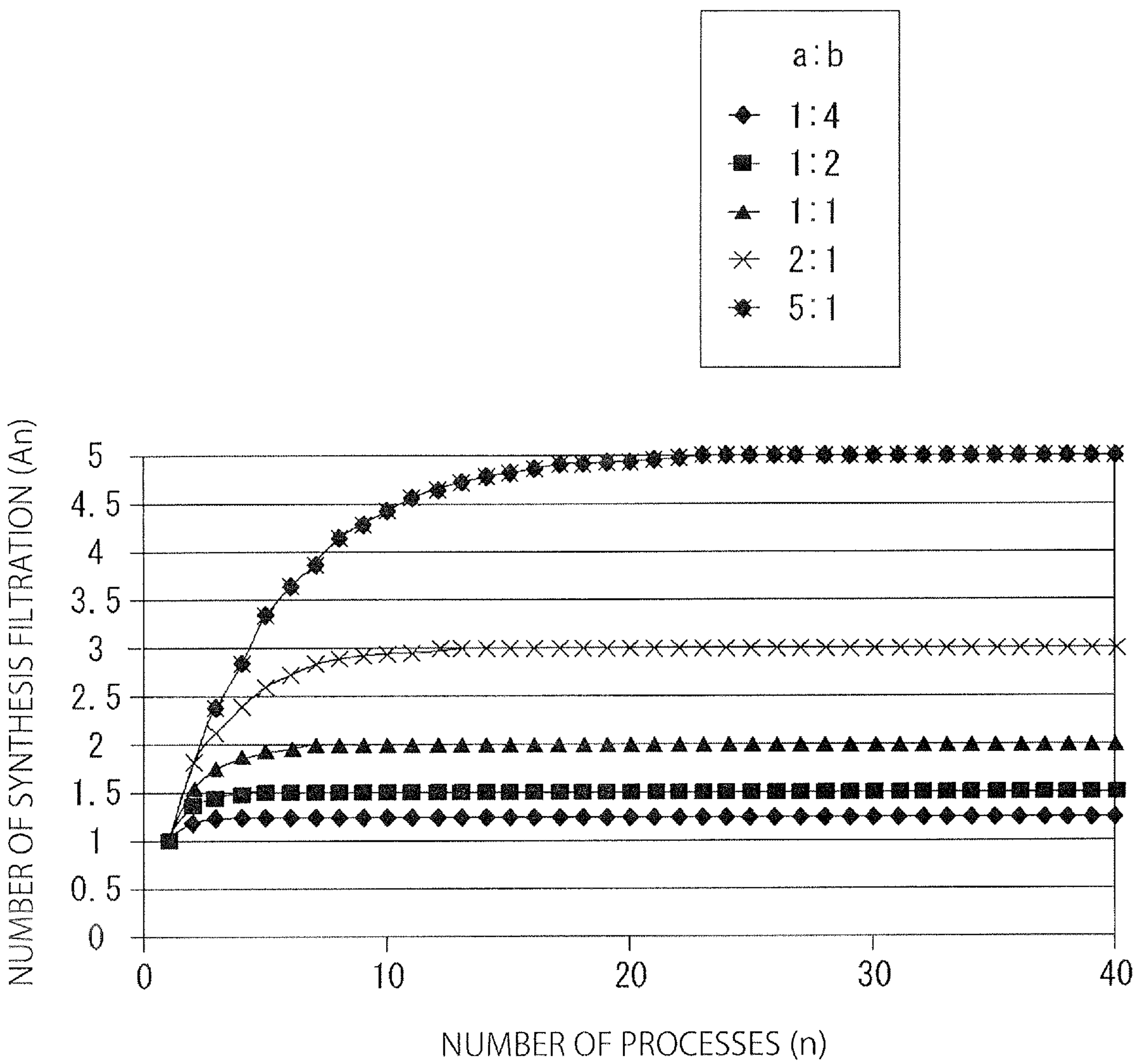
FIG. 13 is a graph showing the number of synthesis filtration with respect to a ratio between a discharge amount of a resist liquid to a wafer and a return amount.
Figure 14:
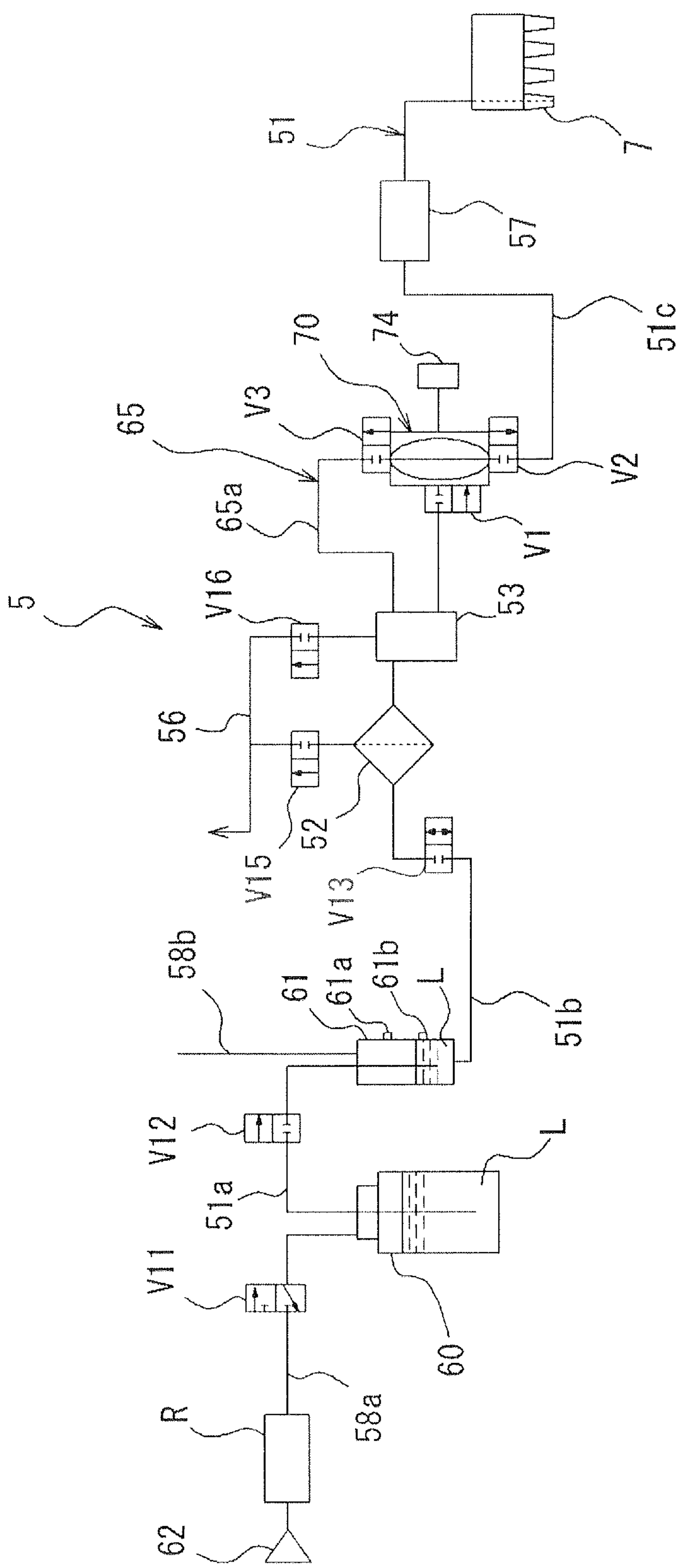
FIG. 14 is a schematic sectional view showing a 1-2nd embodiment of the liquid processing apparatus according to the present invention.

In the expression (1), An represents the number of synthesis filtration. The number of synthesis filtration represented in the expression (1) is referred to as the number of circulation synthesis filtration. In addition, a and b represent rates of a discharge amount of the resist liquid L to a wafer and a return amount of the resist liquid L to the return conduit 55, and n represents the number (the number of processes) at which the resist liquid L is passed through the filter 52. The number of synthesis filtration An of the resist liquid L corresponds to the number of times corresponding to a synthesis of a rate between a discharge amount and a return amount of the present invention. In the above expression (1), by increasing the number of processes n, the number of synthesis filtration An is saturated with a value of (a+b)/a. FIG. 13 show a relationship between An, n, a and b.

As shown in FIG. 13, when a=1 and b=4, as the number of processes n increases, the number of synthesis filtration An comes close to and converges 5. Similarly, when a=1 and b=2, the number of synthesis filtration An comes close to and converges 3. When a=1 and b=1, the number of synthesis filtration comes close to and converges 2. When a=2 and b=1, the number of synthesis filtration An comes close to and converges 1.5. When a=5 and b=1, the number of synthesis filtration An comes close to and converges 1.2.

Figure 10:
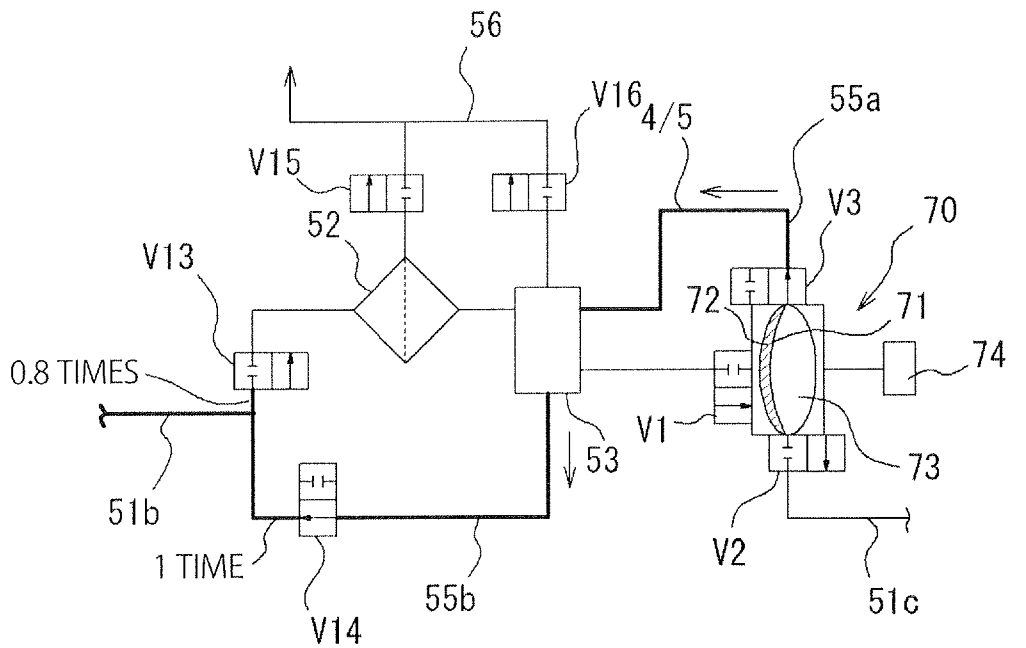
FIG. 10 is a schematic sectional view showing a circulation amount upon the process-liquid circulating operation and the number of synthesis filtration in the liquid processing apparatus of the 1-1st embodiment.
Figure 11:
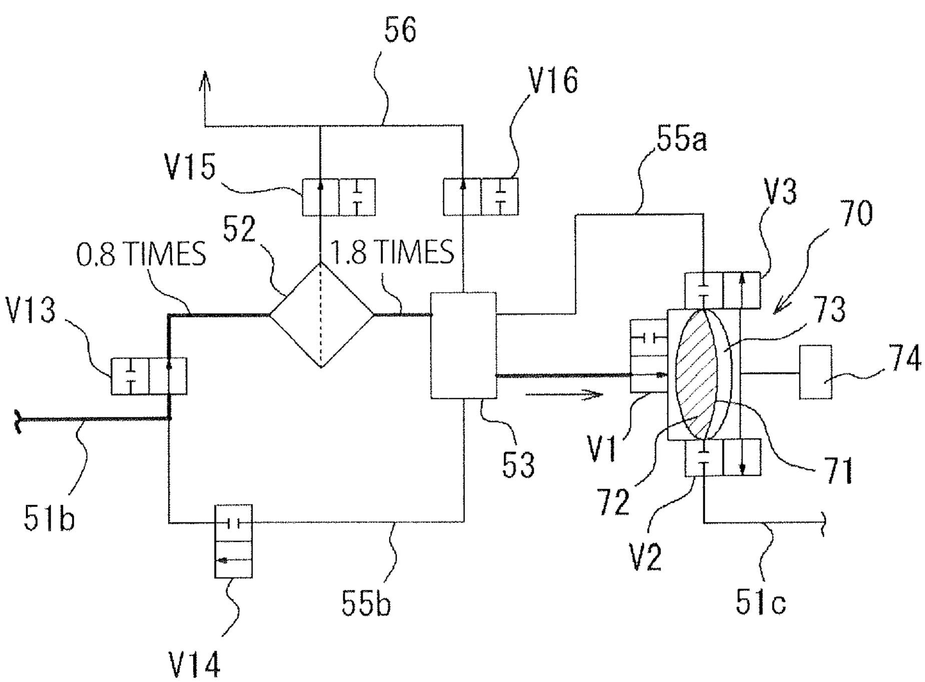
FIG. 11 is a schematic sectional view showing the number of synthesis filtration upon a second pump sucking operation in the liquid processing apparatus in the 1-1st embodiment.

In this embodiment, a rate between an amount of the resist liquid L returned to the second process-liquid supply conduit 51*b* through the return conduit 55 and an amount of the resist liquid L supplied from the buffer tank 61 is 4:1, the number of filtration of the resist liquid L returned to the second process-liquid supply conduit 51*b* through the return conduit 55 is one, and the number of filtration of the resist liquid L supplied from the buffer tank 61 is zero. In this case, as shown in FIGS. 10 and 11, the number of synthesis filtration of the resist liquid L supplied to the second process-liquid supply conduit 51*b* on the primary side of the filter 52 is 0.8. By passing the resist liquid L through the filter 52, the number of synthesis filtration of the resist liquid L is 1.8.

By repeating the steps S1 to S3, the step of sucking the resist liquid L into the pump 70, the step of discharging a part (one-fifth) of the process liquid L sucked into the pump 70 to a wafer and returning the remaining part (four-fifths) of the resist liquid L sucked in the pump 70 to the second supply conduit 51*b*, and a step of replenishing the resist liquid L from the buffer tank 61 are repeated. For example, suppose that a rate between a discharge amount of the resist liquid L to a wafer and a return amount of the resist liquid L to the second process-liquid supply conduit 51*b* is 1:4 (a=1, b=4). In this case, when the steps S1 to S3 are repeated five times (n=5), the number of synthesis filtration A5 is 3.36, based on the calculation of the above expression (1).

Next, an effect of the first embodiment is described with reference to Table 1. Table 1 shows a time (cycle time) required for the steps S1 to S3 relative to the number of synthesis filtration An of the circulation synthesis filtration and a reciprocation synthesis filtration described below, and the standardized number of particles. The standardized number of particles herein means a rate of the number of particles when the resist liquid L, which has been subjected the circulation synthesis filtration or the reciprocation synthesis filtration, is discharged to a wafer, relative to the number of particles when the resist liquid L, which has not been filtrated, is discharged to a wafer W or when the resist liquid, which has been filtrated once, is discharged to a wafer W.

TABLE 1

| | Number of times of Synthesis Filtration | Discharge Amount (ml) | Return Amount (ml) | Cycle Time (s) | Standardized Number of Particles | Standardized Number of Particles relative to One Filtration |
|---|---|---|---|---|---|---|
| Filtration 0 times | 0 | 0.5 | 0 | | 100 | |
| Filtration once | 1 | 0.5 | 0 | 25.5 | 22 | 100 |
| Circulation | 5 | 0.5 | 2.0 | 24.9 | 17 | 77 |
| Synthesis | 10 | 0.5 | 4.5 | 35.9 | 7 | 32 |
| Circulation | 5 | 0.5 | 1.0 | 20.5 | 18 | 82 |
| Reciprocation Synthesis | 10 | 0.5 | 2.3 | 26.0 | 8 | 36 |

In the circulation synthesis filtration method where the number of synthesis filtration An was 5, the cycle time was 24.9 seconds, the standardized number of particles was 17, and the standardized number of particles relative to one filtration was 77. Thus, in the circulation synthesis filtration method where the number of synthesis filtration An was 5, it was possible to achieve the cycle time which was substantially the same as the cycle time when the filtration was performed once. The number of particles could be reduced to 17% as compared with the not-filtrated resist liquid L, and the number of particles could be reduced to 77% as compared with the once-filtrated resist liquid L.

In addition, in the circulation synthesis filtration method where the number of synthesis filtration An was 10, the cycle time was 35.9 seconds, the standardized number of particles was 7, and the standardized number of particles relative to one filtration was 32. Thus, in the circulation synthesis filtration method where the number of synthesis filtration An was 10, the number of particles could be reduced to 7% as compared with the not-filtrated resist liquid L, and the number of particles could be reduced 32% as compared with the once-filtrated resist liquid L. In addition, the number of particles could be reduced to 41% as compared with the circulation synthesis filtration method where the number of synthesis filtration An was 5.

Namely, the filtration efficiency can be improved while keeping the similar throughput as a throughput obtained when the filtration by a filter is performed once. Thus, a filtration efficiency, which is similar to the filtration efficiency obtained when a plurality of filters are provided, can be obtained by one filter, and decrease in throughput can be prevented, without largely modifying the apparatus.

1-2nd Embodiment

Next, a 1-2nd embodiment of the liquid processing apparatus according to the present invention is described with reference to FIGS. 14 to 17. In the 1-2nd embodiment, as to the same structure as that of the 1-1st embodiment, the same part is indicated by the same reference number and description thereof is omitted.

The liquid processing apparatus 5 of the 1-2nd embodiment does not have the second return conduit 55*b* and the on-off valve 14 in the 1-1st embodiment. A return conduit 65 is composed of a first return conduit 65*a* connecting the discharge side of the pump 70 and the trap tank 53, and the second process-liquid supply conduit 51*b* connecting the trap tank 53 and the secondary side of the filter 52.

Figure 12:
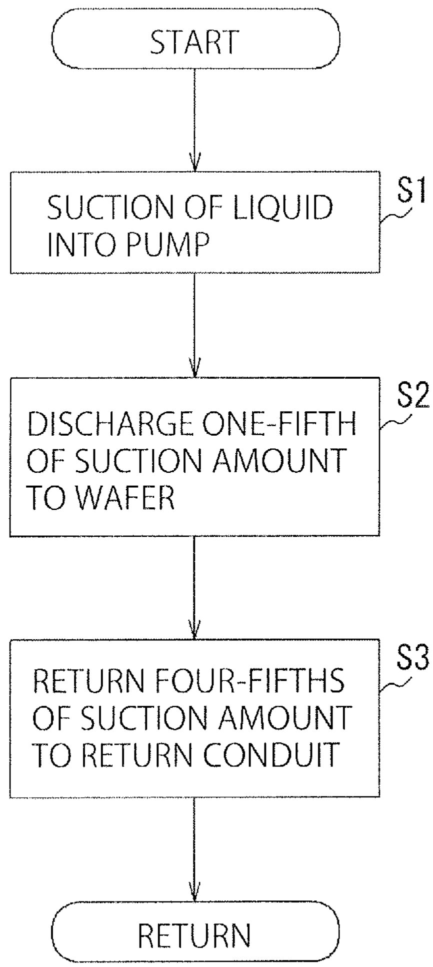
FIG. 12 is a flowchart showing a series of the pump sucking operation, the process-liquid discharging operation and the process-liquid circulating operation, in the liquid processing apparatus of the 1-1st embodiment.
Figure 15:
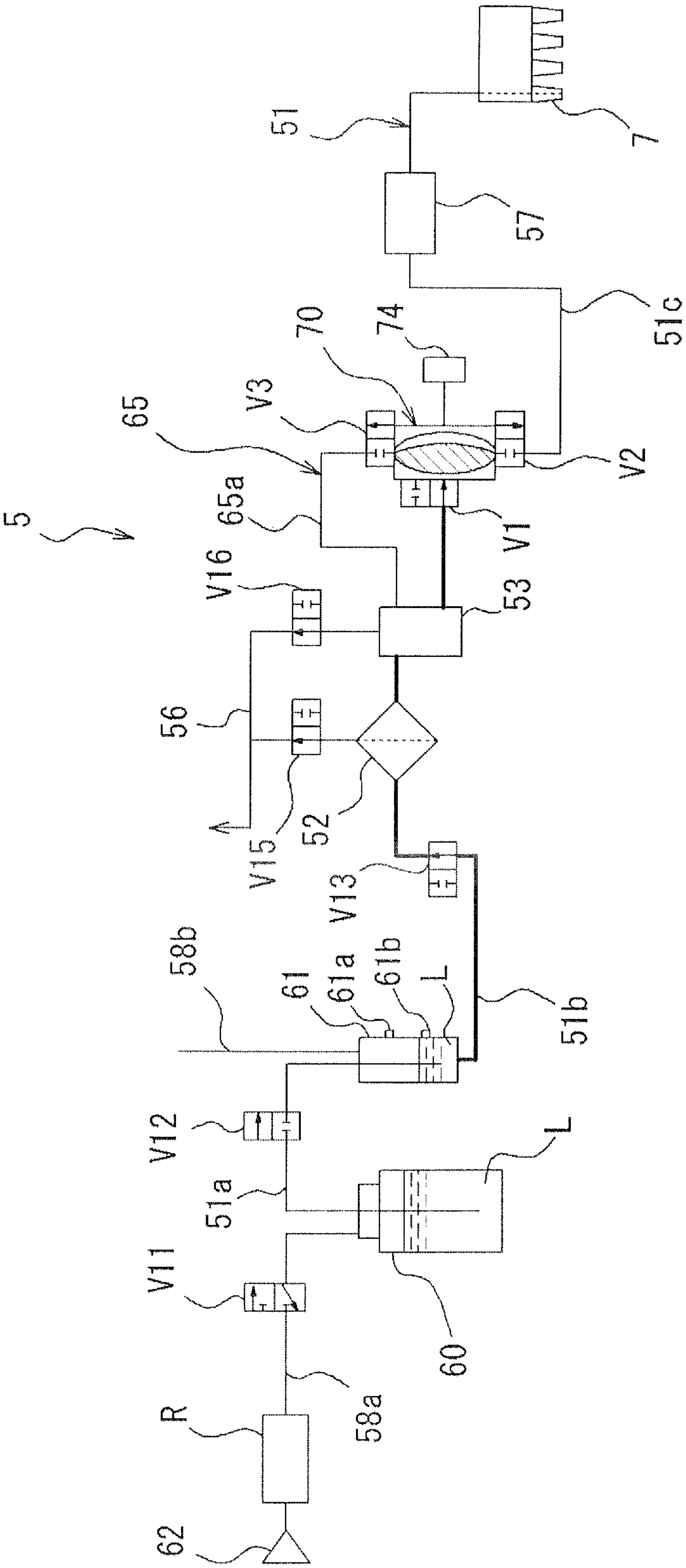
FIG. 15 is a schematic sectional view showing a pump sucking operation in the liquid processing apparatus of the 1-2nd embodiment.
Figure 16:
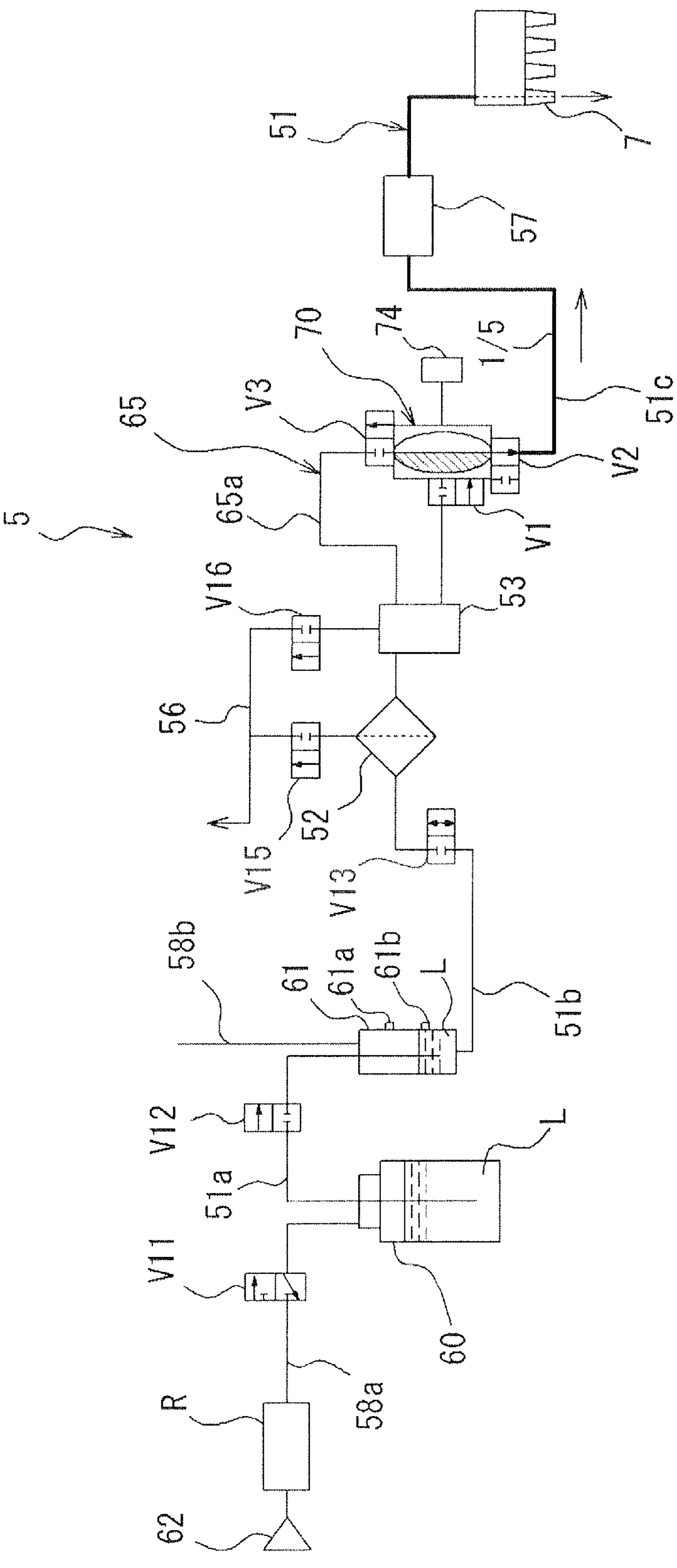
FIG. 16 is a schematic sectional view showing a process-liquid discharging operation in the liquid processing apparatus of the 1-2nd embodiment.

An operation of the 1-2nd embodiment is the same as the step S1 in FIG. 12 showing the operation performed in the 1-1st embodiment (suction of the resist liquid L to the pump chamber 72 shown in FIG. 15) and the step S2 (discharge of the resist liquid L to a wafer W shown in FIG. 16), but is different therefrom in the step S3. Namely, as shown in FIG. 17, a route of the resist liquid L, when the resist liquid L sucked in the pump 70 is returned to the second process-liquid supply conduit 51*b* on the primary side of the filter 52, is different.

Figure 17:
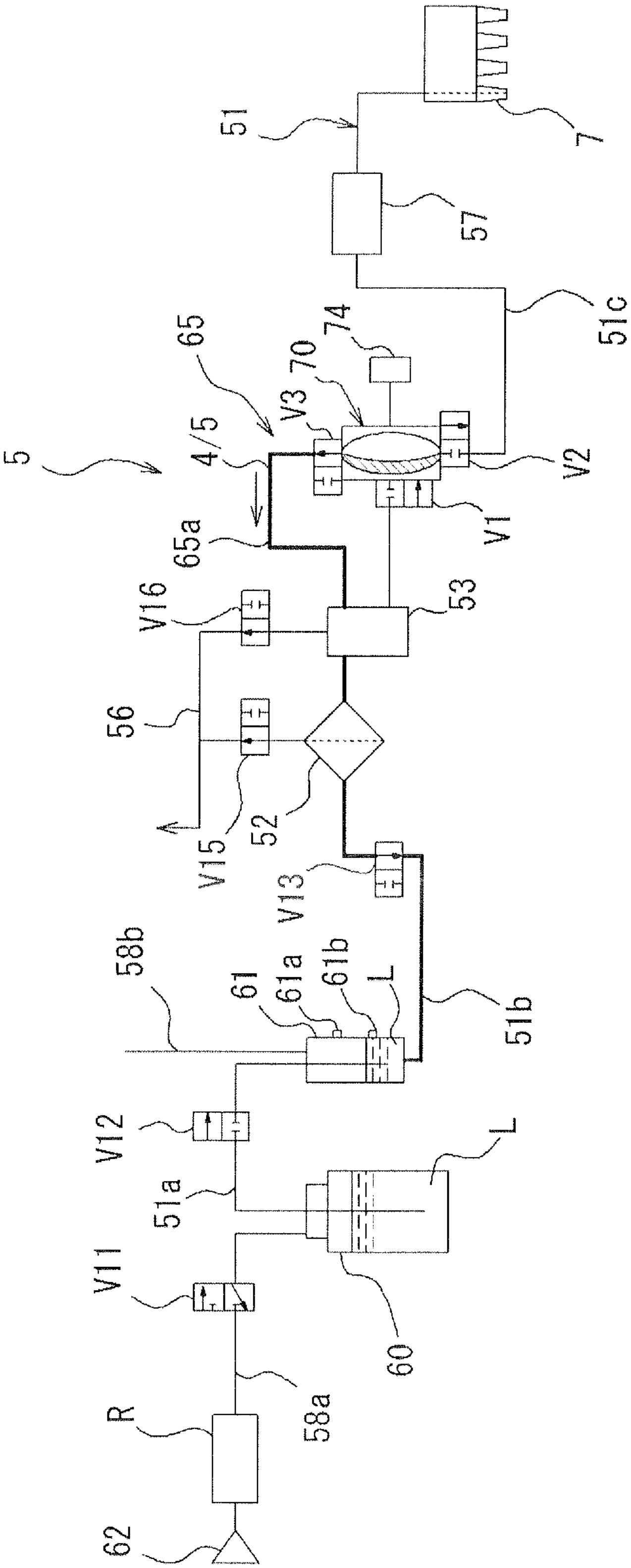
FIG. 17 is a schematic sectional view showing a process-liquid circulating operation in the liquid processing apparatus of the 1-2nd embodiment.
Figure 18:
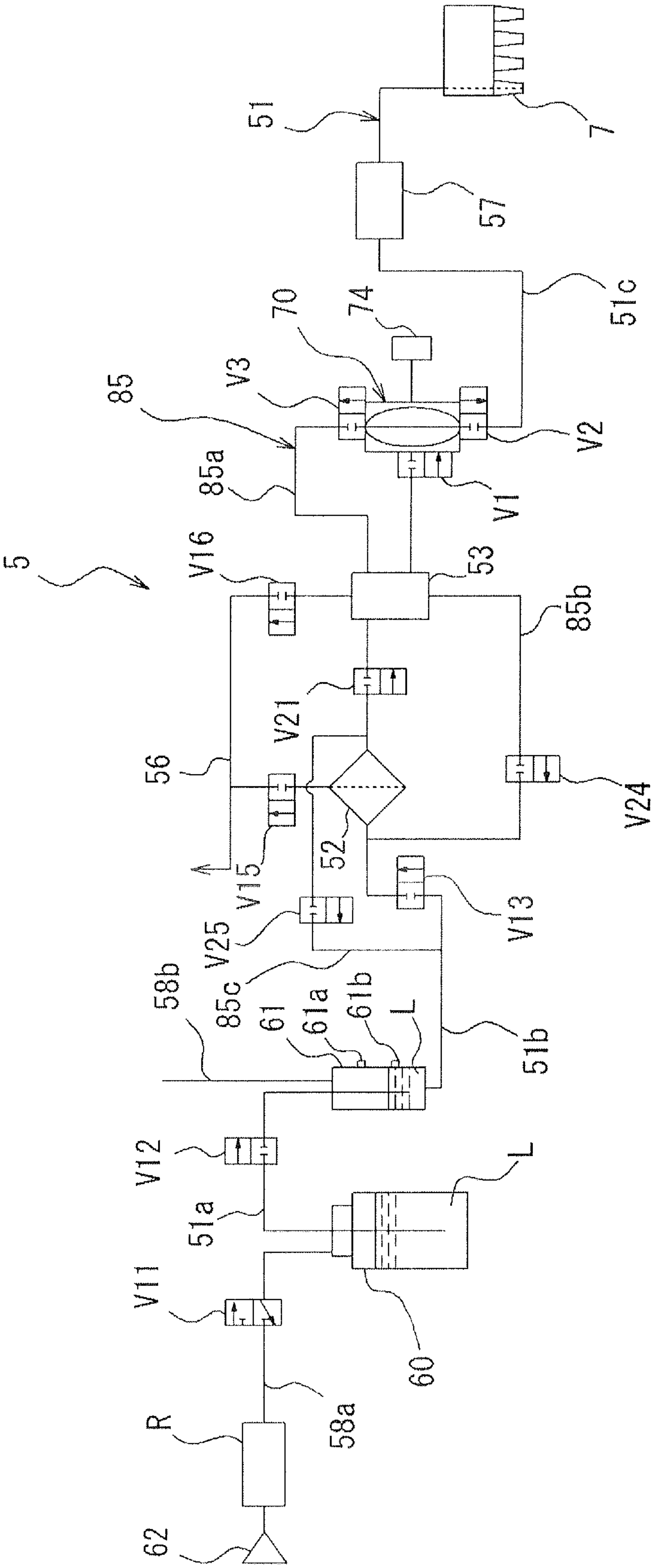
FIG. 18 is a schematic sectional view showing a 1-3rd embodiment of the liquid processing apparatus according to the present invention.

As shown in FIG. 17, after a part of the resist liquid L in the pump 70 has been discharged to a wafer, the on-off valves V1 and V2 are closed while the on-off valves V3 and V13 are opened. Under this condition, by supplying air into the operation chamber 73, the resist liquid L in the pump chamber 72 is returned to the second process-liquid supply conduit 51*b* on the primary side of the filter 52 through the return conduit 65*a* and the filter 52. Similarly to the first embodiment, the resist liquid L an amount of which is equal to the discharge amount discharged to the wafer W is replenished from the buffer tank 61. Thus, the resist liquid L is filtrated by the filter 52 when the resist liquid L is sucked into the pump 70 and when the resist liquid L is returned to the second process-liquid supply conduit 51*b*.

Thus, a part of the resist liquid L sucked in the pump 70 is filtrated by the filter 52 in the course of passing through the first return conduit 65*a* and the second process-liquid supply conduit 51*b*, in other words, in the course of reciprocating the second process-liquid supply conduit 51*b* (hereinafter referred to as "circulation reciprocation synthesis filtration"). A relationship between the number of synthesis filtration An of the resist liquid L discharged to a wafer, a discharge amount of the resist liquid L sucked in the pump 70 to the wafer, and a return amount of the resist liquid L sucked in the pump 70 to the second process-liquid supply conduit 51*b* is shown by the following expression (2).

$$An=(a+2b)/a-2b/a\times\{b/(a+b)\}^{n-1} \quad (2)$$

The number of synthesis filtration represented in the expression (2) is referred to as the number of circulation reciprocation synthesis filtration.

For example, suppose that a rate between the discharge amount to the wafer and the return amount returned to the second process-liquid supply conduit 51*b* is 1:4 (a=1, b=4). In this case, when the steps S1 to S3 are repeated five times (n=5), the number of synthesis filtration A5 is 4.21, based on the calculation of the above expression (2).

An effect of the 1-2nd embodiment is described with reference to Table 1. In the circulation reciprocation synthesis filtration method in the 1-2nd embodiment where the number of synthesis filtration An was 5, the cycle time was 20.5 seconds, the standardized number of particles was 18, and the standardized number of particles relative to one filtration was 82. Thus, in the circulation reciprocation synthesis filtration method where the number of synthesis filtration was 5, it was possible to achieve the cycle time that was shorter than the cycle time when the filtration was performed once. The number of particles could be reduced to 18% as compared with the not-filtrated resist liquid L, and the number of particles could be reduced to 82% as compared with the once-filtrated resist liquid L.

In the circulation reciprocation synthesis filtration method where the number of synthesis filtration An was 10, the cycle time was 26.0 seconds, the standardized number of particles was 8, and the standardized number of particles relative to one filtration was 36. Thus, in the circulation reciprocation synthesis filtration method where the number of synthesis filtration An was 10, the number of particles could be reduced to 8% as compared with the not-filtrated resist liquid L, and the number of particles could be reduced to 36% as compared with the once-filtrated resist liquid L. In addition, the number of particles could be reduced 44% as compared with the circulation reciprocation synthesis filtration method where the number of synthesis filtration was 5.

Namely, similarly to the 1-1st embodiment, the filtration efficiency can be improved while keeping the similar throughput as a throughput obtained when the filtration by a filter is performed once. Thus, a filtration efficiency, which is similar to the filtration efficiency obtained when a plurality of filters are provided, can be obtained by one filter, and decrease in throughput can be prevented, without largely modifying the apparatus.

In addition, in the circulation reciprocation filtration method of the 1-2nd embodiment, the resist liquid L is passed through the filter 52 also when the resist liquid L is returned to the second process-liquid supply conduit 51*b*. Thus, in the 1-2nd embodiment, the number of particles adhering onto a wafer can be reduced as compared with the 1-1st embodiment.

1-3rd Embodiment

A 1-3rd embodiment of the liquid processing apparatus according to the present invention is described with reference to FIGS. 18 to 21. In the 1-3rd embodiment, as to the same structure as that of the 1-1st and 1-2nd embodiments, the same part is indicated by the same reference number and description thereof is omitted.

A return conduit 85 of the 1-3rd embodiment is composed of a first main return conduit 85*a* constituting a main return conduit, a second main return conduit 85*b* constituting the main return conduit, and a sub return conduit 85*c* connecting the secondary side of the filter 52 and the primary side of the filter 52. The first main return conduit 85*a* connects the discharge side of the pump 70 and the trap tank 53, and the second main return conduit 85*b* connects the trap tank 53 and the second process-liquid supply conduit 51*b* on the primary side of the filter 52. In this case, the second main return conduit 85*b* is connected to the second process-liquid supply conduit 51*b* between the on-off valve V13 and the filter 52. The sub return conduit 85*c* connects the second process-liquid supply conduit 51*b* between the filter 52 and the trap tank 53, and the second process-liquid supply conduit 51*b* between the buffer tank 61 and the filter 52.

An electromagnetic on-off valve V21 is disposed in the second process-liquid supply conduit 51*b* between a connection portion between the second process-liquid supply conduit 51*b* on the secondary side of the filter 52 and the sub return conduit 85*c*, and the trap tank 53. In addition, an electromagnetic on-off valve V24 is disposed in the second main return conduit 85*b*, and an electromagnetic on-off valve V25 is disposed in the sub return conduit 85*c*. These on-off valves V21, V24 and V25 are configured to be controllable by a control signal from the control unit (not shown).

Figure 19:
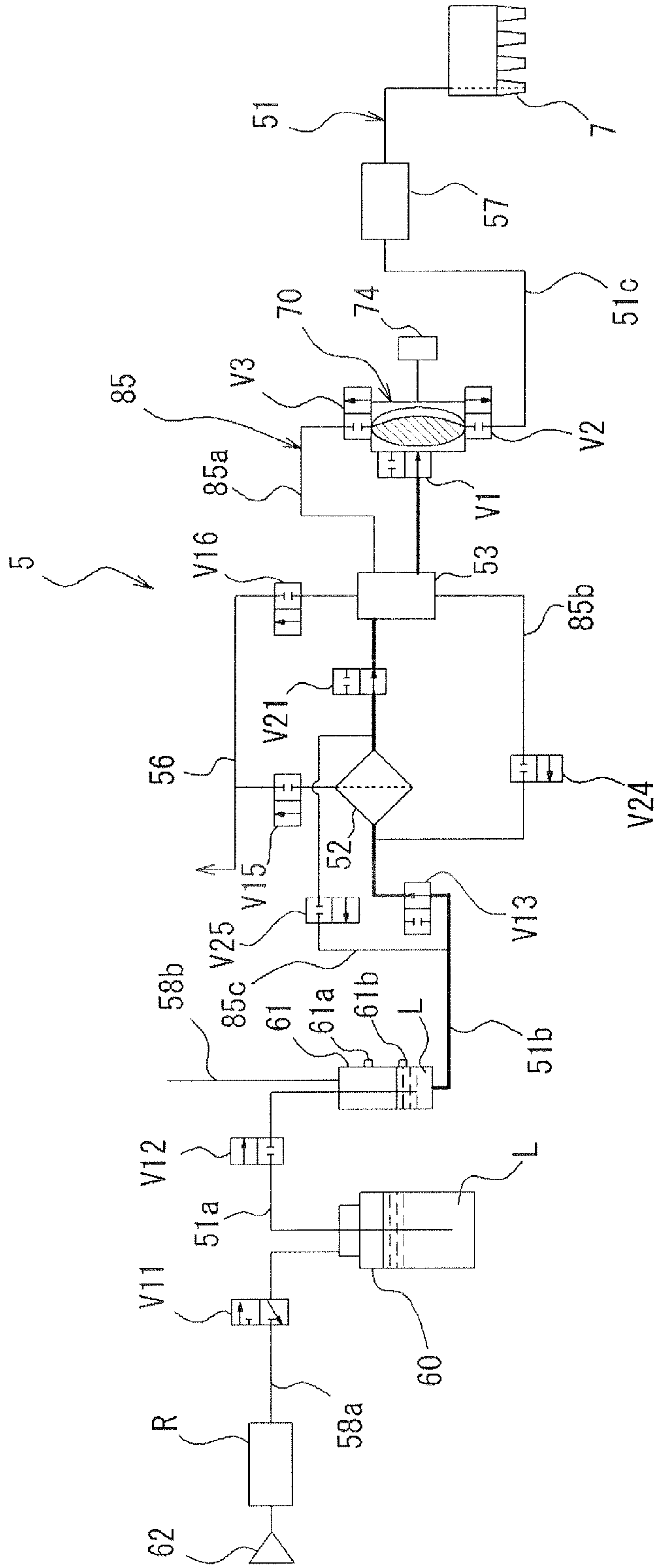
FIG. 19 is a schematic sectional view showing a pump sucking operation in the liquid processing apparatus of the 1-3rd embodiment.

An operation of the 1-3rd embodiment is the same as the step S1 in FIG. 12 showing the operation performed in the 1-1st embodiment (suction of the resist liquid L to the pump chamber 72 shown in FIG. 19) and the step S2 (discharge of the resist liquid L to a wafer W shown in FIG. 20), but is different therefrom in the step S3.

Figure 21:
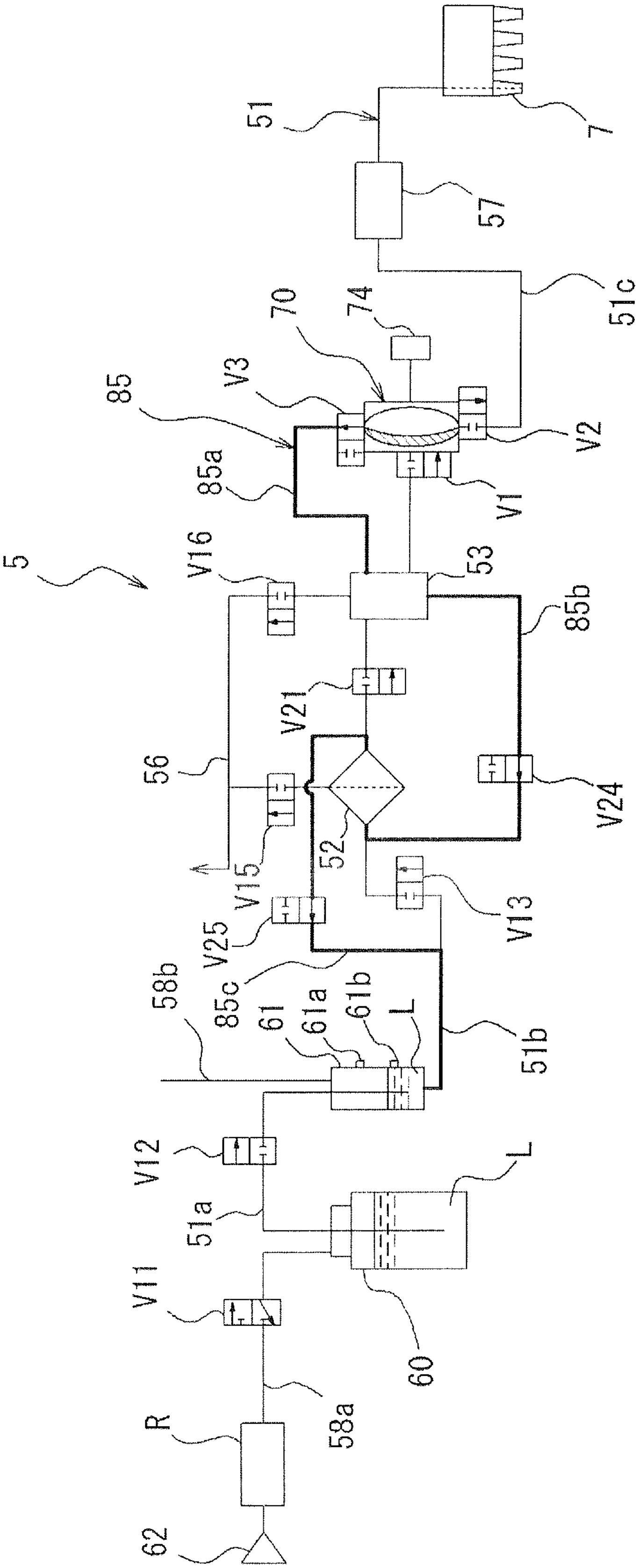
FIG. 21 is a schematic sectional view showing a process-liquid circulating operation in the liquid processing apparatus of the 1-3rd embodiment.

Namely, as shown in FIG. 21, when the resist liquid L in the diaphragm pump 70 is returned to the second process-liquid supply conduit 51*b* through the return conduit 85, a part (e.g., four-fifths) of the resist liquid L sucked in the diaphragm pump 70 is caused to flow into the return conduit 85, by closing the on-off valve V2 while opening the on-off valves V24 and V25 and by driving the drive means 74.

Then, as shown in FIG. 19, the on-off valves V3, V24 and V25 are closed while the on-off valves V1, V13 and V21 are opened, so that the resist liquid L returned to the second process-liquid supply conduit 51*b* and the resist liquid L replenished into the buffer tank 61 are synthesized, whereby the process returns to the step S1. Under this condition, the synthesized resist liquid L is sucked into the pump chamber 72.

Namely, similarly to the 1-1st and 1-2nd embodiments, the filtration efficiency can be improved while keeping the similar throughput as a throughput obtained when the resist liquid is not filtrated by a filter or filtrated once. Thus, a filtration efficiency, which is similar to the filtration efficiency obtained when a plurality of filters are provided, can be obtained by one filter, and decrease in throughput can be prevented, without largely modifying the apparatus.

Next, modification examples of the 1-3rd embodiment is described with reference to FIGS. 22 to 25.

Figure 22:
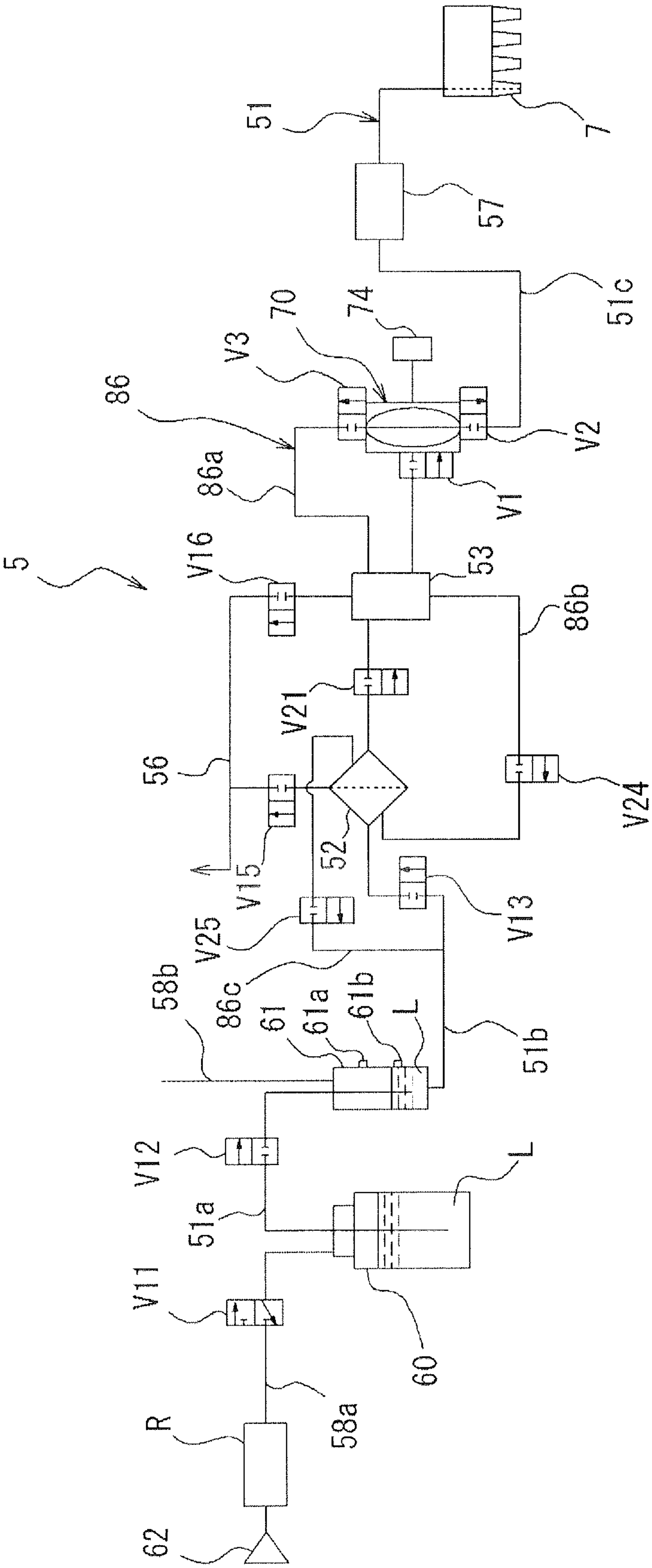
FIG. 22 is a schematic sectional view showing a modification example of the 1-3rd embodiment of the liquid processing apparatus according to the present invention.

In the modification example shown in FIG. 22, a return conduit 86 of the 1-3rd embodiment is composed of a main return conduit 86*a* connecting the discharge side of the pump 70 and the trap tank 53, a second main return conduit 86*b* connecting the trap tank 53 and the suction side of the filter 52, and a sub return conduit 86*c* connecting the discharge side of the filter 52 and the second process-liquid supply conduit 51*b* on the primary side of the filter 52. Herein, the first main return conduit 86*a* and the second main return conduit 86*b* correspond to the main return conduit in the present invention. The second main return conduit 86*b* is provided with the electromagnetic on-off valve V24, and the sub return conduit 86*c* is provided with the electromagnetic on-off valve V25. These on-off valves V24 and V25 are configured to be controllable by a control signal from the control unit (not shown).

Figure 23:
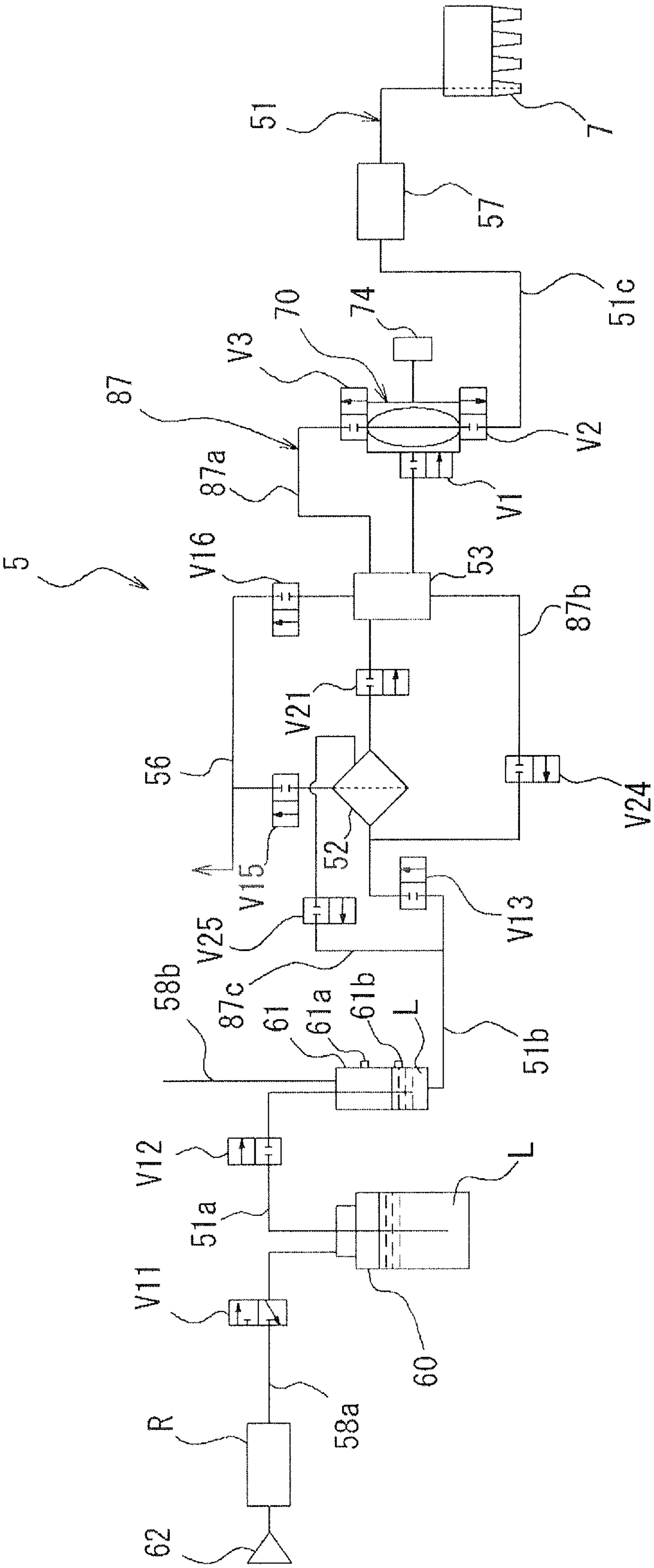
FIG. 23 is a schematic sectional view showing another modification example of the 1-3rd embodiment of the liquid processing apparatus according to the present invention.

In the modification example shown in FIG. 23, a return conduit 87 of the 1-3rd embodiment is composed of a first main return conduit 87*a* connecting the discharge side of the pump 70 and the trap tank 53, a second main return conduit 87*b* connecting the trap tank 53 and the second process-liquid supply conduit 51*b* on the primary side of the filter 52, and a sub return conduit 87*c* connecting the discharge side of the filter 52 and the second process-liquid supply conduit 51*b* on the primary side of the filter 52. Herein, the first main return conduit 87*a* and the second main return conduit 87*b* correspond to the main return conduit in the present invention. The second main return conduit 87*b* is provided with the electromagnetic on-off valve V24, and the sub return conduit 87*c* is provided with the electromagnetic on-off valve V25. These on-off valves V24 and V25 are configured to be controllable by a control signal from the control unit (not shown).

Figure 24:
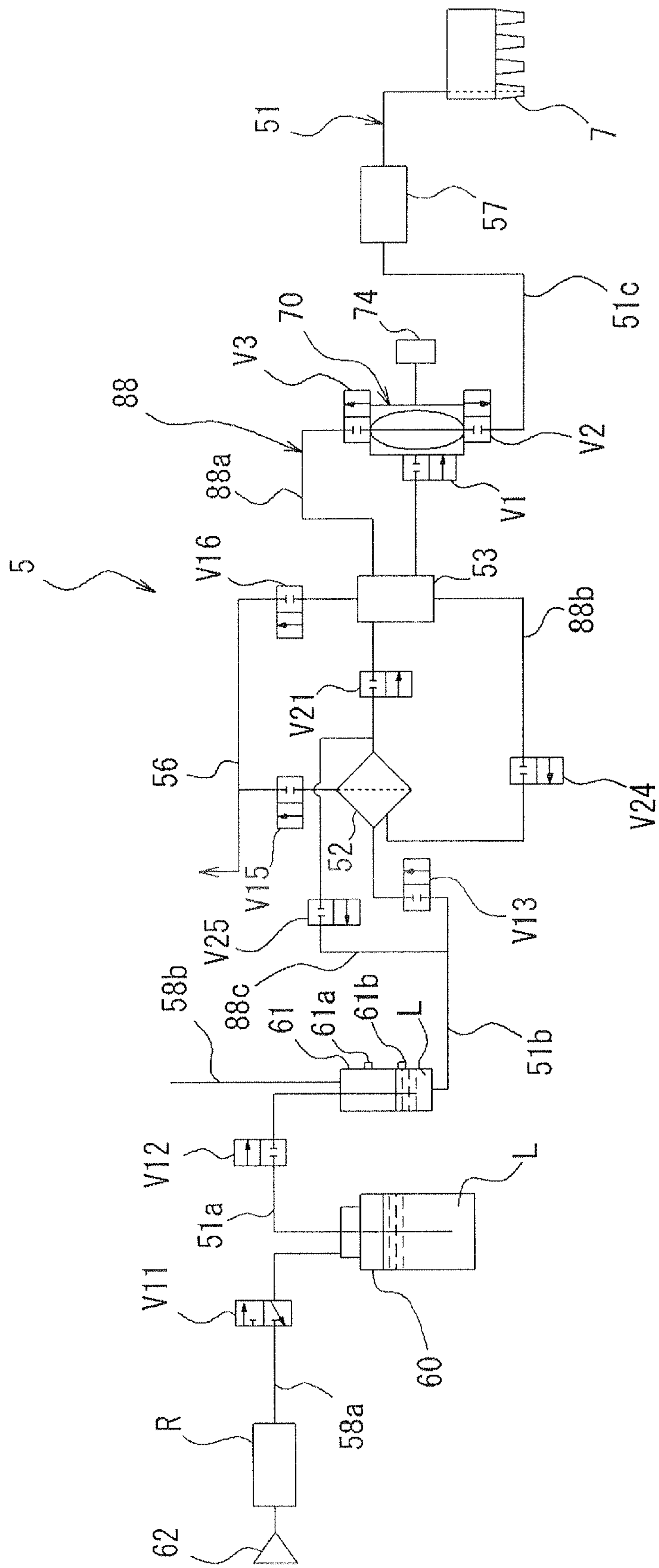
FIG. 24 is a schematic sectional view showing another modification example of the 1-3rd embodiment of the liquid processing apparatus according to the present invention.

In the modification example shown in FIG. 24, a return conduit 88 of the 1-3rd embodiment is composed of a first main return conduit 88*a* connecting the discharge side of the pump 70 and the trap tank 53, a second main return conduit 88*b* connecting the trap tank 53 and the suction side of the filter 52, and a sub return conduit 88*c* connecting the second process-liquid supply conduit 51*b* on the secondary side of the filter 52 and the second process-liquid supply conduit 51*b* on the primary side of the filter 52. Herein, the first main return conduit 88*a* and the second main return conduit 88*b* correspond to the main return conduit in the present invention. The second main return conduit 88*b* is provided with the electromagnetic on-off valve V24, and the sub return conduit 88*c* is provided with the electromagnetic on-off valve V25. These on-off valves V24 and V25 are configured to be controllable by a control signal from the control unit (not shown).

Figure 25:
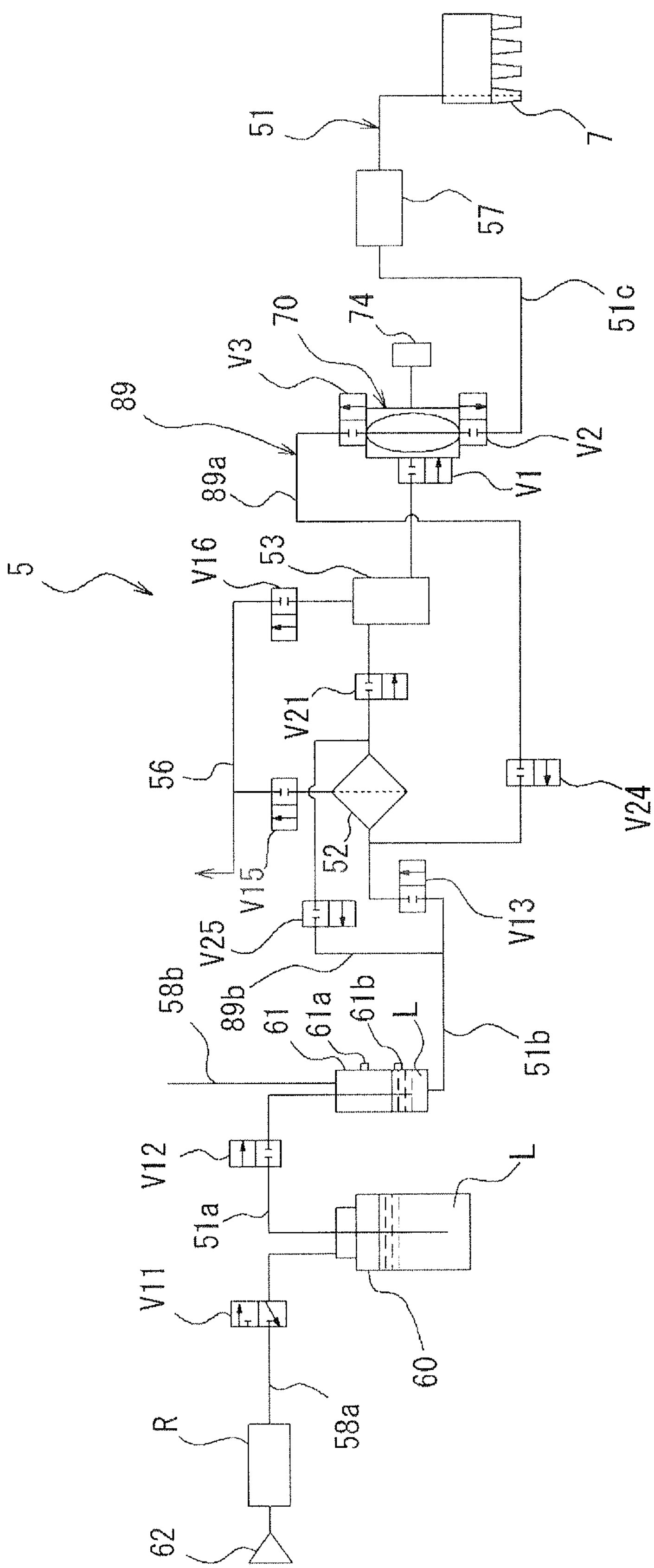
FIG. 25 is a schematic sectional view showing another modification example of the 1-3rd embodiment of the liquid processing apparatus according to the present invention.

In the modification example shown in FIG. 25, a return conduit 89 of the 1-3rd embodiment is composed of a main return conduit 89*a* connecting the discharge side of the pump 70 and the second process-liquid supply conduit 51*b* on the primary side of the filter 52, and a sub return conduit 89*b* connecting the second process-liquid supply conduit 51*b* on the secondary side of the filter 52 and the second process-liquid supply conduit 51*b* on the primary side of the filter 52. The return conduit 89*a* is provided with the electromagnetic on-off valve V24. The on-off valve V24 is configured to be controllable by a control signal from the not-shown control unit 101.

Operations of the modification examples of the 1-3rd embodiment shown in FIGS. 22 to 24 are the same as the operation in the step S1 of FIG. 12 (suction of the resist liquid L to the pump chamber 72 shown in FIG. 19) and the step S2 of FIG. 12 (discharge of the resist liquid L to a wafer W shown in FIG. 20), but differs therefrom in a step S3.

Namely, when the resist liquid L in the diaphragm pump 70 is returned to the second process-liquid supply conduit 51*b* through the return conduit 86, a part (e.g., four-fifths) of the resist liquid L sucked in the diaphragm pump 70 is caused to flow into the return conduit 86, by closing the on-off valve V2 while opening the on-off valves V24 and V25 and by driving the drive means 74. In addition, when the resist liquid L flowing into the diaphragm pump 70 is returned to the second process-liquid supply conduit 51*b* through the return conduit 87 or 88, a part (e.g., four-fifths) of the resist liquid L sucked in the diaphragm pump 70 is similarly caused to flow into the return conduit 87 or 88, by closing the on-off valve V2 while opening the on-off valves V24 and V25 and by driving the drive means 74.

Figure 20:
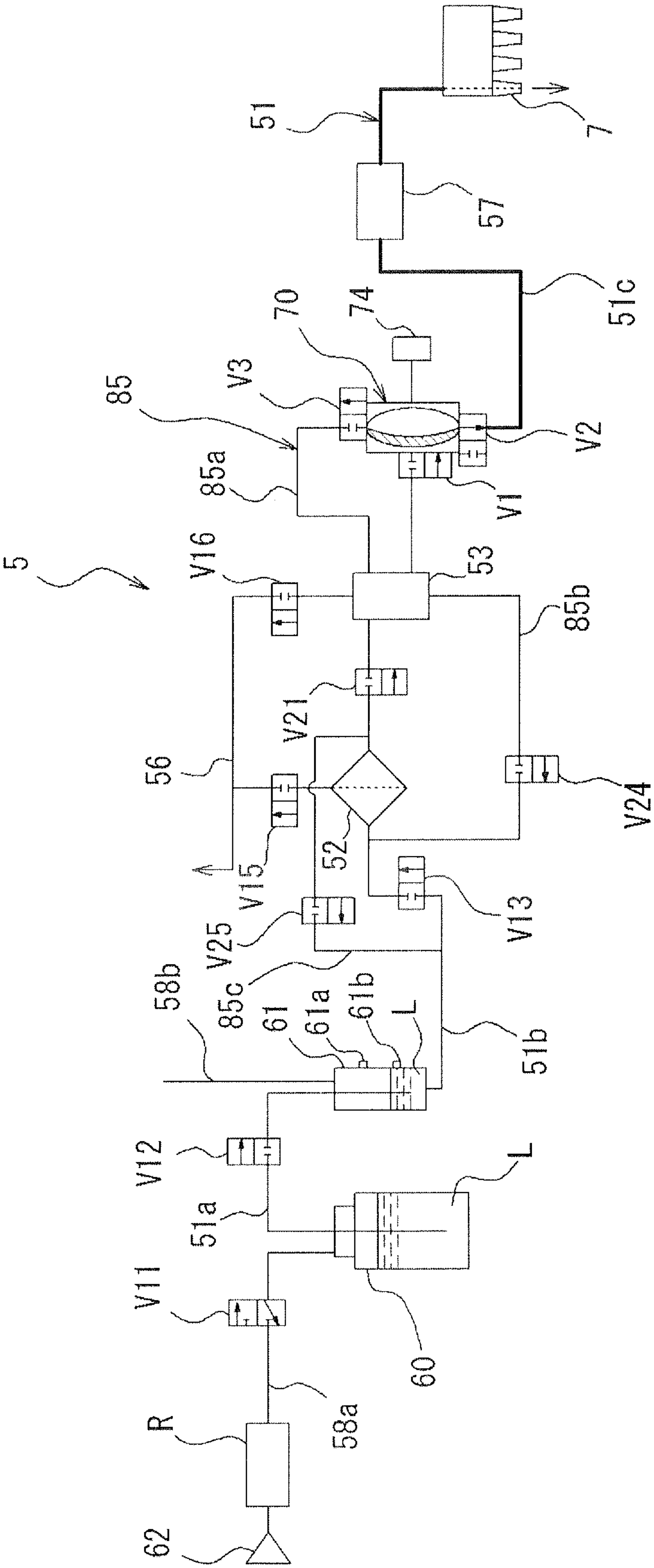
FIG. 20 is a schematic sectional view showing a process-liquid discharging operation in the liquid processing apparatus of the 1-3rd embodiment.

An operation of the modification example of the 1-3rd embodiment shown in FIG. 25 is the same as the operations performed in the steps S1 and S2 in the 1-3rd embodiment shown in FIGS. 19 and 20, but differs therefrom in the step S3 shown in FIG. 12 in that the resist liquid L flowing through the main return conduit 89*a* flows into the filter 52 without passing through the trap tank 53.

In the modification examples of the 1-3rd embodiment shown in FIGS. 22 to 24, the return conduits 86, 87 and 88 may not be equipped with the trap tank 53 as shown in FIG. 25.

Thus, similarly to the 1-1st and 1-2nd embodiments, in the modification examples of the 1-3rd embodiment, the filtration efficiency can be improved while keeping the similar throughput as a throughput obtained when the resist liquid is not filtrated by a filter or filtrated once. Thus, a filtration efficiency, which is similar to the filtration efficiency obtained when a plurality of filters are provided, can be obtained by one filter, and decrease in throughput can be prevented, without largely modifying the apparatus.

1-4th Embodiment

Figure 26:
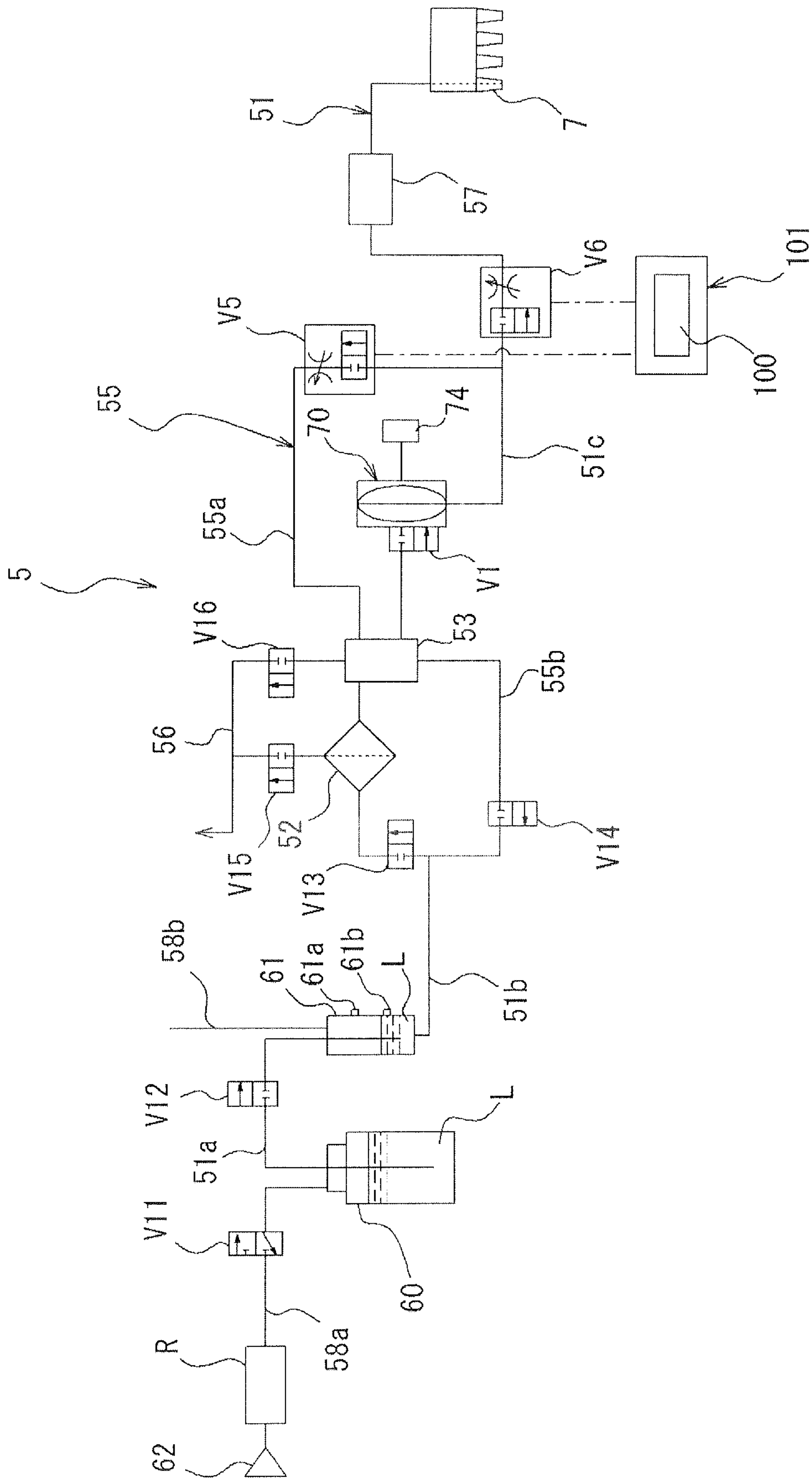
FIG. 26 is a schematic sectional view showing a 1-4th embodiment of the liquid processing apparatus according to the present invention.

A 1-4th embodiment of the liquid processing apparatus according to the present invention is described with reference to FIG. 26. In the 1-4th embodiment, as to the same structure as that of the 1-1st embodiment, the same part is indicated by the same reference number and description thereof is omitted.

In the 1-4th embodiment, a check valve (not shown) is provided instead of the on-off valve V2 disposed on the connection portion between the diaphragm pump 70 and the third process-liquid supply conduit 51*c*, and a flowrate regulating valve V6 is disposed in the third process-liquid supply conduit 51*c* on the secondary side of the connection portion between the third process-liquid supply conduit 51*c* and the return conduit 55. The flowrate regulating valve V6 is an on-off valve capable of regulating a flow rate of the resist liquid L to be discharged to the discharge nozzle 7.

In addition, instead of the on-off valve V3 disposed in the connection portion between the diaphragm pump 70 and the return conduit 55, a flowrate regulating valve V5 is disposed in the first return conduit 55*a* between the pump 70 and the trap tank 53. The flowrate regulating valve V5 is an on-off valve capable of regulating a flow rate of the resist liquid L returning to the second process-liquid supply conduit 51*b*. The flowrate regulating valves V5 and V6 are controlled by the control unit 101.

The return conduit 55 of the 1-4th embodiment is composed of a first return conduit 55*a* connecting the third process-liquid supply conduit 51*c* and the trap tank 53, and a second return conduit 55*b* connecting the trap tank 53 and the second process-liquid supply conduit 51*b* on the primary side of the filter 52.

An operation of the 1-4th embodiment is the same as the step S1 in FIG. 12 showing the operation performed in the 1-1st embodiment (suction of the resist liquid L to the pump chamber 72), but is different in the step S2 (discharge of the resist liquid L to a wafer W) and the step S3 (return of the resist liquid L to the return conduit 55). When the resist liquid L in the diaphragm pump 70 is discharged to a wafer W through the discharge nozzle 7, a part (e.g., one-fifth) of the resist liquid L sucked in the diaphragm pump 70 is discharged by closing the on-off valve V1 and the flowrate regulating valve V5 while opening the flowrate regulating valve V6 and by driving the driving means 74. At this time, a flow rate of the resist liquid L flowing through the third process-liquid supply conduit 51*c* is regulated by the flow-rate regulating valve V4.

Then, when the resist liquid L in the diaphragm pump 70 is returned to the second process-liquid supply conduit 51*b* through the return conduit 55, a part (e.g., four-fifths) of the resist liquid L sucked in the diaphragm pump 70 is caused to flow into the return conduit 55 by closing the flowrate regulating valve V6 while opening the flowrate regulating valve V5 and by driving the drive means 74. At this time, a flow rate of the resist liquid L returning to the second process-liquid supply conduit 51*b* is regulated by the flow-rate regulating valve V5.

Thus, similarly to the 1-1st to 1-3rd embodiments, the filtration efficiency can be improved while keeping the similar throughput as a throughput obtained when the resist liquid is not filtrated by a filter or filtrated once. Thus, a filtration efficiency, which is similar to the filtration efficiency obtained when a plurality of filters are provided, can be obtained by one filter, and decrease in throughput can be prevented, without largely modifying the apparatus.

In the 1-4th embodiment, there are used the trap tank 53, the filter 52 and the on-off valves V13 to V16, which are provided in the second process-liquid supply conduit 51*b* and the drain conduit 56 and are of the same structures as those of the 1-1st embodiment. However, there may be used the second process-liquid supply conduit 51*b*, the drain conduit 56, the trap tank 53, the filter 52 and the on-off valves V13 to V16 which are of the same structures as those of the 1-2nd embodiment and the 1-3rd embodiment. Also by this structure, a filtration efficiency, which is similar to the filtration efficiency obtained when a plurality of filters are provided, can be obtained by one filter, and decrease in throughput can be prevented, without largely modifying the apparatus.

Second Embodiment

Herebelow, a second embodiment of the present invention is described with reference to FIGS. 27 to 40. Herein, there is described an example in which the liquid processing apparatus (resist liquid processing apparatus) according to the present invention is applied to a coating and developing apparatus. In the second embodiment, the same part as those of the first embodiment shown in FIGS. 1 to 27 is indicated by the same reference number and description thereof is omitted.

A 2-1st embodiment of the liquid processing apparatus according to present invention is described.

2-1st Embodiment

Figure 27:
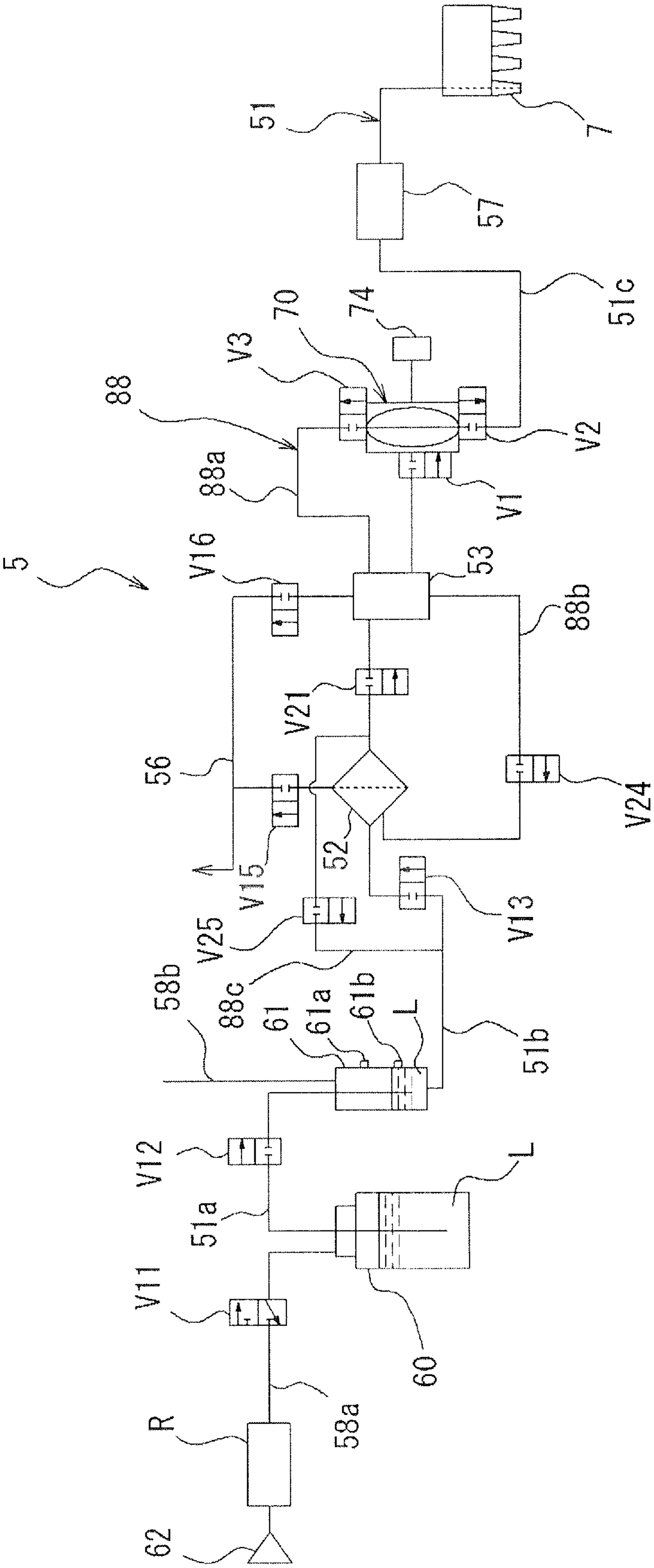
FIG. 27 is a schematic sectional view showing a 2-1st embodiment of the liquid processing apparatus according to the present invention.
Figure 28:
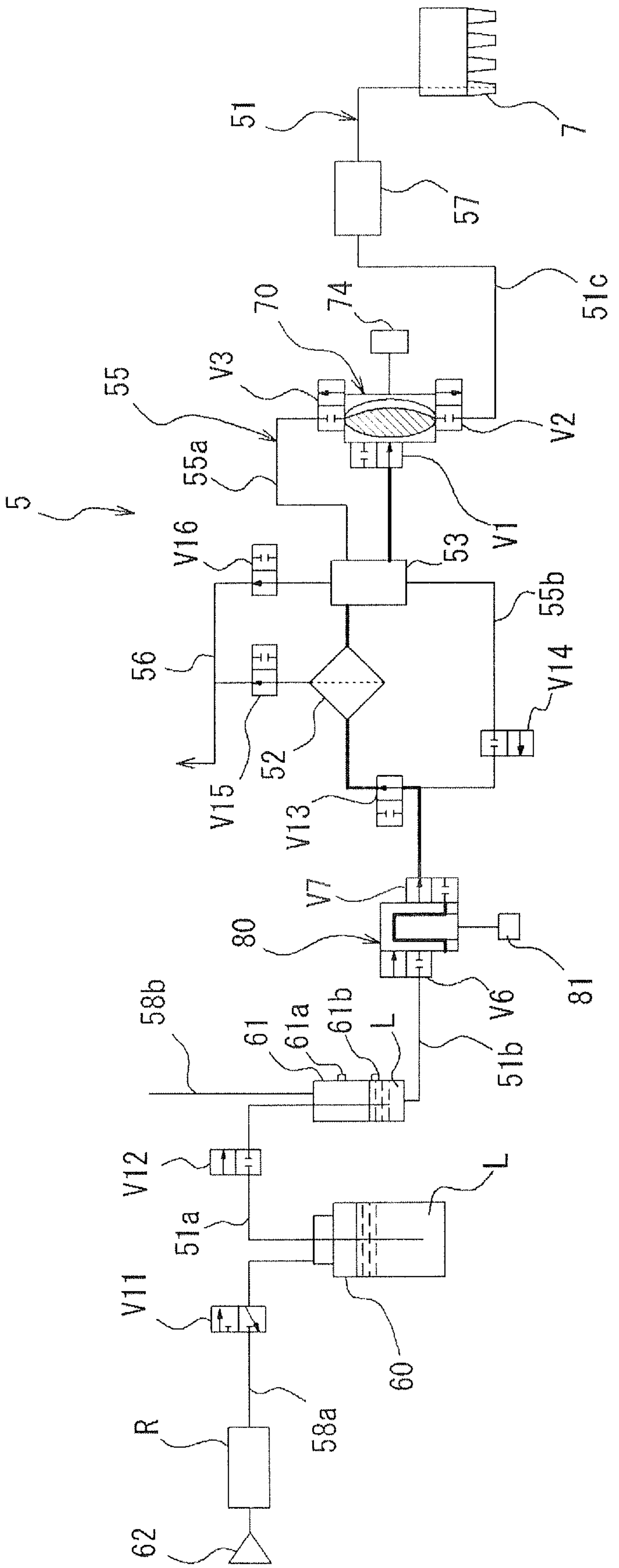
FIG. 28 is a schematic sectional view showing a pump sucking operation in the liquid processing apparatus of the 2-1st embodiment.
Figure 29:
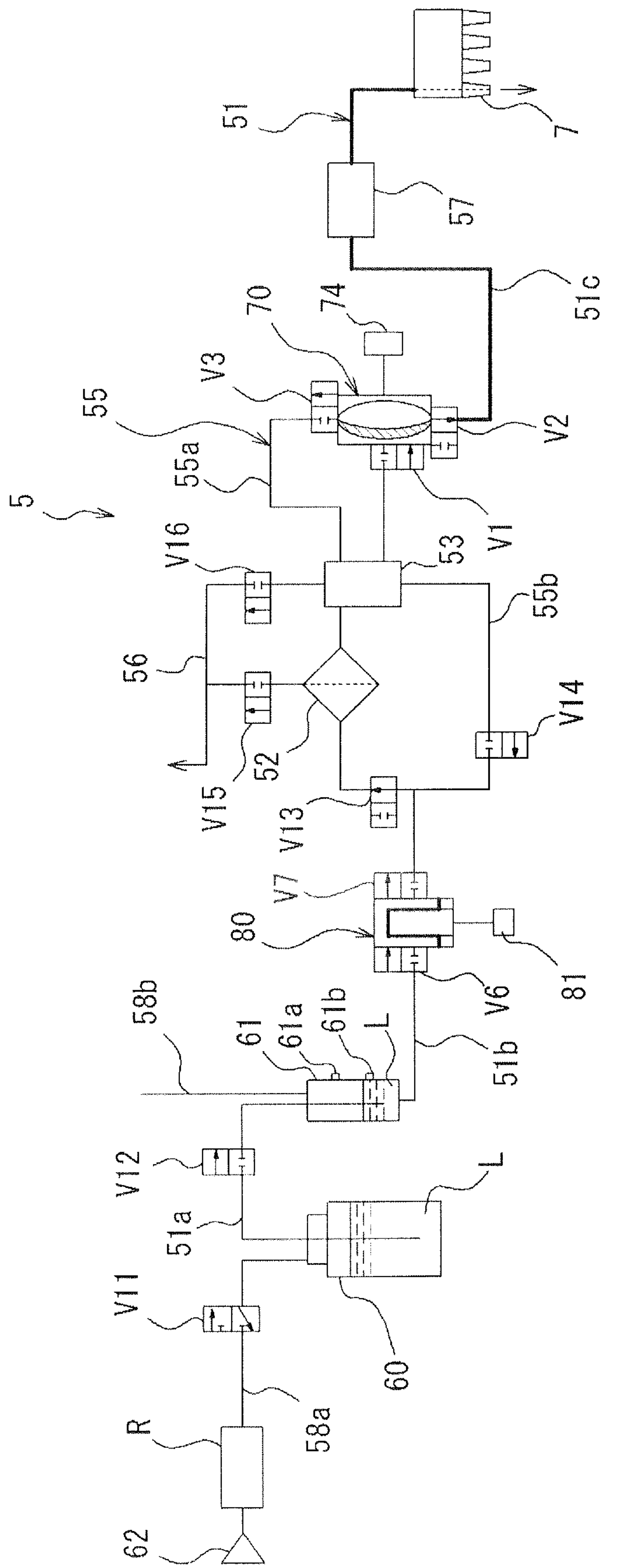
FIG. 29 is a schematic sectional view showing a process-liquid discharging operation in the liquid processing apparatus of the 2-1st embodiment.

As shown in FIG. 27, the liquid processing apparatus 5 according to the present invention includes: a process liquid container 60 configured to contain a resist liquid L as a process liquid; a discharge nozzle 7 configured to discharge (supply) the resist liquid L to a wafer as a substrate to be processed; a supply conduit 51 connecting the process liquid container 60 and the discharge nozzle 7; a filter 52 disposed in the supply conduit 51 and configured to filtrate the resist liquid L; a pump 70 disposed in the supply conduit 51 on a secondary side of the filter 52; a return conduit 55 connecting a discharge side of the pump 70 and a primary side of the filter 52; a feed pump 80 disposed in the supply conduit 51 connecting the process liquid container 60 and the filter 52; a suction on-off valve V6 disposed on a suction side of the feed pump 80; a discharge on/off valve V7 disposed on a discharge side of the feed pump 80; first to third on-off valves V1 to V3 which are disposed on a connection portion between the pump 70 and the filter 52, a connection portion between the pump 70 and the discharge nozzle 7, and a connection portion between the pump 70 and the return conduit 55, respectively; and a control unit 101 configured to control the pump 70, the first to third on-off valves V1 to V3, the feed pump 80, the suction on-off valve V6, the discharge on-off valve V7.

Herein, the return conduit 55 connecting the discharge side of the pump 70 and the primary side of the filter 52 corresponds to the first return conduit 55*a* connecting the pump 70 and the trap tank 53, and the second return conduit 55*b* connecting the trap tank 53 and the second process-liquid supply conduit 51*b* on the primary side of the filter 52, in the first embodiment.

The supply conduit 51 is composed of a first process-liquid supply conduit 51*a* connecting the process liquid container 60 and a buffer tank 61 for temporarily storing resist liquid L guided from the process liquid container 60, a second process-liquid supply conduit 51*b* connecting the buffer tank 61 and the pump 70, and a third process-liquid supply conduit 51*c* connecting the pump 70 and the discharge nozzle 7. The feed pump 80 and the filter 52 are disposed in the second process-liquid supply conduit 51*b*, and the trap tank 53 is disposed on the second process-liquid supply conduit 51*b* on the secondary side of the filter 52. Further, a supply control valve 57 configured to control supply of the resist liquid L discharged from the discharge nozzle 7 is disposed in the third process-liquid supply conduit 51*c*. A drain conduit 56 through which bubbles generated in the resist liquid L are discharged is connected to the filter 52 and the trap tank 53.

An electromagnetic on-off valve V11 is disposed between an electro-pneumatic regulator R of a first gas supply conduit 58*a* and the process liquid container 60. The first process-liquid supply conduit 51*a* is equipped with an electromagnetic on-off valve V12. In addition, an electromagnetic on-off valve V13 is disposed between the buffer tank 61 of the second process liquid supply conduit 51*b* and the filter 52. The second return conduit 55*b* is equipped with an electromagnetic on-off valve V14. The drain conduit 56 is equipped with electromagnetic on-off valves V15 and V16. The on-off valves V11 to V16 and the electro-pneumatic regulator R are controlled by a control signal from the control unit 101.

On the other hand, the feed pump 80 is formed of a rolling edge diaphragm pump that is a variable displacement pump. The feed pump 80 is driven by a stepping motor 81 as a drive means. A suction side of the feed pump 80, i.e., a suction channel (not shown) communicated with the buffer tank 61 is provided with an electromagnetic suction on-off valve V6, and a discharge side thereof, i.e., a discharge channel (not shown) communicated with the filter 52 is provided with an electromagnetic discharge on-off valve V7.

According to the feed pump 80 as structured above, a discharge amount of the resist liquid L can be controlled, as well as the resist liquid L can be controlled at the same speed from the suction thereof up to the discharge thereof. Therefore, mixture of bubbles can be prevented.

The control unit 101 is incorporated in a control computer 100 that is a storage medium. The control computer 100 includes, in addition to the control unit 101, a control-program storage unit 102 storing a control program, a reading unit 103 configured to read data from outside, and a storage unit 104 storing data. In addition, the control computer 100 includes an input unit 105 connected to the control unit 101, a monitor unit 106 configured to display various conditions of the liquid processing apparatus 5, and a computer-readable storage medium 107 mounted on the reading unit 103 and storing a software that causes the control computer 100 to execute the control program. Based on the control program, the control computer 100 is configured to output control signals to the respective units.

The control-program storage unit 102 stores a control program by means of which the resist liquid L is sucked into the pump 70, the resist liquid L is discharged from the pump 70 to the discharge nozzle 7, the resist liquid L is supplied from the pump 70 to the second process-liquid supply conduit 51*b* on the primary side of the filter 52 through the return conduit 55, the resist liquid L replenished by the feed pump 80 from the buffer tank 61 and the resist liquid L returning through the return conduit 55 are synthesized, and the synthesized resist liquid L is filtrated by the filter 52 the number of times corresponding to a rate between a discharge amount of the resist liquid L to the discharge nozzle 7 and a return amount of the resist liquid L returning from the pump 70 to the second process-liquid supply conduit 51*b* through the conduit 55.

In addition, the control-program storage unit 102 stores a control program by means of which there is performed a degassing step for discharging bubbles in the resist liquid L from the filter 52 by opening the drain valve V15, when the filtration by the filter 52 is performed.

The control program is stored in the storage medium 107 such as a hard disc, a compact disc, a flush memory, a flexible disc or a memory card. The control program is used by installing the control program in the control computer 100 from the storage medium 107.

Next, an operation of the liquid processing apparatus 5 in this embodiment is described with reference to FIGS. 28 to 30 and 32 to 35. At first, based on a control signal from the control unit 101, the on-off valve V11 disposed in the first gas supply conduit 58*a* and the on-off valve V12 disposed in the first process-liquid supply conduit 51*a* are opened. The resist liquid L is supplied into the buffer tank 61 due to the pressurization by the $N_2$ gas supplied from the $N_2$ gas supply source 62 into the process-liquid container 60.

When a predetermined amount of resist liquid L has been supplied (replenished) into the buffer tank 61, the on-off valves V11 and V12 are closed based on a control signal from the control unit 101 which has received a detection signal from the upper-limit liquid level sensor 61*a*. At this time, the on-off valve V1 is open and the on-off valves V2 and V3 are close. The supply and exhaust switching valve V4 is switched to the exhaust side, and a pressure in the operation chamber 73 of the diaphragm pump 70 is detected by the pressure sensor 79 in this condition. A detection signal of the detected pressure is transmitted (inputted) to the control unit 101. After the supply and exhaust switching valve V4 has been switched to the exhaust side, the on-off valve V13 is opened.

Then, the electro-pneumatic regulator 78 is communicated with the decompression source 75*b*, so that air in the operation chamber 73 is exhausted. At this time, an exhausted-air flow rate is detected by the flowmeter 77, and a detection signal of the detected exhausted-air flow rate is transmitted (inputted) to the control unit 101. Since the air in the operation chamber 73 is exhausted, a predetermined amount of the resist liquid L is sucked into the pump chamber 72 from the second process-liquid supply conduit 51*b* (step S1). At this time, since the resist liquid L passes through the filter, the number of filtration of the resist liquid L is one.

Then, the on-off valves V1 and V3 are closed, while the on-off valve V2 and the supply control valve 57 are opened. At this time, the supply and exhaust switching valve V4 is switched to the suction side and the electro-pneumatic regulator 78 is communicated with the pressurization side, so that air is supplied into the operation chamber 73. Thus, a part of the resist liquid L (e.g., one-fifth), which has been sucked into the pump chamber 72, is discharged to the wafer through the discharge nozzle 7 (step S2).

In this case, an amount of the resist liquid L sucked in the pump chamber 72 is regulated by a supply amount of air supplied to the operation chamber 73. Namely, when air of a smaller amount is supplied to the operation chamber 73, a volume of the operation chamber 73 does not increase so much, whereby a discharge amount of the resist liquid L discharged to the wafer is smaller. On the other hand, when air of a larger amount is supplied to the operation chamber 73, the volume of the operation chamber 73 increases, whereby a discharge amount of the resist liquid L discharged to the wafer W is larger. In this embodiment, one-fifth of the resist liquid L sucked in the pump chamber 72 is discharged to the wafer. A supply amount of air to be supplied to the operation chamber 73 is determined based on the data stored in the storage unit 104.

As a method of regulating an amount of the resist liquid L sucked into the pump chamber 72, an air supply period of time may be regulated, instead of regulating a supply amount of air supplied into the operation chamber 73. Alternatively, the supply of air into the operation chamber 73 may be regulated by a pulse signal transmitted from the control unit 101.

Then, the on-off valves V1 and V2 are closed while the on-off valves V3 and V14 are opened, so that a supply amount of air to the operation chamber 73 is increased. Thus, the remaining resist liquid L (e.g., four-fifths) sucked in the pump chamber 72 is returned to the second process-liquid supply conduit 51*b* through the return conduits 55*a* and 55*b* (step S3). In this embodiment, four-fifths of the resist liquid L, which has been sucked into the pump chamber 72 in the step S1, is returned to the second process-liquid supply conduit 51*b*.

Then, the third on-off valve V3 is closed while the discharge on-off valve V7 of the feed pump 80 is opened to drive the feed pump 80, and the first on-off valve V1 and the on-off valve V13 are opened. Thus, the resist liquid L returned to the second process-liquid supply conduit 51*b* and the resist liquid sucked into the feed pump 80 are synthesized, whereby the process returns to the step S1. Under this condition, the synthesized resist liquid L is sucked into the pump chamber 72. At this time, the amount of the resist liquid supplied from the buffer tank 61 to the pump chamber 72 is equal to the discharge amount of the resist liquid L to the wafer. Thus, in this embodiment, the resist liquid L an amount of which is equal to one-fifth of the resist liquid L sucked in the pump chamber 72 is replenished from the buffer tank 61 to the second process-liquid supply conduit 51*b*, by driving the feed pump 80.

When the synthesized resist liquid L is filtrated by the filter 52, the drain valve V15 is opened to discharge bubbles present in the resist liquid L from the filter 52 through the drain conduit 56.

The resist liquid L returned to the second process-liquid supply conduit 51*b* through the return conduit 55 has been filtrated by the filter 52, while the resist liquid L supplied from the buffer tank 61 is not filtrated by the filter 52. Thus, when the number of filtration of the resist liquid L which is formed by synthesizing the resist liquid L returned to the second process-liquid supply conduit 51*b* through the return conduit 55 and the resist liquid L replenished from the buffer tank 61 is calculated as the number of synthesis filtration of the resist liquid L, a relationship between the number of synthesis filtration of the resist liquid L, a discharge amount of the resist liquid L sucked in the pump 70 to a wafer W, and a return amount of the resist liquid L sucked in the pump 70 to the second process-liquid supply conduit 51*b* is shown by the following expression (1).

$$An=(a+b)/a-b/a\times\{b/(a+b)\}^{n-1} \quad (1)$$

In the expression (1), An represents the number of synthesis filtration. The number of synthesis filtration represented in the expression (1) is referred to as the number of circulation synthesis filtration. In addition, a and b represent rates of a discharge amount of the resist liquid L to a wafer and a return amount of the resist liquid L to the return conduit 55, and n represents the number (the number of processes) at which the resist liquid L is passed through the filter 52. The number of synthesis filtration An of the resist liquid L corresponds to the number of times corresponding to a synthesis of a rate between a discharge amount and a return amount of the present invention. In the above expression (1), by increasing the number of processes n, the number of synthesis filtration An is saturated with a value of (a+b)/a. FIG. 13 show a relationship between An, n, a and b.

As shown in FIG. 13, when a=1 and b=4, as the number of processes n increases, the number of synthesis filtration An comes close to and converges 5. Similarly, when a=1 and b=2, the number of synthesis filtration An comes close to and converges 3. When a=1 and b=1, the number of synthesis filtration comes close to and converges 2. When a=2 and b=1, the number of synthesis filtration An comes close to and converges 1.5. When a=5 and b=1, the number of synthesis filtration An comes close to and converges 1.2.

Figure 34:
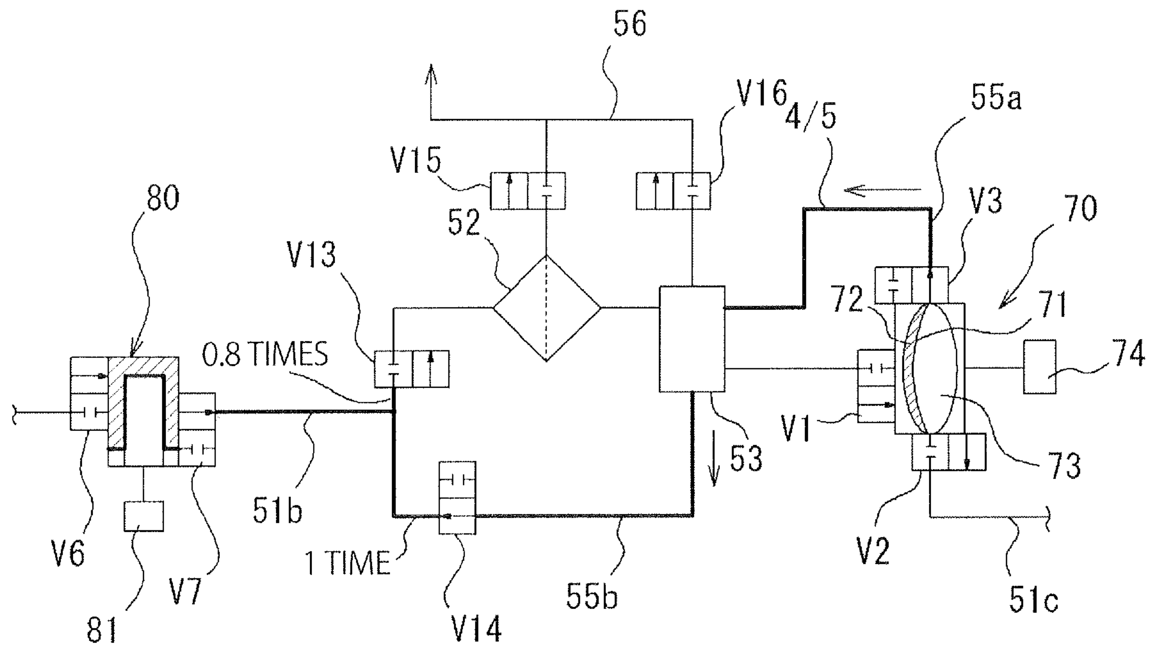
FIG. 34 is a schematic sectional view showing a circulation amount upon the process-liquid circulating operation and the number of synthesis filtration in the liquid processing apparatus of the 2-1st embodiment.
Figure 35:
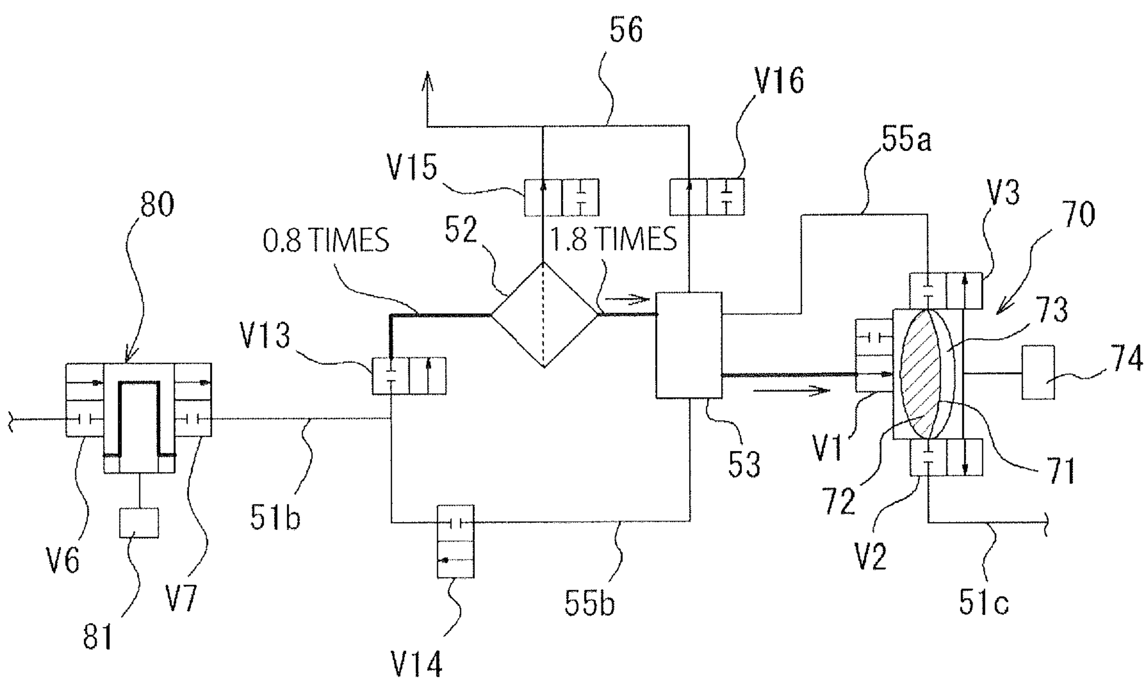
FIG. 35 is a schematic sectional view showing the number of synthesis filtration upon a second pump sucking operation in the liquid processing apparatus in the 2-1st embodiment.
Figure 36:
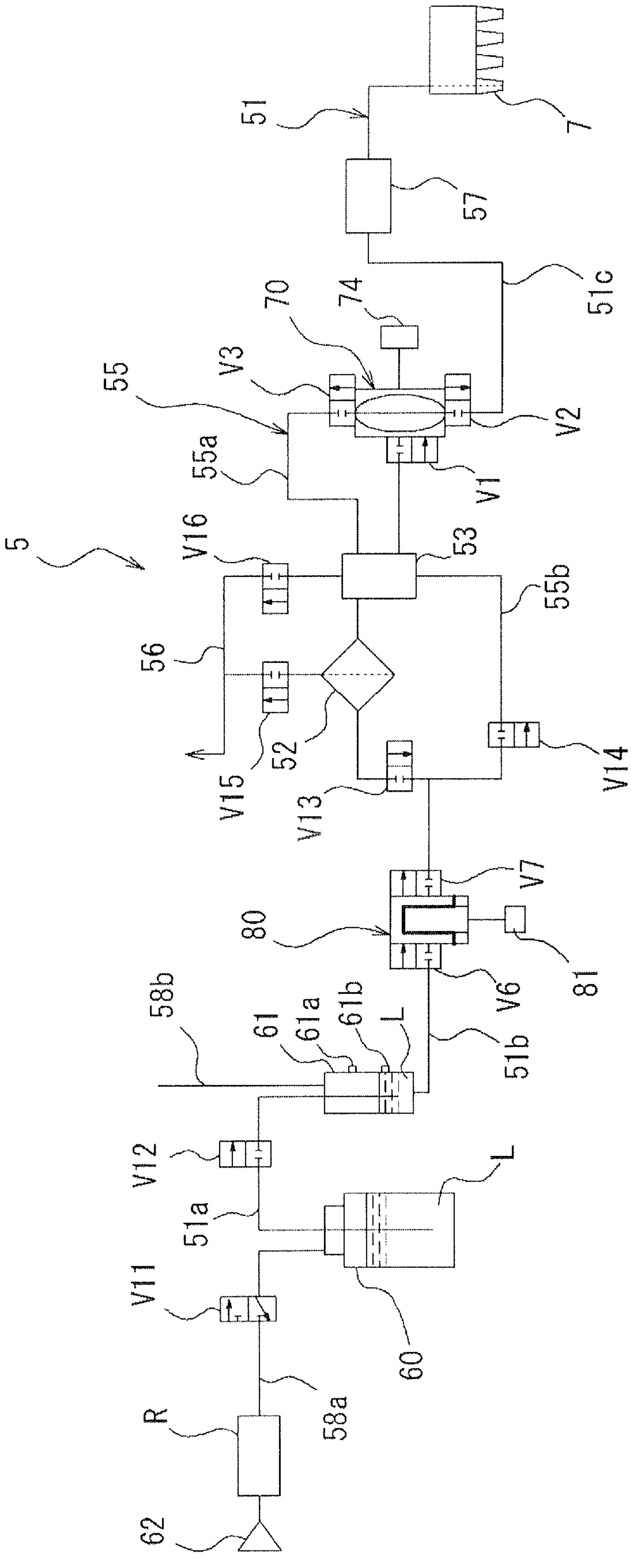
FIG. 36 is a schematic sectional view showing a 2-2nd embodiment of the liquid processing apparatus according to the present invention.
Figure 37:
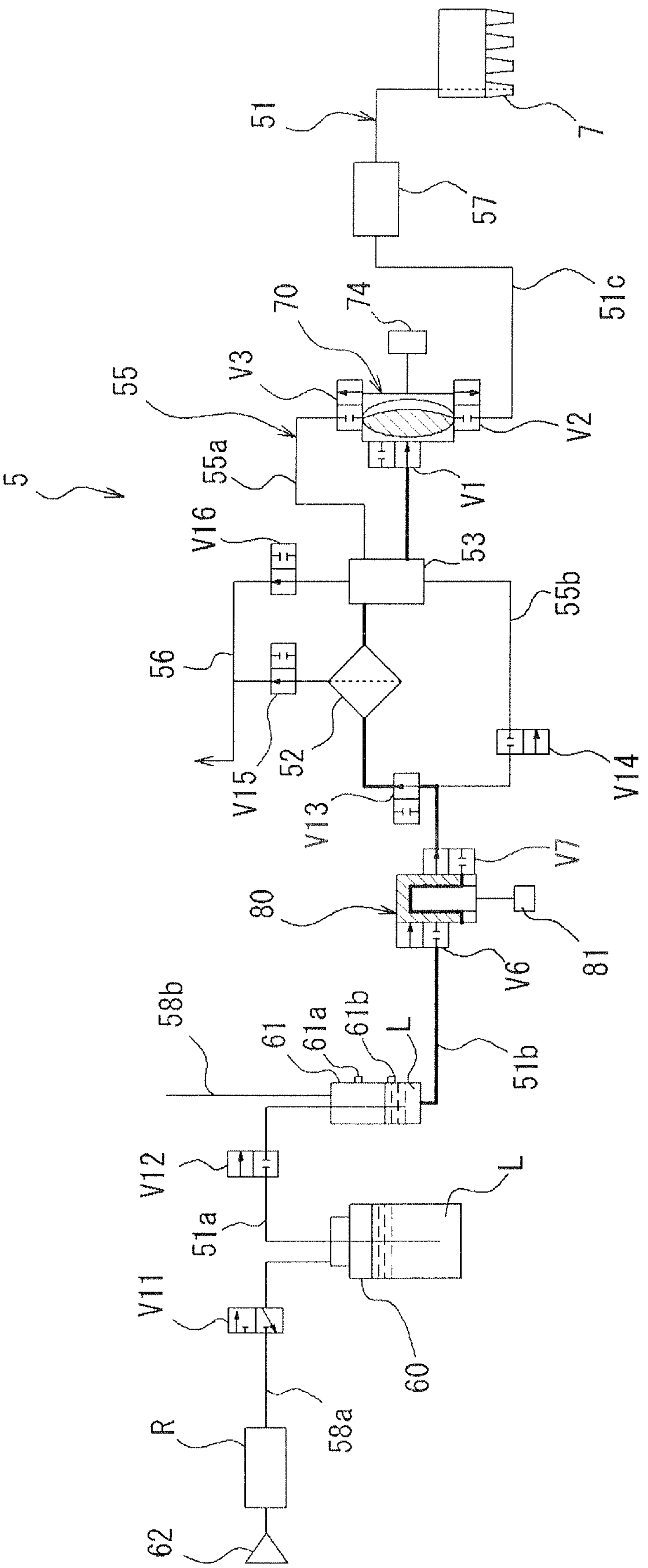
FIG. 37 is a schematic sectional view showing a pump sucking operation in the liquid processing apparatus of the 2-2nd embodiment.
Figure 38:
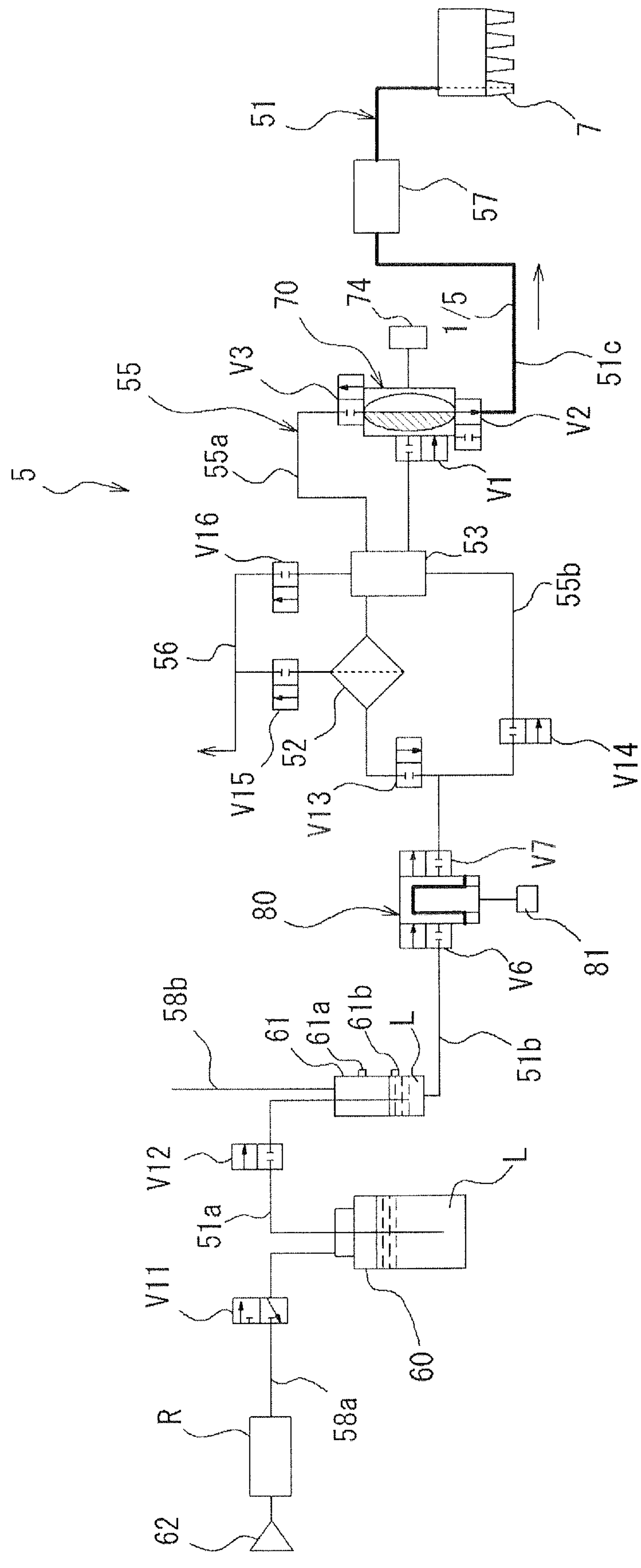
FIG. 38 is a schematic sectional view showing a process-liquid discharging operation in the liquid processing apparatus of the 2-2nd embodiment.

In this embodiment, a rate between an amount of the resist liquid L returned to the second process-liquid supply conduit 51*b* through the return conduit 55 and an amount of the resist liquid L supplied from the buffer tank 61 is 4:1, the number of filtration of the resist liquid L returned to the second process-liquid supply conduit 51*b* through the return conduit 55 is one, and the number of filtration of the resist liquid L supplied from the buffer tank 61 is zero. In this case, as shown in FIGS. 34 and 35, the number of synthesis filtration of the resist liquid L supplied to the second process-liquid supply conduit 51*b* on the primary side of the filter 52 is 0.8. By passing the resist liquid L through the filter 52, the number of synthesis filtration of the resist liquid L is 1.8.

By repeating the steps S1 to S3, the step of sucking the resist liquid L into the pump 70, the step of discharging a part (one-fifth) of the process liquid L sucked into the pump 70 to a wafer and returning the remaining part (four-fifths) of the resist liquid L sucked in the pump 70 to the second supply conduit 51*b*, and a step of replenishing the resist liquid L from the buffer tank 61 are repeated. For example, suppose that a rate between a discharge amount of the resist liquid L to a wafer and a return amount of the resist liquid L to the second process-liquid supply conduit 51*b* is 1:4 (a=1, b=4). In this case, when the steps S1 to S3 are repeated five times (n=5), the number of synthesis filtration A5 is 3.36, based on the calculation of the above expression (1).

Next, an effect of the second embodiment is described with reference to Table 1. Table 1 shows a time (cycle time) required for the steps S1 to S3 relative to the number of synthesis filtration An of the circulation synthesis filtration and a reciprocation synthesis filtration described below, and the standardized number of particles. The standardized number of particles herein means a rate of the number of particles when the resist liquid L, which has been subjected the circulation synthesis filtration or the reciprocation synthesis filtration, is discharged to a wafer, relative to the number of particles when the resist liquid L, which has not been filtrated, is discharged to a wafer W or when the resist liquid, which has been filtrated once, is discharged to a wafer W.

TABLE 1

| | Number of times of Synthesis Filtration | Discharge Amount (ml) | Return Amount (ml) | Cycle Time (s) | Standardized Number of Particles | Standardized Number of Particles relative to One Filtration |
|---|---|---|---|---|---|---|
| Filtration 0 times | 0 | 0.5 | 0 | | 100 | |
| Filtration once | 1 | 0.5 | 0 | 25.5 | 22 | 100 |
| Circulation | 5 | 0.5 | 2.0 | 24.9 | 17 | 77 |
| Synthesis | 10 | 0.5 | 4.5 | 35.9 | 7 | 32 |
| Circulation | 5 | 0.5 | 1.0 | 20.5 | 18 | 82 |
| Reciprocation Synthesis | 10 | 0.5 | 2.3 | 26.0 | 8 | 36 |

In the circulation synthesis filtration method where the number of synthesis filtration An was 5, the cycle time was 24.9 seconds, the standardized number of particles was 17, and the standardized number of particles relative to one filtration was 77. Thus, in the circulation synthesis filtration method where the number of synthesis filtration An was 5, it was possible to achieve the cycle time which was substantially the same as the cycle time when the filtration was performed once. The number of particles could be reduced to 17% as compared with the not-filtrated resist liquid L, and the number of particles could be reduced to 77% as compared with the once-filtrated resist liquid L.

In addition, in the circulation synthesis filtration method where the number of synthesis filtration An was 10, the cycle time was 35.9 seconds, the standardized number of particles was 7, and the standardized number of particles relative to one filtration was 32. Thus, in the circulation synthesis filtration method where the number of synthesis filtration An was 10, the number of particles could be reduced to 7% as compared with the not-filtrated resist liquid L, and the number of particles could be reduced 32% as compared with the once-filtrated resist liquid L. In addition, the number of particles could be reduced to 41% as compared with the circulation synthesis filtration method where the number of synthesis filtration An was 5.

Namely, the filtration efficiency can be improved while keeping the similar throughput as a throughput obtained when the filtration by a filter is performed once. Thus, a filtration efficiency, which is similar to the filtration efficiency obtained when a plurality of filters are provided, can be obtained by one filter, and decrease in throughput can be prevented, without largely modifying the apparatus.

Figure 30:
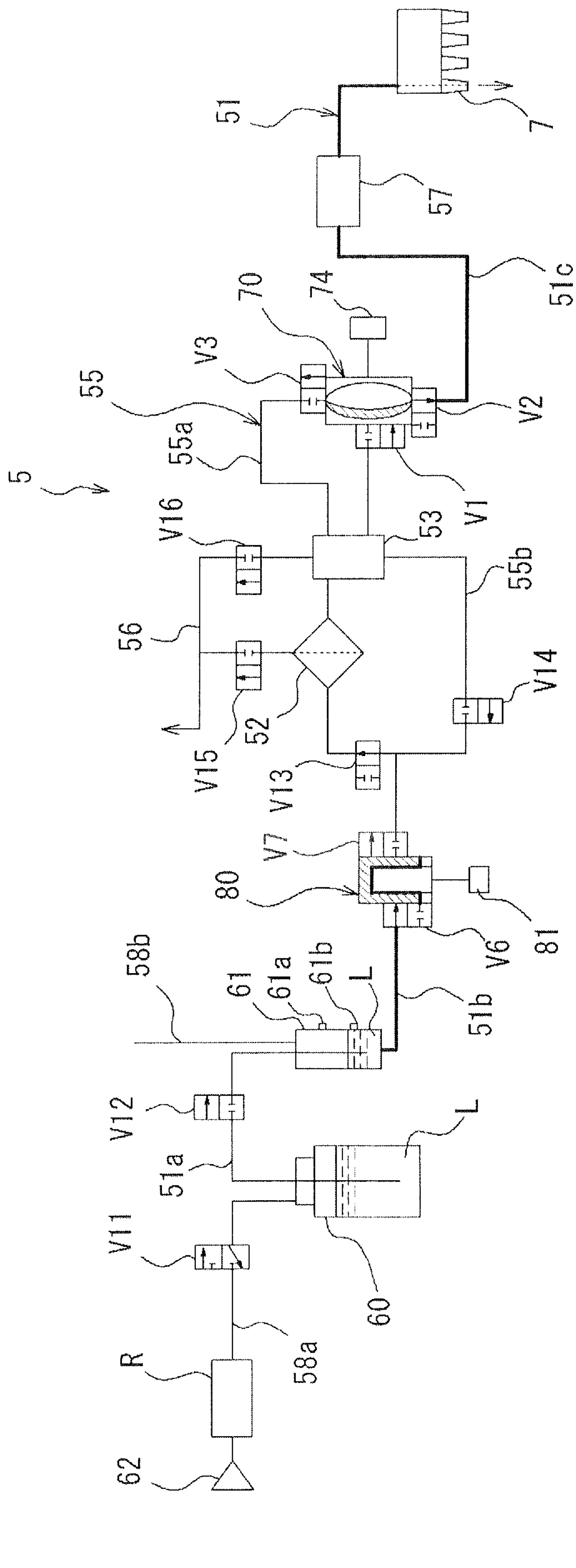
FIG. 30 is a schematic sectional view showing a process-liquid discharging operation and a process-liquid sucking operation to a feed pump in the liquid processing apparatus of the 2-1st embodiment.
Figure 31:
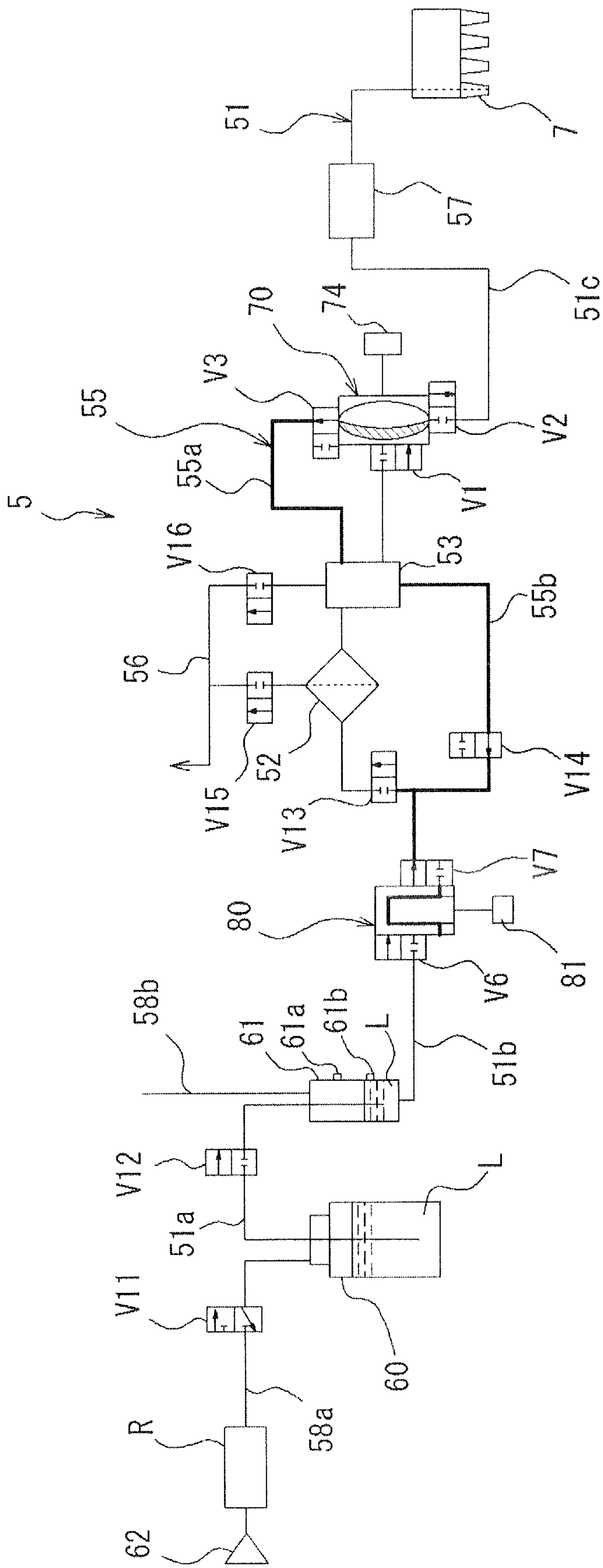
FIG. 31 is a schematic sectional view showing a process-liquid circulating operation in the liquid processing apparatus of the 2-1st embodiment.
Figure 32:
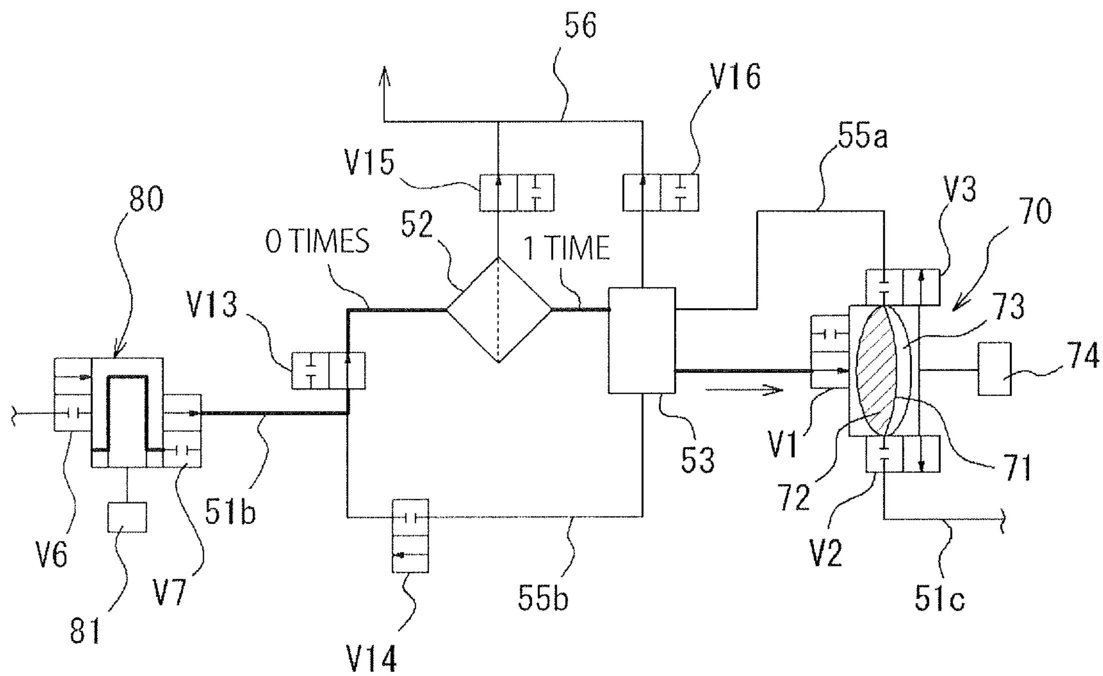
FIG. 32 is a schematic sectional view showing the number of synthesis filtration upon a first pump sucking operation in the liquid processing apparatus of the 2-1st embodiment.
Figure 33:
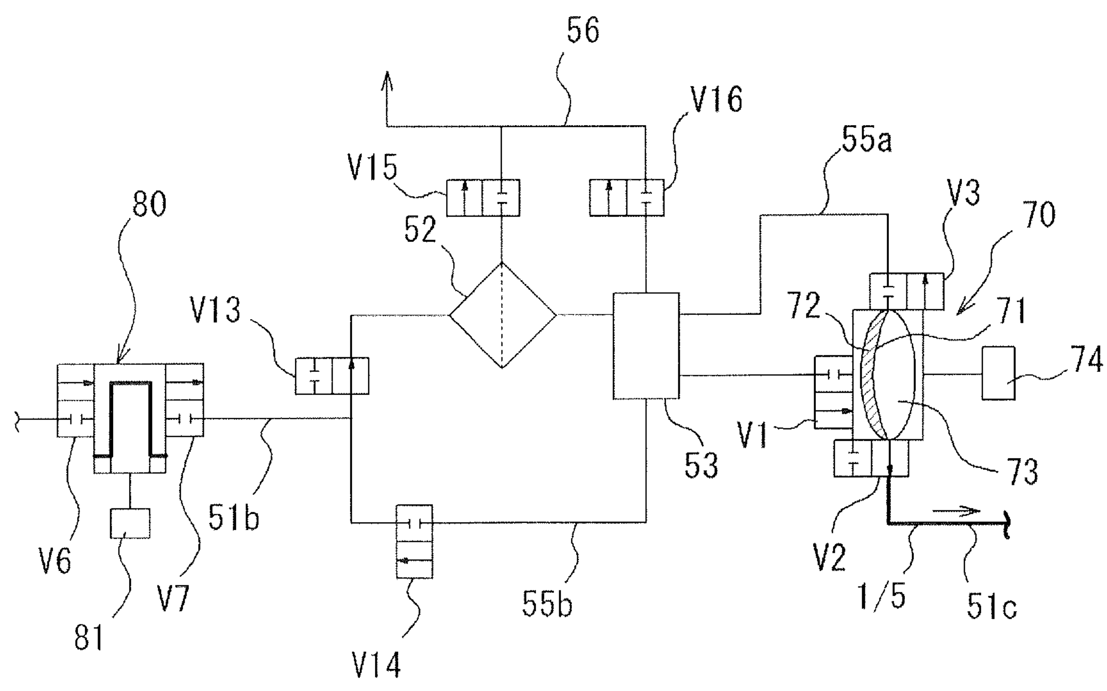
FIG. 33 is a schematic sectional view showing a discharge amount upon the process-liquid discharging operation in the liquid processing apparatus in the 2-1st embodiment.

In this embodiment, under conditions that a part of the resist liquid L sucked in the pump chamber 72 is discharged to a wafer W through the discharge nozzle 7, the resist liquid L is not sucked into the feed pump 80 from the buffer tank 61. However, as shown in FIG. 30, the step of discharging the resist liquid L from the discharge nozzle 7 and the step of sucking the resist liquid L into the feed pump 80 may be simultaneously performed, such that the replenishment amount of the resist liquid L to the feed pump 80 is larger than the discharge amount therefrom. Thus, while the resist liquid L is discharged from the discharge nozzle 7, the resist liquid L is sucked into the feed pump 80 such that the replenishment amount of the resist liquid L is larger than the discharge amount, a throughput can be improved.

2-2nd Embodiment

Next, a 2-2nd embodiment of the liquid processing apparatus according to the present invention is described with reference to FIGS. 36 to 39. In the 2-2nd embodiment, as to the same structure as that of the 2-1st embodiment, the same part is indicated by the same reference number and description thereof is omitted.

In the 2-2nd embodiment, the return conduit 55 connecting the discharge side of the diaphragm pump 70 and the primary side of the filter 52 corresponds to the first return conduit 55*a* that enables the resist liquid L to be supplied to the second process-liquid supply conduit 51*b* on the primary side of the filter 52 through the trap tank 53 and the filter 52.

An operation of the 2-2nd embodiment is the same as the steps S1 and S2 in FIG. 12 showing the operation of the 2-1st embodiment, but differs therefrom in a step S3. Namely, a route of the resist liquid L, when the resist liquid L sucked in the diaphragm pump 70 is returned to the second process-liquid supply conduit 51*b*, is different.

Figure 39:
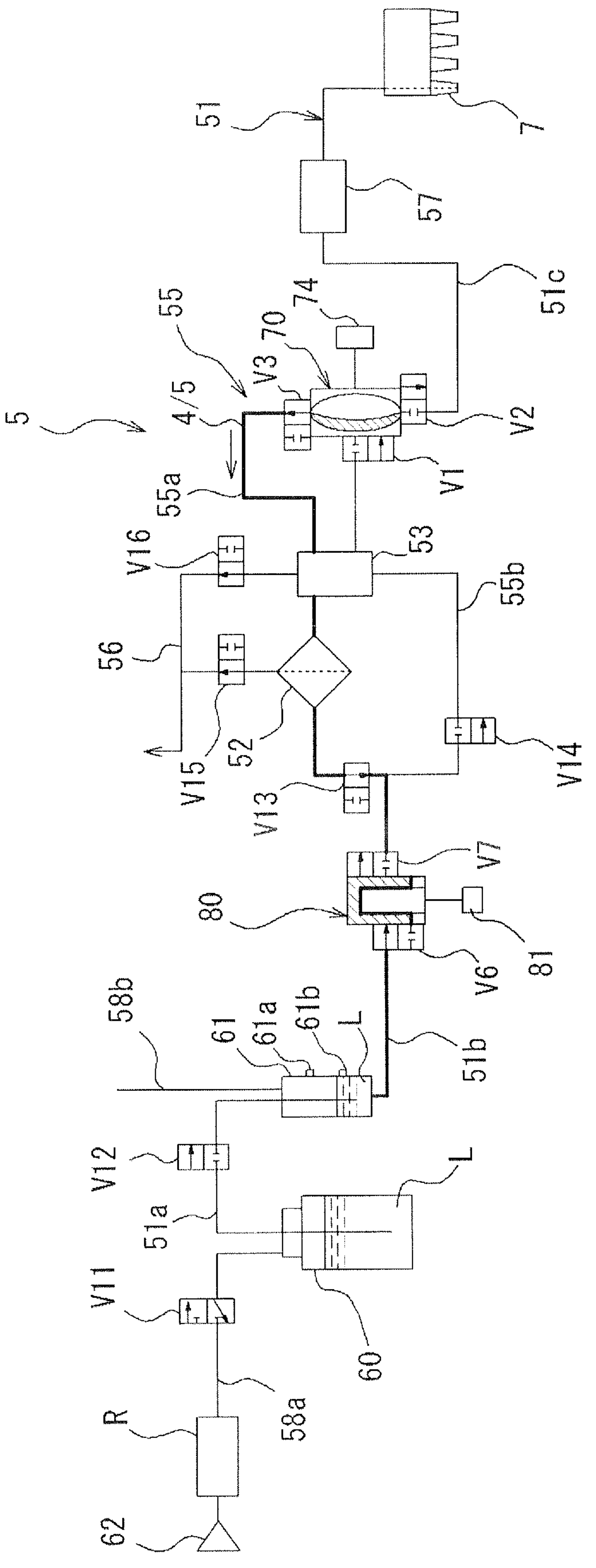
FIG. 39 is a schematic sectional view showing a process-liquid circulating operation in the liquid processing apparatus of the 2-2nd embodiment.

As shown in FIG. 39, after a part of the resist liquid L in the diaphragm pump 70 has been discharged to a wafer, the first and second on-off valves V1 and V2 and the on-off valve 14 are closed while the third on-off valve V3 and the on-off valve V13 are opened. Under this condition, by supplying air into the operation chamber 73, the resist liquid L in the pump chamber 72 is returned to the second process-liquid supply conduit 51*b* on the primary side of the filter 52 through the return conduit 55*a* and the filter 52. Similarly to the first embodiment, the resist liquid L an amount of which is equal to the discharge amount discharged to the wafer W is replenished from the buffer tank 61. Thus, the resist liquid L is filtrated by the filter 52 when the resist liquid L is sucked into the diaphragm pump 70 and when the resist liquid L is returned to the second process-liquid supply conduit 51*b*.

Thus, a part of the resist liquid L sucked in the diaphragm pump 70 is filtrated by the filter 52 in the course of passing through the first return conduit 55*a* and the second process-liquid supply conduit 51*b*, in other words, in the course of reciprocating the second process-liquid supply conduit 51*b* (hereinafter referred to as "reciprocation synthesis filtration"). A relationship between the number of synthesis filtration An of the resist liquid L discharged to a wafer, a discharge amount of the resist liquid L sucked by the diaphragm pump 70 to the wafer, and a return amount of the resist liquid L to the second process-liquid supply conduit 51*b* is shown by the following expression (2).

$$An=(a+2b)/a-2b/a\times\{b/(a+b)\}^{n-1} \quad (2)$$

The number of synthesis filtration represented in the expression (2) is referred to as the number of reciprocation synthesis filtration.

For example, suppose that a rate between the discharge amount to the wafer and the return amount returned to the second process-liquid supply conduit 51*b* is 1:4 (a=1, b=4). In this case, when the steps S1 to S3 are repeated five times (n=5), the number of synthesis filtration A5 is 4.21, based on the calculation of the above expression (2).

An effect of the 2-2nd embodiment is described with reference to Table 1. In the circulation reciprocation synthesis filtration method in the 2-2nd embodiment where the number of synthesis filtration An was 5, the cycle time was 20.5 seconds, the standardized number of particles was 18, and the standardized number of particles relative to one filtration was 82. Thus, in the circulation reciprocation synthesis filtration method where the number of synthesis filtration was 5, it was possible to achieve the cycle time that was shorter than the cycle time when the filtration was performed once. The number of particles could be reduced to 18% as compared with the not-filtrated resist liquid L, and the number of particles could be reduced to 82% as compared with the once-filtrated resist liquid L.

In the circulation reciprocation synthesis filtration method where the number of synthesis filtration An was 10, the cycle time was 26.0 seconds, the standardized number of particles was 8, and the standardized number of particles relative to one filtration was 36. Thus, in the circulation reciprocation synthesis filtration method where the number of synthesis filtration An was 10, the number of particles could be reduced to 8% as compared with the not-filtrated resist liquid L, and the number of particles could be reduced to 36% as compared with the once-filtrated resist liquid L. In addition, the number of particles could be reduced 44% as compared with the circulation reciprocation synthesis filtration method where the number of synthesis filtration was 5.

Namely, similarly to the 2-1st embodiment, the filtration efficiency can be improved while keeping the similar throughput as a throughput obtained when the filtration by a filter is performed once. Thus, a filtration efficiency, which is similar to the filtration efficiency obtained when a plurality of filters are provided, can be obtained by one filter, and decrease in throughput can be prevented, without largely modifying the apparatus.

In addition, in the circulation reciprocation filtration method of the 2-2nd embodiment, the resist liquid L is passed through the filter 52 also when the resist liquid L is returned to the second process-liquid supply conduit 51*b*. Thus, in the 2-2nd embodiment, the number of particles adhering onto a wafer can be reduced as compared with the 2-1st embodiment.

2-3rd Embodiment

Figure 40:
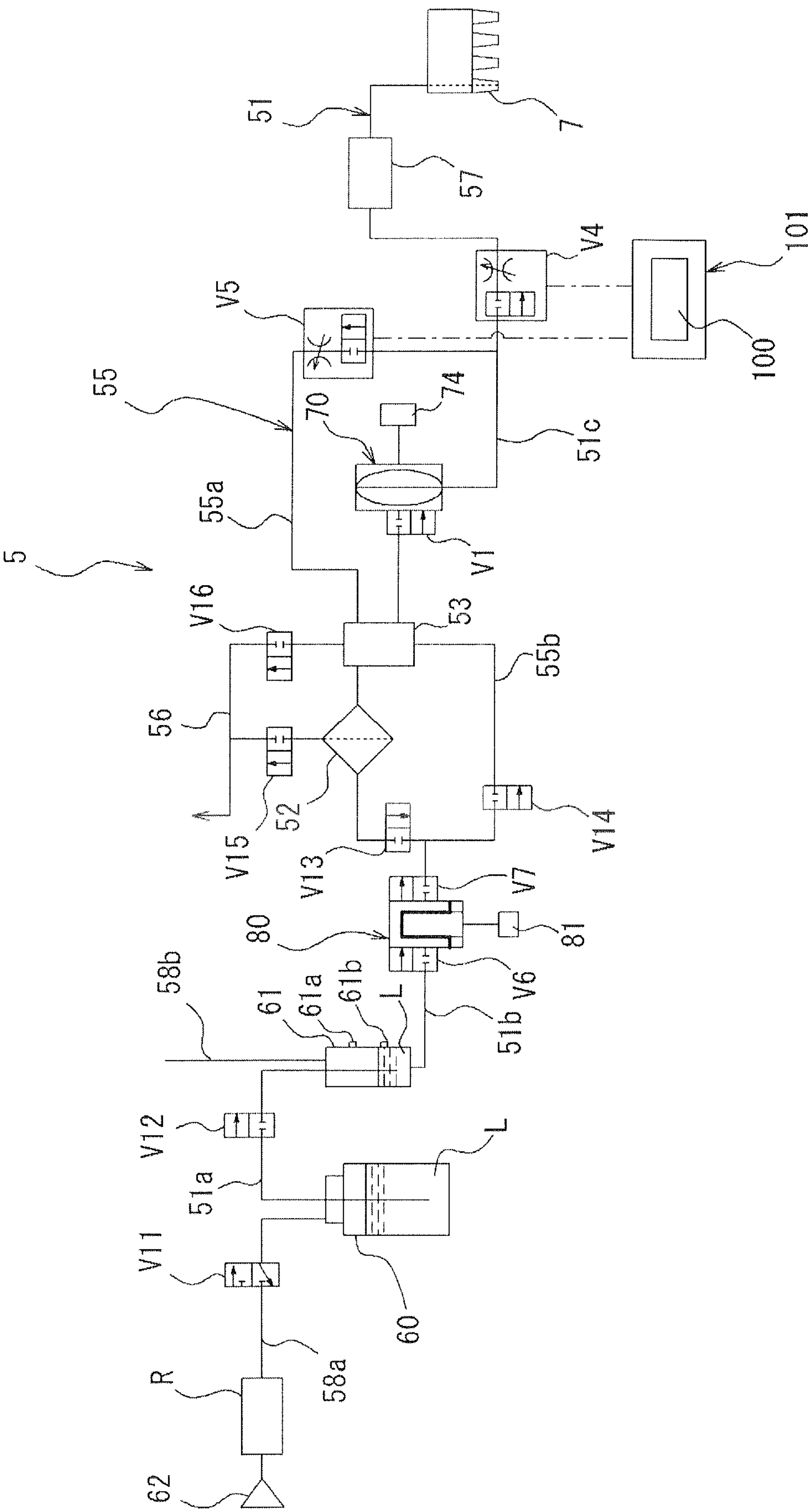
FIG. 40 is a schematic sectional view showing a 2-3rd embodiment of the liquid processing apparatus according to the present invention.

A 2-3rd embodiment of the liquid processing apparatus according to the present invention is described with reference to FIG. 40. In the 2-3rd embodiment, as to the same structure as that of the 1st embodiment, the same part is indicated by the same reference number and description thereof is omitted.

In the 2-3rd embodiment, a check valve (not shown) is provided instead of the on-off valve V2 disposed on the connection portion between the diaphragm pump 70 and the third process-liquid supply conduit 51*c*, and a flowrate regulating valve V4 is disposed in the third process-liquid supply conduit 51*c* on the secondary side of the connection portion between the third process-liquid supply conduit 51*c* and the return conduit 55. The flowrate regulating valve V4 is an on-off valve capable of regulating a flow rate of the resist liquid L to be discharged to the discharge nozzle 7.

In addition, instead of the third on-off valve V3 disposed in the connection portion between the diaphragm pump 70 and the return conduit 55, a flowrate regulating valve V5 is disposed in the first return conduit 55*a* between the diaphragm pump 70 and the trap tank 53. The flowrate regulating valve V5 is an on-off valve capable of regulating a flow rate of the resist liquid L returning to the second process-liquid supply conduit 51*b*. The flowrate regulating valves V4 and V5 are controlled by the control unit 101.

An operation of the 2-3rd embodiment is the same as the step S1 in FIG. 12 showing the operation performed in the 2-1st embodiment, but is different in the step S2 and the step S3. When the resist liquid L in the diaphragm pump 70 is discharged to a wafer W through the discharge nozzle 7, a part (e.g., one-fifth) of the resist liquid L sucked in the diaphragm pump 70 is discharged by closing the on-off valve V1 and the flowrate regulating valve V5 while opening the flowrate regulating valve V4 and by driving the driving means 74. At this time, a flow rate of the resist liquid L flowing through the third process-liquid supply conduit 51*c* is regulated by the flowrate regulating valve V4.

Then, when the resist liquid L in the diaphragm pump 70 is returned to the second process-liquid supply conduit 51*b* through the return conduit 55, a part (e.g., four-fifths) of the resist liquid L sucked in the diaphragm pump 70 is caused to flow into the return conduit 55 by closing the flowrate regulating valve V4 while opening flowrate regulating valve V5 and by driving the drive means 74. At this time, a flow rate of the resist liquid L returning the second process-liquid supply conduit 51*b* is regulated by the flowrate regulating valve V5.

Thus, similarly to the 2-1st and 2-2nd embodiments, the filtration efficiency can be improved while keeping the similar throughput as a throughput obtained when the resist liquid is not filtrated by a filter or filtrated once. Thus, a filtration efficiency, which is similar to the filtration efficiency obtained when a plurality of filters are provided, can be obtained by one filter, and decrease in throughput can be prevented, without largely modifying the apparatus.

Third Embodiment

Herebelow, a third embodiment of the present invention is described with reference to FIGS. 41 to 48. Herein, there is described an example in which the liquid processing apparatus (resist liquid processing apparatus) according to the present invention is applied to a coating and developing apparatus. In the third embodiment, the same part as those of the first embodiment shown in FIGS. 1 to 27 is indicated by the same reference number and description thereof is omitted.

A 3-1st embodiment of the liquid processing apparatus according to present invention is described.

3-1st Embodiment

Figure 41:
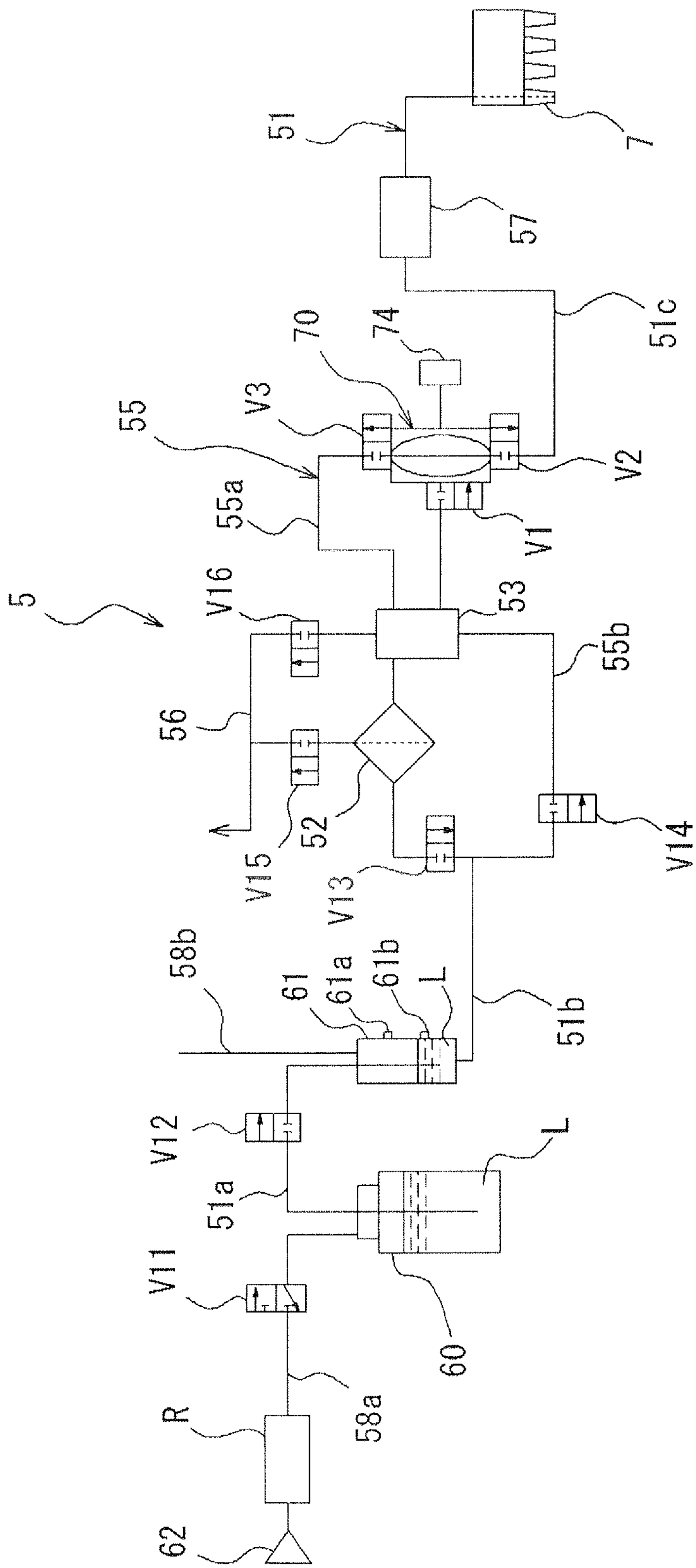
FIG. 41 is a schematic sectional view showing a 3-2nd embodiment of the liquid processing apparatus according to the present invention.
Figure 42:
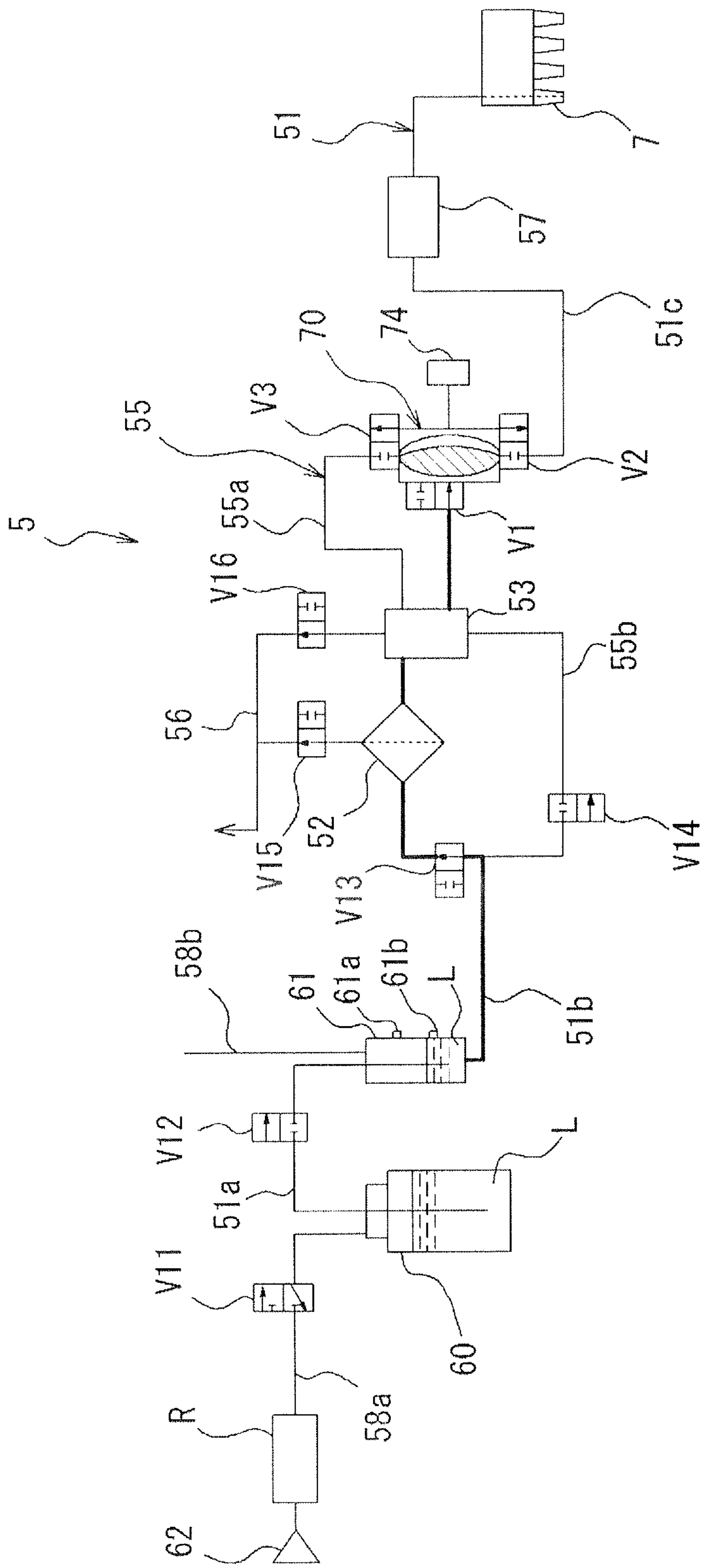
FIG. 42 is a schematic sectional view showing a pump sucking operation in the liquid processing apparatus of the 3-2nd embodiment.
Figure 43:
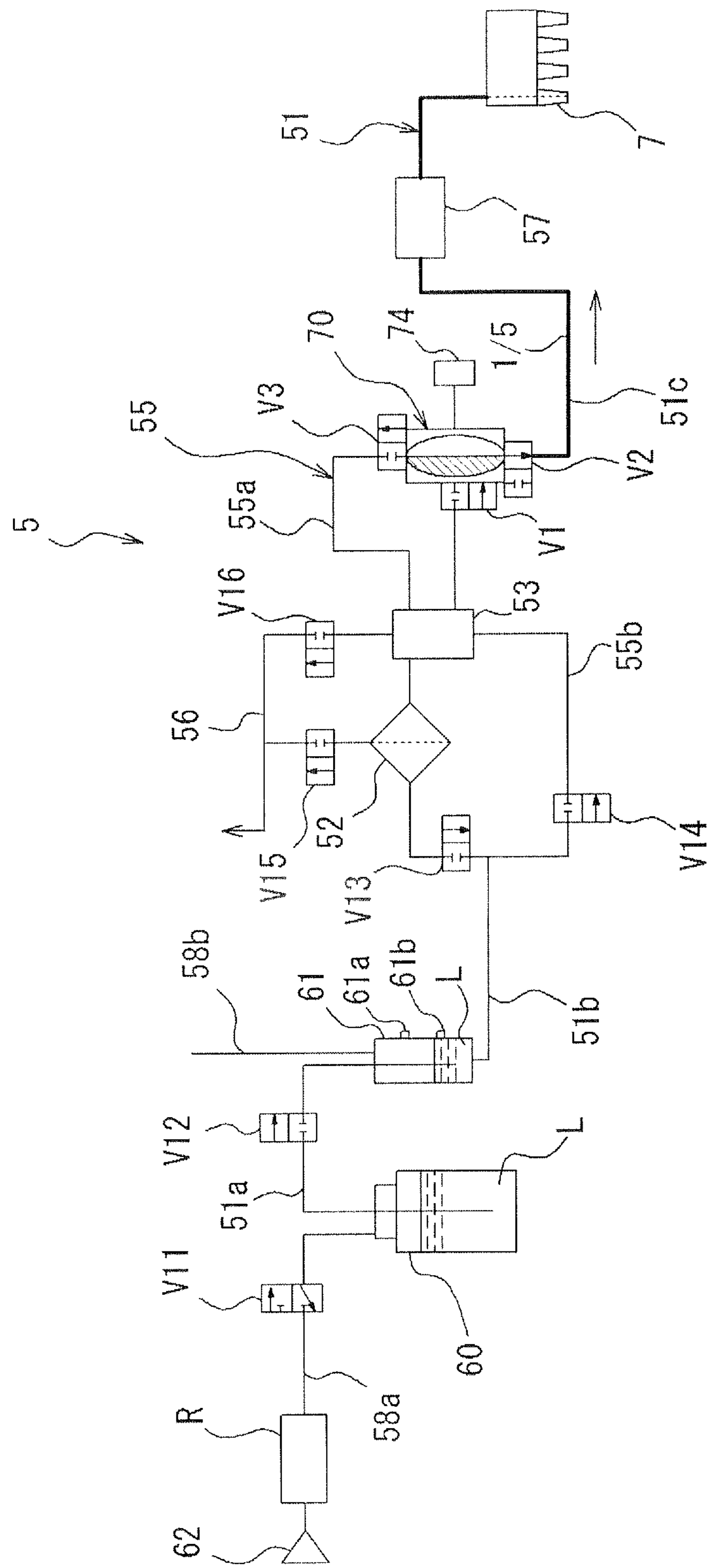
FIG. 43 is a schematic sectional view showing a process-liquid discharging operation in the liquid processing apparatus of the 3-2nd embodiment.
Figure 44:
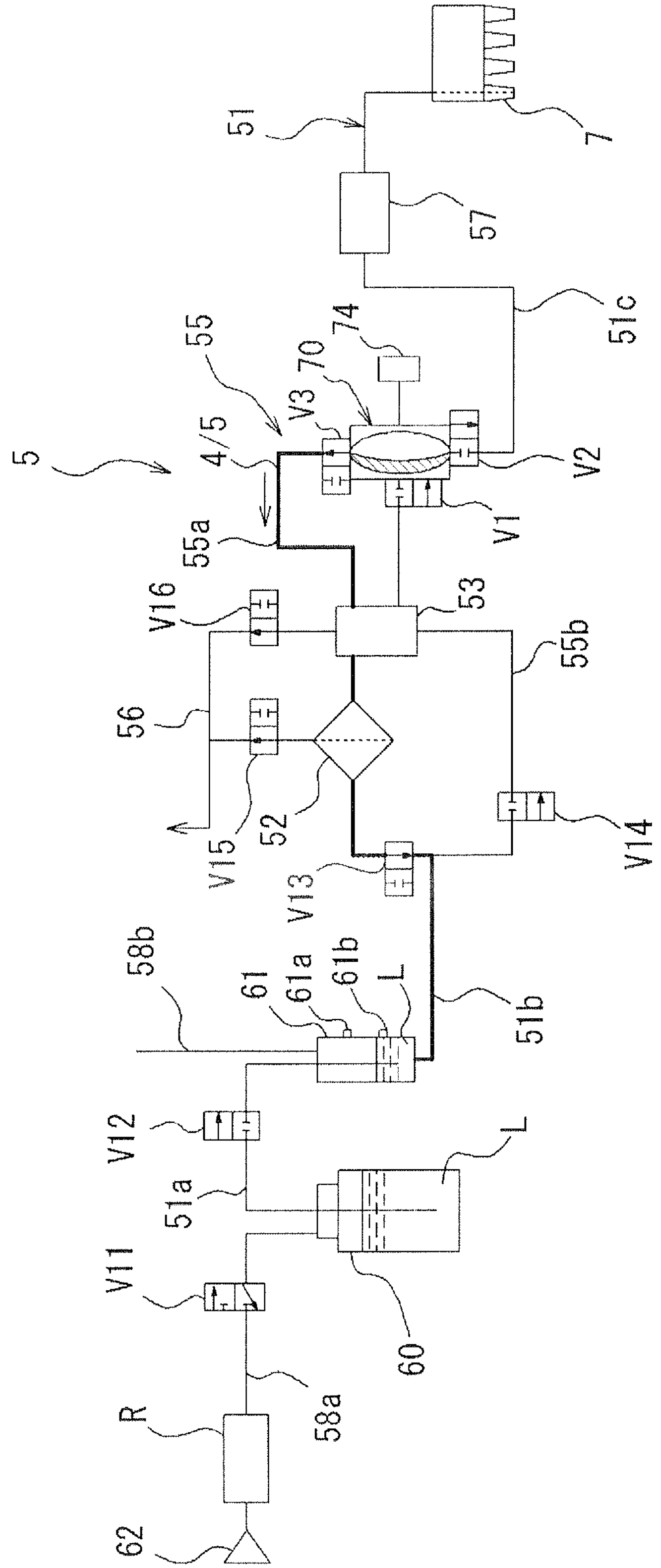
FIG. 44 is a schematic sectional view showing a process-liquid circulating operation in the liquid processing apparatus of the 3-2nd embodiment.

As shown in FIG. 41, the liquid processing apparatus 5 according to the present invention includes: a process liquid container 60 configured to contain a resist liquid L as a process liquid; a nozzle 7 configured to discharge (supply) the resist liquid L to a wafer as a substrate to be processed; a supply conduit 51 connecting the process liquid container 60 and the discharge nozzle 7; a filter 52 disposed in the supply conduit 51 and configured to filtrate the resist liquid L; a pump 70 disposed in the supply conduit 51 on a secondary side of the filter 52; a return conduit 55 connecting a discharge side of the pump 70 and a primary side of the filter 52; first to third on-off valves V1 to V3 which are disposed on a connection portion between the pump 70 and the discharge nozzle 7, a connection portion between the pump 70 and the filter 52, and a connection portion between the pump 70 and the return conduit 55, respectively; and a control unit 101 configured to control the pump 70, and the first, second and third on-off valves V1 to V3.

The return conduit 55 connecting the discharge side of the pump 70 and the primary side of the filter 52 corresponds to the first return conduit 55*a* connecting the pump 70 and the trap tank 53 and the second return conduit 55*b* connecting the trap tank 53 and the second process-liquid supply conduit 51*b* on the primary side of the filter 52, in the first embodiment.

An electromagnetic on-off valve V11 is disposed between the electro-pneumatic regulator R of the first gas supply conduit 58*a* and the process liquid container 60. The first process-liquid supply conduit 51*a* is equipped with an electromagnetic on-off valve V12. In addition, an electromagnetic on-off valve V13 is disposed between the buffer tank 61 of the second process liquid supply conduit 51*b* and the filter 52. The second return conduit 55*b* is equipped with an electromagnetic on-off valve V14. The drain conduit 56 is equipped with electromagnetic on-off valves V15 and V16. The on-off valves V11 to V14, the drain valves V15*a* and V16, the electro-pneumatic regulator R are controlled by a control signal from the control unit 101.

The control unit 101 is incorporated in a control computer 100 that is a storage medium. The control computer 100 includes, in addition to the control unit 101, a control-program storage unit 102 storing a control program, a reading unit 103 configured to read data from outside, and a storage unit 104 storing data. In addition, the control computer 100 includes an input unit 105 connected to the control unit 101, a monitor unit 106 configured to display various conditions of the liquid processing apparatus 5, and a computer-readable storage medium 107 mounted on the reading unit 103 and storing a software that causes the control computer 100 to execute the control program. Based on the control program, the control computer 100 is configured to output control signals to the respective units.

The control-program storage unit 102 stores a control program by means of which the resist liquid L is sucked into the pump 70, the resist liquid L is discharged from the pump 70 to the discharge nozzle 7, the resist liquid L is supplied from the pump 70 to the second process-liquid supply conduit 51*b* on the primary side of the filter 52 through the return conduit 55, the resist liquid L replenished by the feed pump 80 from the buffer tank 61 and the resist liquid L returning through the return conduit 55 are synthesized, and the synthesized resist liquid L is filtrated by the filter 52 the number of times corresponding to a rate between a discharge amount of the resist liquid L to the discharge nozzle 7 and a return amount of the resist liquid L returning from the pump 70 to the second process-liquid supply conduit 51*b* through the conduit 55.

In addition, the control-program storage unit 102 stores a control program by means of which there are performed, when the resist liquid L is returned from the diaphragm pump 70 to the primary side of the filter 52 through the return conduit 55, a bubble actualizing step in which the diaphragm pump 70 is driven such that an area between the diaphragm pump 70 and the trap tank 53 is decompressed and then pressurized so as to actualize micro bubbles present in the resist liquid L in this area, and a degassing step in which the actualized bubbles are discharged from the trap tank. The bubble actualizing step and the degassing step are performed a plurality of times.

The control program is stored in the storage medium 107 such as a hard disc, a compact disc, a flush memory, a flexible disc or a memory card. The control program is used by installing the control program in the control computer 100 from the storage medium 107.

Next, an operation of the liquid processing apparatus 5 in this embodiment is described with reference to FIGS. 4 to 6 and 8 to 13 in the first embodiment. At first, based on a control signal from the control unit 101, the on-off valve V11 disposed in the first gas supply conduit 58*a* and the on-off valve V12 disposed in the first process-liquid supply conduit 51*a* are opened. The resist liquid L is supplied into the buffer tank 61 due to the pressurization by $N_2$ gas supplied from the $N_2$ gas supply source 62 into the process-liquid container 60.

When a predetermined amount of resist liquid L has been supplied (replenished) into the buffer tank 61, the on-off valves V11 and V12 are closed based on a control signal from the control unit 101 which has received a detection signal from the upper-limit liquid level sensor 61*a*. At this time, the on-off valve V1 is open and the on-off valves V2 and V3 are close. The supply and exhaust switching valve V4 is switched to the exhaust side, and a pressure in the operation chamber 73 of the diaphragm pump 70 is detected by the pressure sensor 79 in this condition. A detection signal of the detected pressure is transmitted (inputted) to the control unit 101. After the supply and exhaust switching valve V4 has been switched to the exhaust side, the on-off valve V13 is opened.

Then, the electro-pneumatic regulator 78 is communicated with the decompression source 75*b*, so that air in the operation chamber 73 is exhausted. At this time, an exhausted-air flow rate is detected by the flowmeter 77, and a detection signal of the detected exhausted-air flow rate is transmitted (inputted) to the control unit 101. Since the air in the operation chamber 73 is exhausted, a predetermined amount of the resist liquid L is sucked into the pump chamber 72 from the second process-liquid supply conduit 51*b* (step S1). At this time, since the resist liquid L passes through the filter, the number of filtration of the resist liquid L is one.

Then, the on-off valves V1 and V3 are closed, while the second on-off valve V2 and the supply control valve 57 are opened. At this time, the supply and exhaust switching valve V4 is switched to a suction side and the electro-pneumatic regulator 78 is communicated with the pressurization side, so that air is supplied into the operation chamber 73. Thus, a part of the resist liquid L (e.g., one-fifth), which has been sucked into the pump chamber 72, is discharged to the wafer through the discharge nozzle 7 (step S2).

In this case, an amount of the resist liquid L sucked in the pump chamber 72 is regulated by a supply amount of air supplied to the operation chamber 73. Namely, when air of a smaller amount is supplied to the operation chamber 73, a volume of the operation chamber 73 does not increase so much, whereby a discharge amount of the resist liquid L discharged to the wafer is smaller. On the other hand, when air of a larger amount is supplied to the operation chamber 73, the volume of the operation chamber 73 increases, whereby a discharge amount of the resist liquid L discharged to the wafer W is larger. In this embodiment, one-fifth of the resist liquid L sucked in the pump chamber 72 is discharged to the wafer. A supply amount of air to be supplied to the operation chamber 73 is determined based on the data stored in the storage unit 104.

As a method of regulating an amount of the resist liquid L sucked into the pump chamber 72, an air supply period of time may be regulated, instead of regulating a supply amount of air supplied into the operation chamber 73. Alternatively, the supply of air into the operation chamber 73 may be regulated by a pulse signal transmitted from the control unit 101.

Next, the bubble actualizing step by which a gas (micro bubbles) in the resist liquid L in the zone between the diaphragm pump 70 and the trap tank 53 is actualized, and the degassing step by which the actualized gas is discharged outside, are described with reference to FIGS. 45 and 46. The drain valves V15 and V16, the first on-off valve V1 on the suction side, the second and third on-off valves V2 and V3, the supply and exhaust switching valve V4 and the on-off valve V14 are connected to the control unit 101 shown in FIG. 7, and are opened and closed based on a control signal from the control unit 101.

Figure 45:
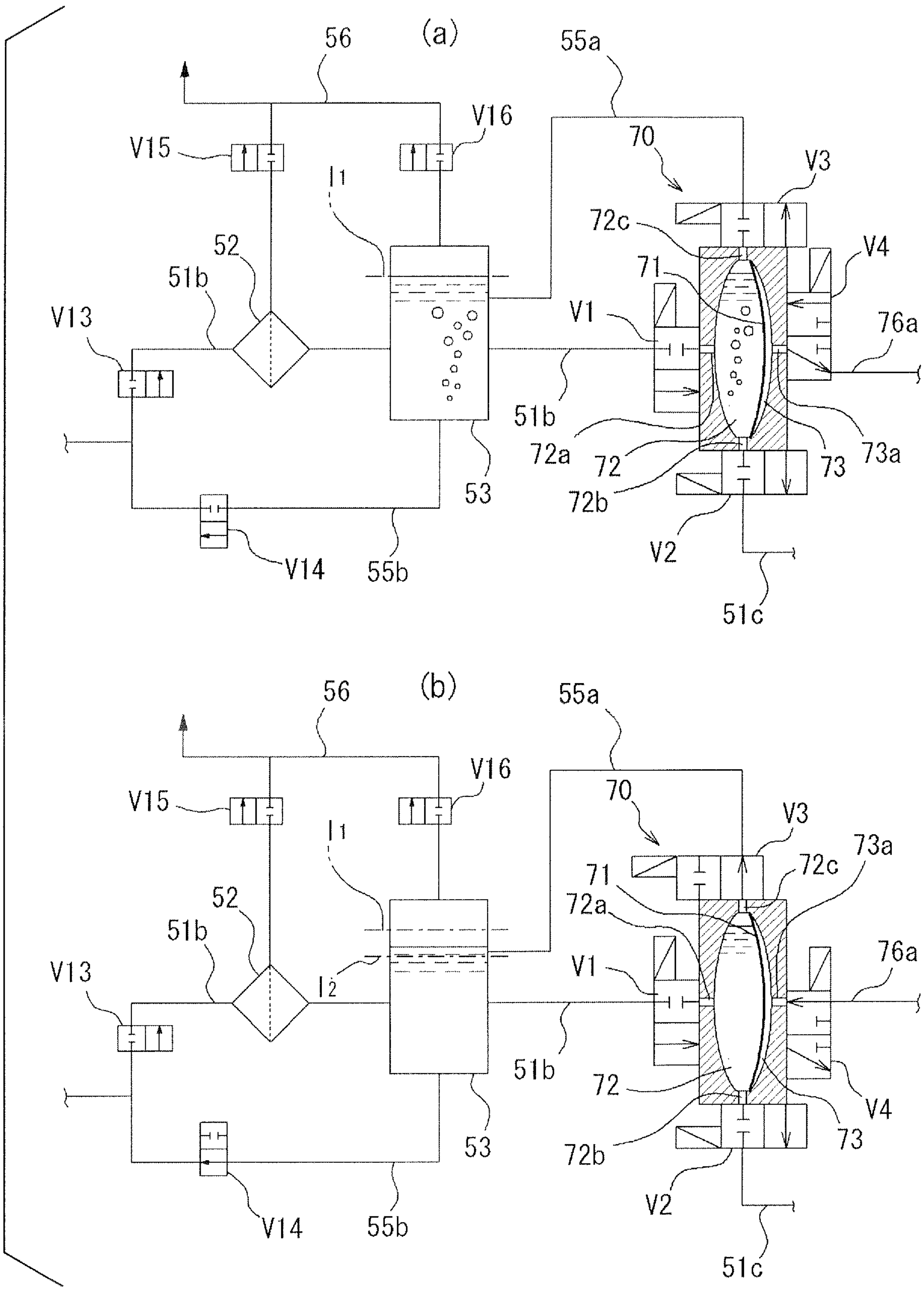
FIG. 45(*a*) is a schematic sectional view showing a bubble actualizing step of the liquid processing apparatus according to the present invention.
Figure 46:
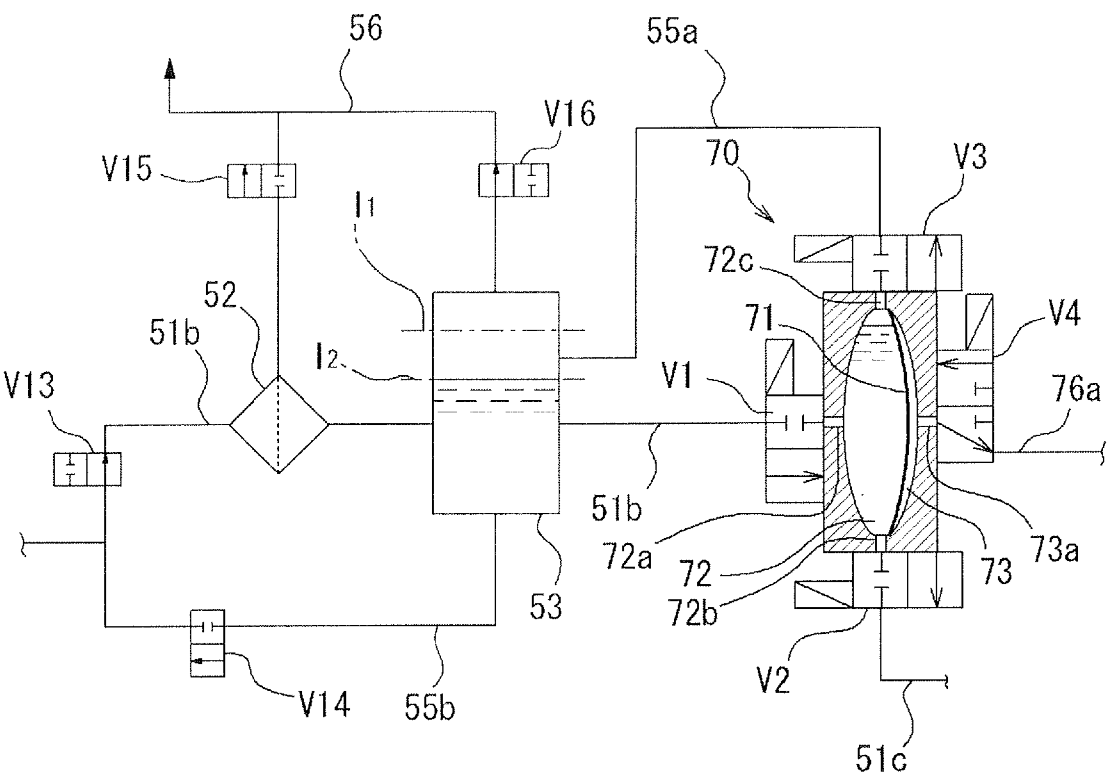
FIG. 46 is a schematic sectional view showing an operation for replenishing a process liquid to a trap tank of the liquid processing apparatus according to the present invention.

As shown in FIG. 45(*a*), the trap tank 53 is equipped with a sensor line $I_1$ for setting an upper limit of a storage amount of the resist liquid L by a not-shown level sensor. By closing the on-off valve V13 when the resist liquid L exceeds the sensor line replenishment of the resist liquid L into the pump chamber 72 and the trap tank 53 is finished. At this time, a gas layer is formed in an upper part of the trap tank 53, and the pump chamber 72 is filled with the resist liquid L.

Then, by exhausting air in the operation chamber 73 under conditions that the first on-off valve V1 on the suction side, the second on-off valve V2, the third on-off valve V3, the drain valves V15 and V16 and the on-off valve 14 are closed, a pressure of the pump chamber 72 becomes a negative pressure. Since the pressure of the pump chamber 72 becomes a negative pressure, micro bubbles present in the resist liquid L in the pump chamber 72 are actualized (bubble actualizing step).

In the bubble actualizing step, the air in the operation chamber 73 may be exhausted under conditions that the first on-off valve V1 on the suction side is opened, while the second on-off valve V2, the third on-off valve V3, the drain valves V15 and V16 and the on-off valve V14 are closed. By exhausting the air in the operation chamber 73 while the on-off valve V1 on the suction side being opened, it is possible to decrease a piston displacement of the diaphragm pump 70 which is required for actualizing bubbles in the resist liquid L in the pump chamber 72 and the trap tank 53.

The reason that the piston displacement of the diaphragm pump 70 can be decreased by exhausting the air in the operation chamber 73 while the on-off valve V1 on the suction side being opened is described. When a volume of the pump chamber 72 increases in accordance with the exhaust of air in the operation chamber 73, a volume of the resist liquid L in the pump chamber 72 and the trap tank 53 hardly changes but a volume of the gas layer in the trap tank 53 increases. Thus, a pressure of the gas layer decreases in accordance with the increase in volume thereof. In addition, since a pressure of the resist liquid L in contact with the gas layer matches with the pressure of the gas layer, the pressure of the resist liquid L decreases. As the pressure of the resist liquid L decreases, the micro bubbles capable of being dissolved in the resist liquid L decrease. Thus, when the pressure of the resist liquid L decreases, bubbles that cannot be dissolved therein are actualized.

Thus, by exhausting the air in the operation chamber 73 while the first on-off valve V1 on the suction side being opened, even a diaphragm pump having a small piston displacement can actualize micro bubbles present in the resist liquid L.

Then, as shown in FIG. 45(*b*), air is supplied into the operation chamber 73 by opening the third on-off valve V3 and the on-off valve V14 under conditions that the first on-off valve V1 on the suction side is closed, and by communicating the electro-pneumatic regulator 78 with the pressurization side under conditions that the supply and exhaust switching valve V4 is switched to the pressurization source 75*a*. By supplying air into the operation chamber 73, the actualized bubbles in the resist liquid L in the pump chamber 72 are moved to the resist liquid L contained in the trap tank 53 (bubble moving step). Since the drain valve V16 is closed, the bubbles moved to the trap tank 53 become the gas layer in the upper part of the trap tank 53, so that the resist liquid L in the trap tank 53 is pressurized. Thus, a part of the resist liquid L contained in the trap tank 53 flows into the second return conduit 55*b*, whereby a storage amount of the resist liquid L contained in the trap tank 53 decreases.

By performing the bubble actualizing step and the bubble moving step a plurality of times, the storage amount of the resist liquid L contained in the trap tank 53 falls below a sensor line $I_2$ which is detected by a not-shown level sensor. Then, as shown in FIG. 46, the drain valve V16 is opened while the on-off valve V14 being closed, so that the bubbles in the trap tank 53 are discharged outside through the drain conduit 56 (degassing step). At this time, the on-off valve V13 is opened so that a part of the resist liquid L contained in the buffer tank 61 flows into the trap tank 53 through the second process-liquid supply conduit 51*b*. When the liquid level of the resist liquid L flowing into the trap tank 53 reaches the sensor line $I_1$, the on-off valve V13 is closed and the inflow of the resist liquid L to the trap tank 53 is finished.

Due to the above structure, the gas (micro bubbles) dissolved in the resist liquid L in the zone between the diaphragm pump 70 and the trap tank 53 can be actualized and then degassed. Thus, the gas can be prevented from mixing into the resist liquid L returned to the primary side of the filter 52.

In addition, since the bubble actualizing step and the degassing step are repeated, removal of bubbles present in the resist liquid L contained in the pump chamber 72 and the trap tank 53 can be efficiently performed.

After the micro bubbles present in the resist liquid L are actualized and degassed to be removed as described above, the first and second on-off valves V1 and V2 are closed while the third on-off valve V3 and the on-off valve V14 are opened, so that a supply amount of air into the operation chamber 73 is increased. Thus, the remaining resist liquid L (e.g., four-fifths) sucked in the pump chamber 72 is returned to the second process-liquid supply conduit 51*b* through the return conduits 55*a* and 55*b* (step S3). In this embodiment, four-fifths of the resist liquid L, which has been sucked into the pump chamber 72 in the step S1, is returned to the second process-liquid supply conduit 51*b*.

Then, the on-off valve V3 is closed while the first on-off valve V1 and the on-off valve V13 are opened, so that the resist liquid L returned to the second process-liquid supply conduit 51*b* and the resist liquid L replenished in the buffer tank 61 are synthesized, whereby the process returns to the step 1. Under this condition, the synthesized resist liquid is sucked into the pump chamber 72. At this time, the amount of the resist liquid supplied from the buffer tank 61 to the pump chamber 72 is equal to the discharge amount of the resist liquid L to the wafer. Thus, in this embodiment, the resist liquid L an amount of which is equal to one-fifth of the resist liquid L sucked in the pump chamber 72 is replenished from the buffer tank 61 to the second process-liquid supply conduit 51*b*.

The resist liquid L returned to the second process-liquid supply conduit 51*b* through the return conduit 55 has been filtrated by the filter 52, while the resist liquid L supplied from the buffer tank 61 is not filtrated by the filter 52. Thus, when the number of filtration of the resist liquid L which is formed by synthesizing the resist liquid L returned to the second process-liquid supply conduit 51*b* through the return conduit 55 and the resist liquid L replenished from the buffer tank 61 is calculated as the number of synthesis filtration of the resist liquid L, a relationship between the number of synthesis filtration of the resist liquid L, a discharge amount of the resist liquid L sucked in the pump 70 to a wafer W, and a return amount of the resist liquid L sucked in the pump 70 to the second process-liquid supply conduit 51*b* is shown by the following expression (1).

$$An=(a+b)/a-b/a\times\{b/(a+b)\}^{n-1} \qquad (1)$$

In the expression (1), An represents the number of synthesis filtration. The number of synthesis filtration represented in the expression (1) is referred to as the number of circulation synthesis filtration. In addition, a and b represent rates of a discharge amount of the resist liquid L to a wafer and a return amount of the resist liquid L to the return conduit 55, and n represents the number (the number of processes) at which the resist liquid L is passed through the filter 52. The number of synthesis filtration An of the resist liquid L corresponds to the number of times corresponding to a synthesis of a rate between a discharge amount and a return amount of the present invention. In the above expression (1), by increasing the number of processes n, the number of synthesis filtration An is saturated with a value of (a+b)/a. FIG. 13 show a relationship between An, n, a and b.

As shown in FIG. 13, when a=1 and b=4, as the number of processes n increases, the number of synthesis filtration An comes close to and converges 5. Similarly, when a=1 and b=2, the number of synthesis filtration An comes close to and converges 3. When a=1 and b=1, the number of synthesis filtration comes close to and converges 2. When a=2 and b=1, the number of synthesis filtration An comes close to and converges 1.5. When a=5 and b=1, the number of synthesis filtration An comes close to and converges 1.2.

In this embodiment, a rate between an amount of the resist liquid L returned to the second process-liquid supply conduit 51*b* through the return conduit 55 and an amount of the resist liquid L supplied from the buffer tank 61 is 4:1, the number of filtration of the resist liquid L returned to the second process-liquid supply conduit 51*b* through the return conduit 55 is one, and the number of filtration of the resist liquid L supplied from the buffer tank 61 is zero. In this case, as shown in FIGS. 10 and 11, the number of synthesis filtration of the resist liquid L supplied to the second process-liquid supply conduit 51*b* on the primary side of the filter 52 is 0.8. By passing the resist liquid L through the filter 52, the number of synthesis filtration of the resist liquid L is 1.8.

By repeating the steps S1 to S3, the step of sucking the resist liquid L into the pump 70, the step of discharging a part (one-fifth) of the process liquid L sucked into the pump 70 to a wafer and returning the remaining part (four-fifths) of the resist liquid L sucked in the pump 70 to the second supply conduit 51*b*, and a step of replenishing the resist liquid L from the buffer tank 61 are repeated. For example, suppose that a rate between a discharge amount of the resist liquid L to a wafer and a return amount of the resist liquid L to the second process-liquid supply conduit 51*b* is 1:4 (a=1, b=4). In this case, when the steps S1 to S3 are repeated five times (n=5), the number of synthesis filtration A5 is 3.36, based on the calculation of the above expression (1).

Next, an effect of the 3-1st embodiment is described with reference to Table 1. Table 1 shows a time (cycle time) required for the steps S1 to S3 relative to the number of synthesis filtration An of the circulation synthesis filtration and a reciprocation synthesis filtration described below, and the standardized number of particles. The standardized number of particles herein means a rate of the number of particles when the resist liquid L, which has been subjected the circulation synthesis filtration or the reciprocation synthesis filtration, is discharged to a wafer, relative to the number of particles when the resist liquid L, which has not been filtrated, is discharged to a wafer W or when the resist liquid, which has been filtrated once, is discharged to a wafer W.

TABLE 1

| | Number of times of Synthesis Filtration | Discharge Amount (ml) | Return Amount (ml) | Cycle Time (s) | Standardized Number of Particles | Standardized Number of Particles relative to One Filtration |
|---|---|---|---|---|---|---|
| Filtration 0 times | 0 | 0.5 | 0 | | 100 | |
| Filtration once | 1 | 0.5 | 0 | 25.5 | 22 | 100 |
| Circulation | 5 | 0.5 | 2.0 | 24.9 | 17 | 77 |
| Synthesis | 10 | 0.5 | 4.5 | 35.9 | 7 | 32 |
| Circulation | 5 | 0.5 | 1.0 | 20.5 | 18 | 82 |
| Reciprocation Synthesis | 10 | 0.5 | 2.3 | 26.0 | 8 | 36 |

In the circulation synthesis filtration method where the number of synthesis filtration An was 5, the cycle time was 24.9 seconds, the standardized number of particles was 17, and the standardized number of particles relative to one filtration was 77. Thus, in the circulation synthesis filtration method where the number of synthesis filtration An was 5, it was possible to achieve the cycle time which was substantially the same as the cycle time when the filtration was performed once. The number of particles could be reduced to 17% as compared with the not-filtrated resist liquid L, and the number of particles could be reduced to 77% as compared with the once-filtrated resist liquid L.

In addition, in the circulation synthesis filtration method where the number of synthesis filtration An was 10, the cycle time was 35.9 seconds, the standardized number of particles was 7, and the standardized number of particles relative to one filtration was 32. Thus, in the circulation synthesis filtration method where the number of synthesis filtration An was 10, the number of particles could be reduced to 7% as compared with the not-filtrated resist liquid L, and the number of particles could be reduced 32% as compared with the once-filtrated resist liquid L. In addition, the number of particles could be reduced to 41% as compared with the circulation synthesis filtration method where the number of synthesis filtration An was 5.

Namely, the filtration efficiency can be improved while keeping the similar throughput as a throughput obtained when the filtration by a filter is performed once. Thus, a filtration efficiency, which is similar to the filtration efficiency obtained when a plurality of filters are provided, can be obtained by one filter, and decrease in throughput can be prevented, without largely modifying the apparatus.

3-2nd Embodiment

Next, a 3-2nd embodiment of the liquid processing apparatus according to the present invention is described with reference to FIGS. 41 to 44. In the 3-2nd embodiment, as to the same structure as that of the 3-1st embodiment, the same part is indicated by the same reference number and description thereof is omitted.

In the 3-2nd embodiment, the return conduit 55 connecting the discharge side of the diaphragm pump 70 and the primary side of the filter 52 corresponds to the first return conduit 55*a* that enables the resist liquid L to be supplied to the second process-liquid supply conduit 51*b* on the primary side of the filter 52 through the trap tank 53 and the filter 52.

An operation of the 3-2nd embodiment is the same as the steps S1 and S2 in FIG. 12 showing the operation of the first embodiment, but differs therefrom in a step S3. Namely, a route of the resist liquid L, when the resist liquid L sucked in the diaphragm pump 70 is returned to the second process-liquid supply conduit 51*b*, is different.

After a part of the resist liquid L flowing into the diaphragm pump 70 has been discharged to a wafer, the on-off valves V1 and V2 and the on-off valve 14 are closed while the third on-off valve V3 and the on-off valve V13 are opened. Under this condition, by supplying air into the operation chamber 73, the resist liquid L in the pump chamber 72 is returned to the second process-liquid supply conduit 51*b* on the primary side of the filter 52 through the return conduit 55*a* and the filter 52. Similarly to the first embodiment, the resist liquid L an amount of which is equal to the discharge amount discharged to the wafer W is replenished from the buffer tank 61. Thus, the resist liquid L is filtrated by the filter 52 when the resist liquid L is sucked into the diaphragm pump 70 and when the resist liquid L is returned to the second process-liquid supply conduit 51*b*.

Thus, a part of the resist liquid L sucked by the diaphragm pump 70 is filtrated by the filter 52 in the course of passing through the first return conduit 55*a* and the second process-liquid supply conduit 51*b*, in other words, in the course of reciprocating the second process-liquid supply conduit 51*b* (hereinafter referred to as "reciprocation synthesis filtration"). A relationship between the number of synthesis filtration An of the resist liquid L discharged to a wafer, a discharge amount of the resist liquid L sucked by the diaphragm pump 70 to the wafer, and a return amount of the resist liquid L to the second process-liquid supply conduit 51*b* is shown by the following expression (2).

$$An=(a+2b)/a-2b/a\times\{b/(a+b)\}^{n-1} \quad (2)$$

The number of synthesis filtration represented in the expression (2) is referred to as the number of reciprocation synthesis filtration.

For example, suppose that a rate between the discharge amount to the wafer and the return amount returned to the second process-liquid supply conduit 51*b* is 1:4 (a=1, b=4). In this case, when the steps S1 to S3 are repeated five times (n=5), the number of synthesis filtration A5 is 4.21, based on the calculation of the above expression (2).

An effect of the 3-2nd embodiment is described with reference to Table 1. In the circulation reciprocation synthesis filtration method in the 2-2nd embodiment where the number of synthesis filtration An was 5, the cycle time was 20.5 seconds, the standardized number of particles was 18, and the standardized number of particles relative to one filtration was 82. Thus, in the circulation reciprocation synthesis filtration method where the number of synthesis filtration was 5, it was possible to achieve the cycle time that was shorter than the cycle time when the filtration was performed once. The number of particles could be reduced to 18% as compared with the not-filtrated resist liquid L, and the number of particles could be reduced to 82% as compared with the once-filtrated resist liquid L.

In the circulation reciprocation synthesis filtration method where the number of synthesis filtration An was 10, the cycle time was 26.0 seconds, the standardized number of particles was 8, and the standardized number of particles relative to one filtration was 36. Thus, in the circulation reciprocation synthesis filtration method where the number of synthesis filtration An was 10, the number of particles could be reduced to 8% as compared with the not-filtrated resist liquid L, and the number of particles could be reduced to 36% as compared with the once-filtrated resist liquid L. In addition, the number of particles could be reduced 44% as compared with the circulation reciprocation synthesis filtration method where the number of synthesis filtration was 5.

Namely, similarly to the 3-1st embodiment, the filtration efficiency can be improved while keeping the similar throughput as a throughput obtained when the filtration by a filter is performed once. Thus, a filtration efficiency, which is similar to the filtration efficiency obtained when a plurality of filters are provided, can be obtained by one filter, and decrease in throughput can be prevented, without largely modifying the apparatus.

In addition, in the reciprocation filtration method of the 3-2nd embodiment, the resist liquid L is passed through the filter 52 also when the resist liquid L is returned to the second process-liquid supply conduit 51*b*. Thus, in the 3-2nd embodiment, the number of particles adhering onto a wafer can be reduced as compared with the 3-1st embodiment.

3-3rd Embodiment

Next, a 3-3rd embodiment of the liquid processing apparatus according to the present invention is described with reference to FIGS. 18 to 21 in the first embodiment and FIGS. 47 and 48. In the 3-3rd embodiment, as to the same structure as that of the 3-1st and 3-2nd embodiments, the same part is indicated by the same reference number and description thereof is omitted.

A return conduit 85 of the 3-3rd embodiment is composed of a first main return conduit 85*a* constituting a main return conduit, a second main return conduit 85*b* constituting the main return conduit, and a sub return conduit 85*c* connecting the secondary side of the filter 52 and the primary side of the filter 52. The first main return conduit 85*a* connects the discharge side of the pump 70 and the trap tank 53, and the second main return conduit 85*b* connects the trap tank 53 and the second process-liquid supply conduit 51*b* on the primary side of the filter 52. In this case, the second main return conduit 85*b* is connected to the second process-liquid supply conduit 51*b* between the on-off valve V13 and the filter 52. The sub return conduit 85*c* connects the second process-liquid supply conduit 51*b* between the filter 52 and the trap tank 53, and the second process-liquid supply conduit Sib between the buffer tank 61 and the filter 52.

An electromagnetic on-off valve V21 is disposed in the second process-liquid supply conduit 651*b* between a connection portion between the second process-liquid supply conduit 51*b* on the secondary side of the filter 52 and the sub return conduit 85*c*, and the trap tank 53. In addition, an electromagnetic on-off valve V24 is disposed in the second main return conduit 85*b*, and an electromagnetic on-off valve V25 is disposed in the sub return conduit 85*c*. These on-off valves V21, V24 and V25 are configured to be controllable by a control signal from the control unit (not shown).

An operation of the 3-3rd embodiment is the same as the step S1 in FIG. 12 showing the operation performed in the 3-1st embodiment (suction of the resist liquid L to the pump chamber 72 shown in FIG. 19) and the step S2 (discharge of the resist liquid L to a wafer W shown in FIG. 20), but is different therefrom in the step S3.

Namely, as shown in FIG. 21, when the resist liquid L flowing into the diaphragm pump 70 is returned to the second process-liquid supply conduit 51*b* through the return conduit 85, a part (e.g., four-fifths) of the resist liquid L sucked in the diaphragm pump 70 is caused to flow into the return conduit 85, by closing the on-off valve V2 while opening the on-off valves V24 and V25 and by driving the drive means 74.

Then, as shown in FIG. 19, the on-off valves V3, V24 and V25 are closed and the first on-off valves V1 and on-off valves V13 and V21 are opened, so that the resist liquid L returned to the second process-liquid supply conduit 51*b* and the resist liquid L replenished into the buffer tank 61 are synthesized, whereby the process returns to the step S1. Under this condition, the synthesized resist liquid L is sucked into the pump chamber 72.

Thus, similarly to the 3-1st and 3-2nd embodiments, the filtration efficiency can be improved while keeping the similar throughput as a throughput obtained when the resist liquid is not filtrated by a filter or filtrated once. Thus, a filtration efficiency, which is similar to the filtration efficiency obtained when a plurality of filters are provided, can be obtained by one filter, and decrease in throughput can be prevented, without largely modifying the apparatus.

Next, the bubble actualizing step by which a gas (micro bubbles) in the resist liquid L in the zone between the diaphragm pump 70 and the trap tank 53 is actualized, and the degassing step by which the actualized gas is discharged outside in the 3-3rd embodiment are described with reference to FIGS. 47 and 48. The drain valves V15 and V16, the first on-off valve V1 on the suction side, the second and third on-off valves V2 and V3, the supply and exhaust switching valve V4, the on-off valve V14 and the on-off valve 21 are connected to the control unit 101 shown in FIG. 7, and are opened and closed based on a control signal from the control unit 101.

Figure 47:
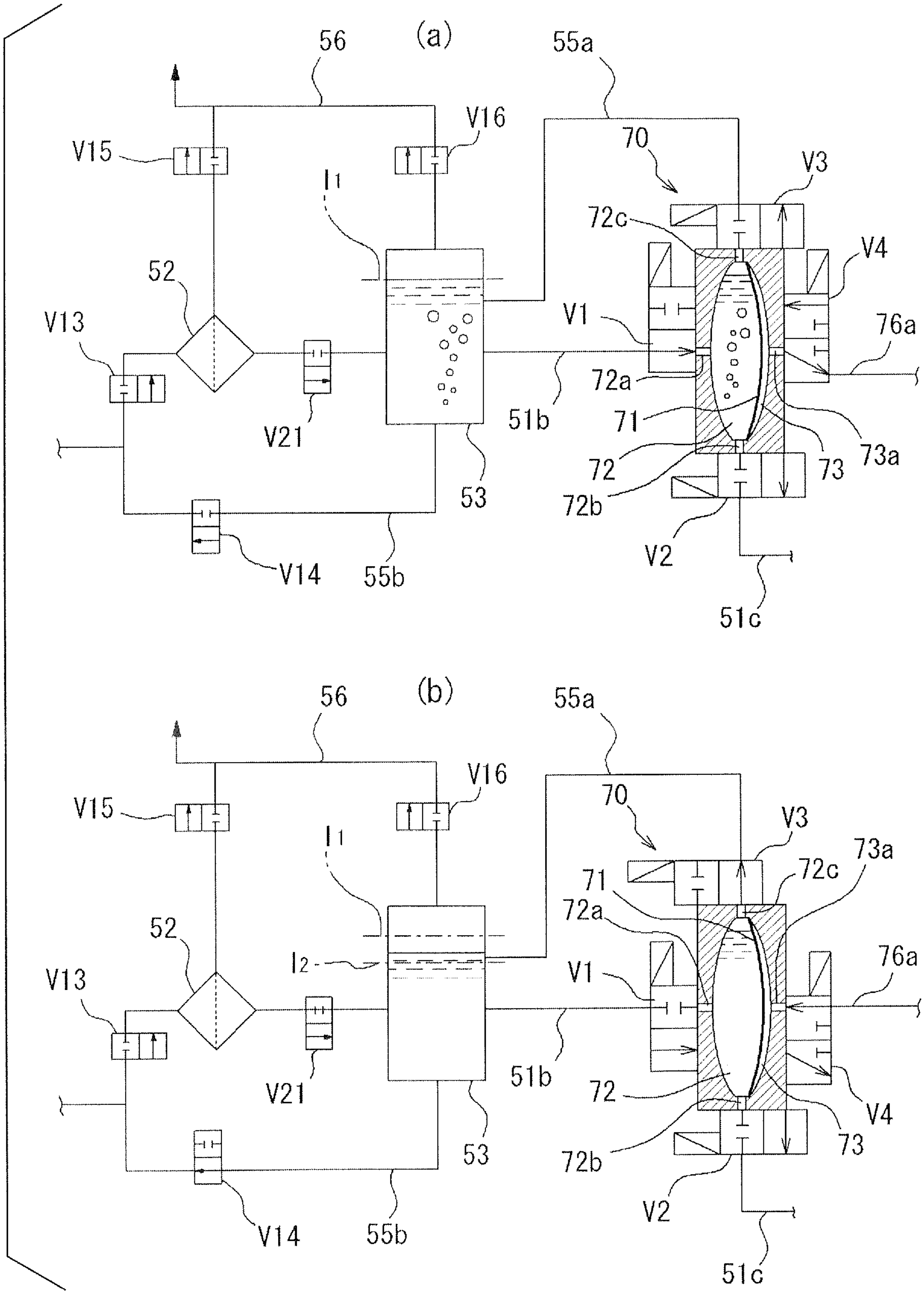
FIG. 47(*a*) is a schematic sectional view showing another bubble actualizing step of the liquid processing apparatus according to the present invention.
Figure 48:
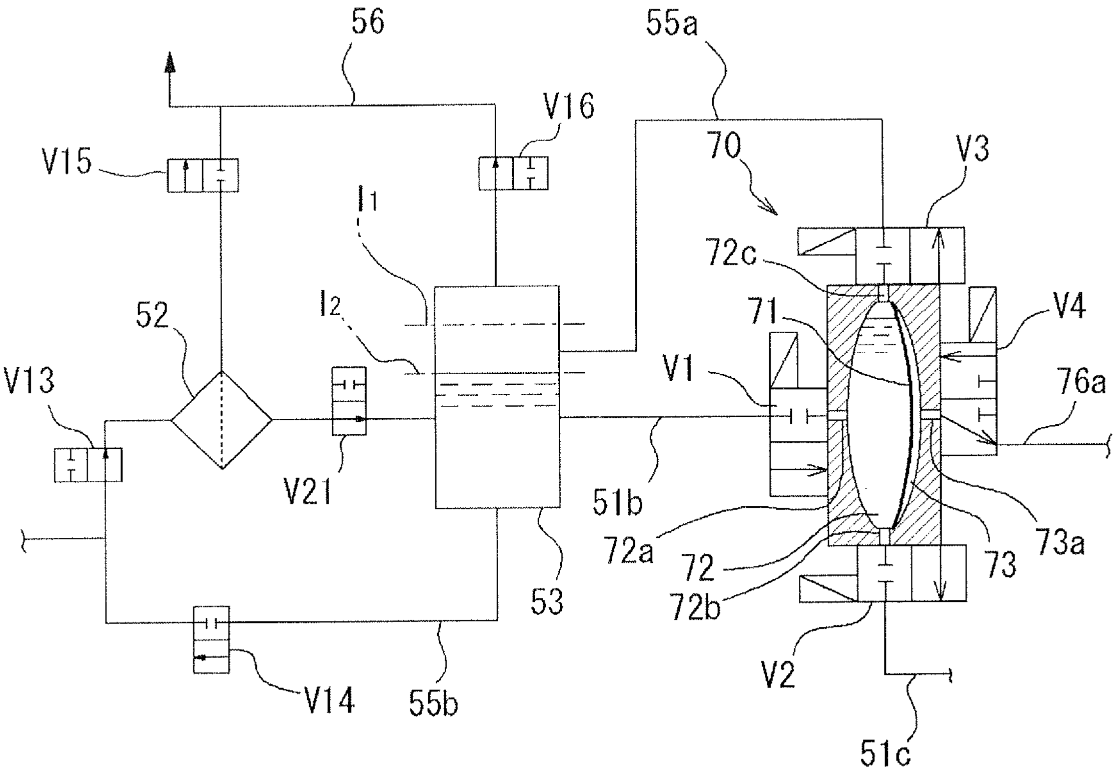
FIG. 48 is a schematic sectional view showing an operation for replenishing a process liquid to the trap tank of the liquid processing apparatus according to the present invention.

As shown in FIG. 47(*a*), the trap tank 53 is equipped with a sensor line $I_1$ for setting an upper limit of a storage amount of the resist liquid L by a not-shown level sensor. By closing the on-off valves V13 and V21 when the resist liquid L exceeds the sensor line $I_1$, replenishment of the resist liquid L into the pump chamber 72 and the trap tank 53 is finished. At this time, a gas layer is formed in an upper part of the trap tank 53, and the pump chamber 72 is filled with the resist liquid L.

Then, by exhausting air in the operation chamber 73 under conditions that the first on-off valve V1 on the suction side is opened, while the second on-off valve V2, the third on-off valve V3, the drain valves V15 and V16 and the on-off valve 14 are closed, a pressure of the pump chamber 72 becomes a negative pressure.

By discharging the air in the operation chamber 73 while the on-off valve V1 on the suction side being opened, it is possible to decrease a piston displacement of the diaphragm pump 70 which is required for actualizing bubbles in the resist liquid L in the pump chamber 72 and the trap tank 53.

The reason that the piston displacement of the diaphragm pump 70 can be decreased by exhausting the air in the operation chamber 73 while the on-off valve V1 on the suction side being opened is described. When a volume of the pump chamber 72 increases in accordance with the exhaust of air in the operation chamber 73, a volume of the resist liquid L in the pump chamber 72 and the trap tank 53 hardly changes but a volume of the gas layer in the trap tank 53 increases. Thus, a pressure of the gas layer decreases in accordance with the increase in volume thereof. In addition, since a pressure of the resist liquid L in contact with the gas layer matches with the pressure of the gas layer, the pressure of the resist liquid L decreases. As the pressure of the resist liquid L decreases, the micro bubbles capable of being dissolved in the resist liquid L decrease. Thus, when the pressure of the resist liquid L decreases, bubbles that cannot be dissolved therein are actualized (bubble actualizing step).

Then, as shown in FIG. 47(*b*), air is supplied into the operation chamber 73 by opening the third on-off valve V3 and the on-off valve V14 under conditions that the first on-off valve V1 on the suction side is closed, and by communicating the electro-pneumatic regulator 78 with the pressurization side under conditions that the supply and exhaust switching valve V4 is switched to the pressurization source 75*a*. By supplying air into the operation chamber 73, the actualized bubbles in the liquid L contained in the trap tank 53 (bubble moving step). Since the drain valve V16 is closed, the bubbles moved to the trap tank 53 become the gas layer in the upper part of the trap tank 53, so that the resist liquid L in the trap tank 53 is pressurized. Thus, a part of the resist liquid L contained in the trap tank 53 flows into the second return conduit 55*b*, whereby a storage amount of the resist liquid L contained in the trap tank 53 decreases.

By performing the bubble actualizing step and the bubble moving step a plurality of times, the storage amount of the resist liquid L contained in the trap tank 53 falls below a sensor line $I_2$ which is detected by a not-shown level sensor. Then, as shown in FIG. 48, the drain valve V16 is opened while the on-off valve V14 being closed, the bubbles in the trap tank 53 are discharged outside through the drain conduit 56 (degassing step). At this time, the on-off valve V13 is opened so that a part of the resist liquid L contained in the buffer tank 61 flows into the trap tank 53 through the second process-liquid supply conduit 51*b*. When the liquid level of the resist liquid L flowing into the trap tank 53 reaches the sensor line $I_1$, the on-off valve V13 is closed and the inflow of the resist liquid L to the trap tank 53 is finished.

Due to the above structure, the gas (micro bubbles) dissolved in the resist liquid L in the zone between the diaphragm pump 70 and the trap tank 53 can be actualized and then degassed. Thus, the gas can be prevented from mixing into the resist liquid L returned to the primary side of the filter 52.

In addition, since the bubble actualizing step and the degassing step are repeated, removal of bubbles present in the resist liquid L contained in the pump chamber 72 and the trap tank 53 can be efficiently performed.

In the 3-1st embodiment and the 3-2nd embodiment, by providing the on-off valve V21 connecting the secondary side of the filter 52 and the trap tank 53, the bubble actualizing step and the degassing step in the 3-3rd embodiment can be applied to the 3-1st embodiment and the 3-2nd embodiment.

What is claimed is:

1. A liquid processing apparatus comprising:

a process liquid container configured to contain a process liquid;

a discharge nozzle configured to discharge the process liquid to a substrate to be processed;

a supply conduit connecting the process liquid container and the discharge nozzle, the supply conduit including a first process-liquid supply conduit connecting the process liquid container and a buffer tank for temporarily storing the process liquid and a second process-liquid supply conduit connecting the buffer tank to a pump for supplying the process liquid;

a filter disposed in the supply conduit and configured to filtrate the process liquid;

the pump disposed in the supply conduit on a secondary side of the filter, which is provided on an upstream side of the pump;

a trap tank disposed on the second process-liquid supply conduit on the secondary side of the filter, with the second process-liquid supply conduit connecting the buffer tank to a primary side of the filter, connecting the secondary side of the filter to the trap tank, and connecting the trap tank to a primary side of the pump, in that order;

a return conduit including a first return conduit connecting a discharge side of the pump to the trap tank and a second return conduit directly connecting the trap tank to the second process-liquid supply conduit which connects the buffer tank to the primary side of the filter, such that the trap tank is connected to the primary side of the filter via only the second return conduit and the second process-liquid supply conduit, so that the process liquid can be returned from the discharge side of the pump to the primary side of the filter through the trap tank;

a first, a second and a third on-off valves which are disposed on a connection portion between the pump and the filter, a connection portion between the pump and the discharge nozzle, and a connection portion between the pump and the return conduit, respectively; and a control unit configured to control the pump and the first, the second and the third on-off valves;

wherein:

based on a control signal from the control unit, a part of the process liquid having passed through the filter by the suction of the pump is discharged from the discharge nozzle;

a remaining process liquid is returned to the supply conduit on the primary side of the filter;

the process liquid is synthesized by adding a replenishment amount, which is equal to a discharge amount every time without time-lag, to a return amount;

the discharge of the synthesized process liquid and the filtration thereof by the filter are performed a number of times corresponding to a rate between the discharge amount and the return amount; and wherein the control unit is configured to drive the pump to depressurize and then repressurize a zone between the pump and the trap tank, the zone comprising the pump, the trap tank and the second process-liquid supply conduit connecting the pump to the trap tank, thereby actualizing micro bubbles present in process liquid in the zone; and degassing for discharging the actualized micro bubbles from the trap tank; wherein the actualizing of the micro bubbles and the degassing are performed a plurality of times.

2. The liquid processing apparatus according to claim 1, wherein the pump is a variable displacement pump.

3. The liquid processing apparatus according to claim 1, wherein:

the third on-off valve is disposed in the connection portion between the pump and the return conduit; and the third on-off valve is configured to be controllable by the control unit, the third on-off valve controlling a flow rate of the process liquid discharged from the pump to the return conduit.

4. The liquid processing apparatus according to claim 1, wherein the return conduit further comprising a sub return conduit directly connecting the secondary side of the filter and the primary side of the filter.

5. The liquid processing apparatus according to claim 4, wherein: on-off valves are respectively disposed in the second return conduit and the sub return conduit; and the on-off valves are configured to be controllable by the control unit.

6. The liquid processing apparatus according to claim 1, wherein the second and the third on-off valves are on-off valves capable of controlling a flow rate of the process liquid discharged from the pump to the supply conduit and the return conduit, respectively.

7. A liquid processing method using the liquid processing apparatus comprising: according to claim 1, the liquid processing method comprising:

sucking into the pump a predetermined amount of the process liquid having passed through the filter by the suction of the pump;

discharging a part of the process liquid sucked in the pump from the discharge nozzle;

returning the remaining process liquid in the pump to the primary side of the filter; and synthesizing a process liquid by adding a replenishment amount, which is equal to the discharge amount, to the return amount; and discharging the synthesized process liquid and filtrating the synthesized process liquid by the filter the number of times corresponding to a rate between the discharge amount and the return amount.

8. A computer-readable storage medium for liquid process storing a software that causes a computer to execute a control program, the computer-readable storage medium being used in the liquid processing apparatus comprising: according to claim 1, wherein the control program is programmed to perform:

sucking into the pump a predetermined amount of the process liquid having passed through the filter by the suction of the pump;

discharging a part of the process liquid sucked in the pump from the discharge nozzle;

returning the remaining process liquid in the pump to the primary side of the filter;

and synthesizing a process liquid by adding a replenishment amount, which is equal to the discharge amount, to the return amount; and discharging the synthesized process liquid and filtrating the synthesized process liquid by the filter the number of times corresponding to a rate between the discharge amount and the return amount.

* * * * *